(12) United States Patent
Yamazaki et al.

(10) Patent No.: US 7,755,113 B2
(45) Date of Patent: Jul. 13, 2010

(54) SEMICONDUCTOR DEVICE, SEMICONDUCTOR DISPLAY DEVICE, AND MANUFACTURING METHOD OF SEMICONDUCTOR DEVICE

(75) Inventors: Shunpei Yamazaki, Setagaya (JP); Hidekazu Miyairi, Isehara (JP)

(73) Assignee: Semiconductor Energy Laboratory Co., Ltd., Atsugi-shi, Kanagawa-ken ( * ) Notice: Subject to any disclaimer, the term of this patent is extended or adjusted under 35 U.S.C. 154(b) by 126 days.

(21) Appl. No.: 12/073,927

(22) Filed: Mar. 12, 2008

(65) Prior Publication Data

US 2008/0224274 A1 Sep. 18, 2008

(30) Foreign Application Priority Data

Mar. 16, 2007 (JP) ............................ 2007-068086
May 18, 2007 (JP) ............................ 2007-133138

(51) Int. Cl.
*H01L 29/80* (2006.01)
*H01L 31/112* (2006.01)

(52) U.S. Cl. .............................. 257/257; 257/E29.003; 257/E29.049; 257/255

(58) Field of Classification Search ................. 438/150, 438/198; 257/255, E29.003, E29.004, E29.049, 257/E29.05, E21.618, E21.633, 257, 258
See application file for complete search history.

(56) References Cited

U.S. PATENT DOCUMENTS

| | | | |
|---|---|---|---|
| 5,374,564 A | 12/1994 | Bruel | |
| 6,127,702 A | 10/2000 | Yamazaki et al. | |
| 6,271,101 B1 | 8/2001 | Fukunaga | |
| 6,335,231 B1 | 1/2002 | Yamazaki et al. | |
| 6,380,046 B1 | 4/2002 | Yamazaki | |
| 6,388,652 B1 | 5/2002 | Yamazaki et al. | |
| 6,602,761 B2 | 8/2003 | Fukunaga | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,875,633 B2 | 4/2005 | Fukunaga | |
| 6,908,797 B2 | 6/2005 | Takano | |
| 7,176,525 B2 | 2/2007 | Fukunaga | |
| 7,199,024 B2 | 4/2007 | Yamazaki | |
| 7,256,776 B2 | 8/2007 | Yamazaki et al. | |
| 7,291,542 B2 | 11/2007 | Iwamatsu et al. | |

(Continued)

FOREIGN PATENT DOCUMENTS

JP        11-163363        6/1999

(Continued)

*Primary Examiner*—Caridad M Everhart
(74) *Attorney, Agent, or Firm*—Eric J. Robinson; Robinson Intellectual Property Law Office, P.C.

(57) ABSTRACT

To achieve high performance of a semiconductor integrated circuit depending on not only a microfabrication technique but also another way. In addition, to achieve low power consumption of a semiconductor integrated circuit. A semiconductor device is provided in which crystal faces and/or crystal axes of single-crystalline semiconductor layers of a first conductive MISFET and a second conductive MISFET are different. The crystal faces and/or crystal axes are arranged so that mobility of carriers flowing in channel length directions in the respective MISFETs is increased. Such a structure can increase mobility of carriers flowing through channels of the MISFETs and high speed operation of a semiconductor integrated circuit can be achieved. Further, low voltage driving becomes possible, and low power consumption can be realized.

12 Claims, 34 Drawing Sheets

U.S. PATENT DOCUMENTS

| | | |
|---|---|---|
| 2002/0109144 A1 | 8/2002 | Yamazaki |
| 2003/0183876 A1* | 10/2003 | Takafuji et al. ............. 257/347 |
| 2004/0056332 A1* | 3/2004 | Bachrach et al. ............. 257/640 |
| 2004/0061176 A1 | 4/2004 | Takafuji et al. |
| 2004/0061200 A1 | 4/2004 | Iwamatsu et al. |
| 2004/0104424 A1 | 6/2004 | Yamazaki |
| 2005/0009252 A1 | 1/2005 | Yamazaki et al. |
| 2005/0260800 A1 | 11/2005 | Takano |
| 2007/0087488 A1 | 4/2007 | Moriwaka |
| 2007/0108510 A1 | 5/2007 | Fukunaga |
| 2007/0173000 A1 | 7/2007 | Yamazaki |
| 2007/0184632 A1 | 8/2007 | Yamazaki et al. |
| 2007/0281446 A1* | 12/2007 | Winstead et al. ............. 438/478 |
| 2007/0291022 A1 | 12/2007 | Yamazaki et al. |
| 2008/0258254 A1* | 10/2008 | Boeuf ........................ 257/510 |

FOREIGN PATENT DOCUMENTS

| | | |
|---|---|---|
| JP | 2000-012864 | 1/2000 |
| JP | 2004-119943 | 4/2004 |
| JP | 2004-134675 | 4/2004 |
| JP | 2006-229047 | 8/2006 |

* cited by examiner

SEMICONDUCTOR DEVICE, SEMICONDUCTOR DISPLAY DEVICE, AND MANUFACTURING METHOD OF SEMICONDUCTOR DEVICE

BACKGROUND OF THE INVENTION

1. Field of the Invention

The present invention relates to a semiconductor device having a so-called SOI (silicon on insulator) structure in which a semiconductor layer is provided on an insulating surface. Further, the present invention relates to a semiconductor display device having an SOI structure on an insulating substrate having a light-transmitting property such as a glass substrate, and a manufacturing method thereof.

2. Description of the Related Art

Integrated circuits using semiconductor substrates called silicon on insulator (hereinafter also referred to as "SOI") in which a single-crystalline semiconductor layer is formed on an insulating surface instead of using silicon wafers that are manufactured by thinly slicing an ingot of single-crystalline semiconductor are developed. The integrated circuits using the SOI substrates draw attention as semiconductor integrated circuits whose performance is improved by reduction of parasitic capacitance between a drain of a transistor and a substrate.

There are various manufacturing methods of SOI substrates, but an SOI substrate formed by a method called Smart Cut (registered trademark) is known as an SOI substrate with both quality of an SOI layer and easiness in production (throughput). This SOI substrate is formed in the following manner. Hydrogen ions are added to a bond wafer to be a silicon layer and the bond wafer is bonded to another wafer (base wafer) at room temperature. Here, a strong bond is formed by van der Waals' forces at room temperature. After bonding of the base wafer and the bond wafer, a layer to which the hydrogen ions are added is separated by heat treatment at about 500° C., to form a silicon layer over the base wafer.

As an example of semiconductor devices using such an SOI substrate, a semiconductor device invented by one of the inventors of the present invention is known (Patent Document 1: Japanese Published Patent Application No. 2000-012864).

Further, as a method of forming a single-crystalline silicon thin film obtained by utilizing a smart cut method over a crystallized glass which is high heat resistant glass, a method invented by one of the inventors of the present invention is known (Patent Document 2: Japanese Published Patent Application No. H11-163363).

Furthermore, in order to obtain high electron mobility of an n-channel MOSFET and high hole mobility of a p-channel MOSFET in a CMOSFET formed over a silicon wafer, a semiconductor device including PMOS formed on a silicon wafer having a face (110) and NMOS formed on an SOI layer having a face (100) is known (Patent Document 3: Japanese Published Patent Application No. 2006-229047).

SUMMARY OF THE INVENTION

Miniaturization has been a road map of technical development in a field of semiconductor integrated circuits and thus the field of the semiconductor integrated circuits has been developed. So far, as the semiconductor integrated circuits are miniaturized, higher speed operation can be realized, and thus low power consumption is achieved. Nowadays, a technique of manufacturing semiconductor integrated circuits with a design rule of 100 nm or less is coming to the practical stage. However, it is said that improvement in performance of semiconductor integrated circuits by miniaturization has a limit. As miniaturization of a design rule advances, an ultrahigh precision manufacturing apparatus is required and the amount of capital investment is increased more. Therefore, there is also a limit from an economic perspective.

In consideration of the situation, it is an object of the present invention to provide a semiconductor device with high performance depending on not only a microfabrication technique but also another way. It is another object of the present invention to provide a semiconductor device with low power consumption.

In the technique of Patent Document 2, as shown in FIG. 1 in Reference 2, the obtained single-crystalline silicon film is patterned, and an active layer of a PTFT and an active layer of an NTFT in a CMOS circuit, and an active layer of a pixel matrix circuit are formed. Therefore, any one of the active layers is obtained from one single-crystalline silicon film.

In the technique of Patent Document 3, since an NMOS formed on an SOI layer having a face (100) is provided over a silicon wafer having a face (110), planarity is bad, and generation of a defect in contact in a CMOS structure is concerned. In addition, a light-transmitting property is low due to formation over the silicon wafer; therefore, the technique of Patent Document 3 is not suitable for devices which require a light-transmitting property such as display devices (semiconductor display devices) that use semiconductor elements.

In consideration of such a situation, it is an object of the present invention to provide a CMOS circuit (semiconductor element) with a light-transmitting property, in which mobility of an n-channel MISFET (metal insulator semiconductor field effect transistor, hereinafter referred to as "MISFET") and a p-channel MISFET is increased; a manufacturing method thereof; a semiconductor display device including the CMOS circuit; and a manufacturing method thereof.

One aspect of the present invention is a semiconductor device in which a crystal face of a single-crystalline semiconductor layer for forming a MISFET having a first conductivity type is different from that of a single-crystalline semiconductor layer for forming a MISFET having a second conductivity type. The crystal face is set so that mobility of carriers traveling in a channel length direction is increased in each of the MISFETs.

Another aspect of the present invention is a semiconductor device in which a crystal face and a crystal axis in a channel length direction of a single-crystalline semiconductor layer for forming a MISFET having a first conductivity type is different from those of a single-crystalline semiconductor layer for forming a MISFET having a second conductivity type.

Still another aspect of the present invention is a semiconductor device in which a single-crystalline semiconductor layer for forming a MISFET having a first conductivity type and a single-crystalline semiconductor layer for forming a MISFET having a second conductivity type have the same crystal face and different crystal axes in channel length directions.

A preferred mode of the above-described structure is a semiconductor device having a so-called SOI structure in which a first single-crystalline semiconductor layer and a second single-crystalline semiconductor layer which are formed over the same surface are fixed by bonding of a first silicon oxide film and a second silicon oxide film, respectively.

One aspect of the present invention is a semiconductor element in which a plurality of single-crystalline semiconductors are provided over the same surface of an insulating substrate having a light-transmitting property such as a glass substrate, in which the single-crystalline semiconductors include a first SOI layer including an n-type impurity region and a second SOI layer having a p-type impurity region, and in which a crystal face of the first SOI layer is made different from that of the second SOI layer; and a display device (semiconductor display device) including the semiconductor element. For example, the crystal face of the first SOI layer is {100}, and the crystal face of the second SOI layer is {110}. Note that the SOI layers can also be referred to as single-crystalline semiconductor layers or active layers.

In the present invention, an ion implantation layer is a region which is made fragile so as to have microcavities by ions with which a single-crystalline semiconductor substrate is irradiated, and hereinafter also referred to as an "ion implantation layer" or a "fragile layer." This fragile layer is separated by generation of a crack or the like by later heat treatment, so that a single-crystalline semiconductor layer can be separated from the single-crystalline semiconductor substrate.

The fragile layer may be formed by irradiation of ions by an ion doping method or an ion implantation method.

The ion doping method is a method in which without mass separation, an ionized gas is accelerated by electric field and a single-crystalline semiconductor substrate is irradiated with the accelerated gas. The ion doping method may be carried out with an ion doping apparatus.

Further, the ion implantation method is a method in which an ionized gas is mass-separated with an ion implantation apparatus and a single-crystalline semiconductor substrate is irradiated with the gas. Using the ion implantation method, an ionized hydrogen gas can be mass-separated and selectively accelerated to perform irradiation.

Another aspect of the present invention is a semiconductor element, which can be manufactured by a certain process. The process includes a first step of adding ion species which are selected from hydrogen or halogen to a first single-crystalline semiconductor substrate to form a first fragile layer in a region at a predetermined depth from a surface of the first single-crystalline semiconductor substrate; forming a first silicon oxide film by chemical vapor deposition using an organic silane gas over the first single-crystalline semiconductor substrate; etching the first single-crystalline semiconductor substrate and the first silicon oxide film using a mask to form a first single-crystalline semiconductor layer over which the first silicon oxide film is formed; superposing the first single-crystalline semiconductor layer and an insulating substrate having a light-transmitting property on each other with the first silicon oxide film interposed therebetween; conducting heat treatment with the superposed state to generate a crack in the first fragile layer; and separating the first single-crystalline semiconductor substrate in the state that the first single-crystalline semiconductor layer is bonded to the insulating substrate, and a second step of adding ion species which are selected from hydrogen or halogen to a second single-crystalline semiconductor substrate to form a second fragile layer in a region at a predetermined depth from a surface of the second single-crystalline semiconductor substrate; forming a second silicon oxide film by chemical vapor deposition using an organic silane gas over the second single-crystalline semiconductor substrate; etching the second single-crystalline semiconductor substrate and the second silicon oxide film using a mask to form a second single-crystalline semiconductor layer over which the second silicon oxide film is formed; superposing the second single-crystalline semiconductor layer and the insulating substrate on each other with the second silicon oxide film interposed therebetween; conducting heat treatment with the superposed state to generate a crack in the second fragile layer; and separating the second single-crystalline semiconductor substrate in the state that the second single-crystalline semiconductor layer is bonded to the insulating substrate.

Such separation of the single-crystalline semiconductor substrate in the state that the single-crystalline semiconductor layer remains on the side of the insulating substrate is also called transfer. Note that either the first step or the second step may be conducted first. In other words, either the n-type single-crystalline semiconductor layer or the p-type single-crystalline semiconductor layer may be transferred to the insulating substrate first.

The silicon oxide film formed using the organic silane gas is included as an uppermost layer in a bonding layer. By the silicon oxide film, a strong bond between the single-crystalline semiconductor substrate and the insulating substrate can be formed.

After separation of the single-crystalline semiconductor layer, a surface of the single-crystalline semiconductor layer may be planarized by laser irradiation, heat treatment, CMP, or a combination thereof.

Further, the single-crystalline semiconductor layer may be polished and thinned by CMP or the like. At this time, the thickness is preferably made to be 5 to 25 nm. When the single-crystalline semiconductor layer is thinned, improvement in mobility, improvement in an S value, and suppression of a short channel effect can be achieved. As the thicknesses become smaller, the S values of the single-crystalline semiconductor films become closer to each other, which is preferable.

At the transfer, the single-crystalline semiconductor layer which is transferred first is preferably thinner than the single-crystalline semiconductor layer which is transferred later. This is because bonding in a region where bonding is not needed can be prevented in superposition with the silicon oxide film interposed.

Later, in order to make the heights of the both single-crystalline semiconductor layers equal, planarization treatment such as laser irradiation, heat treatment, CMP, or a combination thereof may be performed. It is preferable to use CMP.

According to the present invention, by employing crystal faces and/or crystal axes with which mobility of carriers flowing through channels of MISFETs becomes high, carrier effective mass can be the smallest; accordingly, carrier effective mobility can be the highest. Therefore, high speed operation of a semiconductor device can be achieved. Further, low voltage driving of the semiconductor device becomes possible, and low power consumption can be achieved.

By making the n-channel MISFET and the p-channel MISFET have at least different crystal faces or crystal axes, a semiconductor element or the like with increased mobility can be provided. Further, since a light-transmitting property is obtained, the semiconductor element is preferably used for a semiconductor display device, particularly, a display portion or a driver circuit (semiconductor integrated circuit) of the semiconductor display device. Since the semiconductor element or the like of the present invention has high mobility, high speed operation can be achieved. In addition, low voltage driving is enabled, so that low power consumption of a semiconductor display device can be realized.

DETAILED DESCRIPTION OF THE INVENTION

Figure 1A:
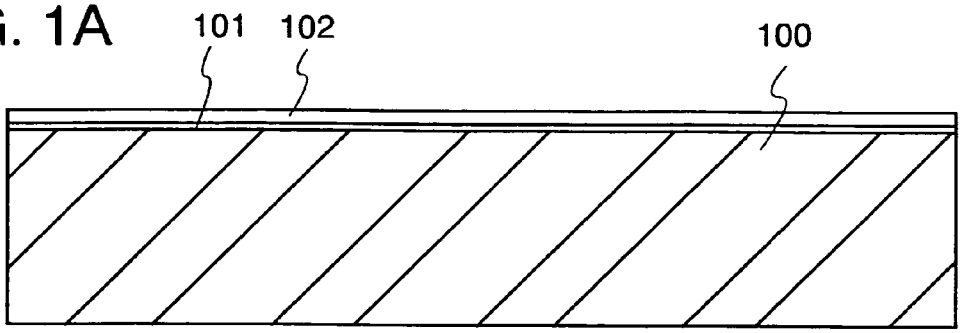
FIGS. 1A to 1D show a manufacturing method of an SOI substrate according to Embodiment Mode 1.

Embodiment modes of the present invention will be described with reference to the drawings. It is easily understood by those skilled in the art that various changes may be made in forms and details without departing from the spirit and the scope of the invention. Therefore, the present invention should not be interpreted as being limited to the descriptions of the embodiment modes below. In structures of the present invention described below, the same reference numerals are commonly given to the same components or components having similar functions throughout the drawings.

Embodiment Mode 1

Embodiment Mode 1 will describe a mode of transferring semiconductor layers which form an n-channel MISFET and a p-channel MISFET from single-crystalline semiconductor substrates having different crystal faces (hereinafter also referred to as bond wafers) to the same surface of a substrate having an insulating surface (hereinafter also referred to as a base substrate). A mode where crystal faces with which mobility of carriers moving in channel length directions is increased are employed for an n-channel MISFET and a p-channel MISFET, that is, a mode where a semiconductor layer whose crystal face is {100} is employed for the n-channel MISFET and a semiconductor layer whose crystal face is {110} is employed for the p-channel MISFET will be described below.

In order to obtain a single-crystalline semiconductor layer for forming a channel formation region, a source region, and a drain region in the n-channel MISFET, a bond wafer whose crystal face is {100} is used. In order to obtain a single-crystalline semiconductor layer for forming a channel formation region, a source region, and a drain region in the p-channel MISFET, a bond wafer whose crystal face is {110} is used. The single-crystalline semiconductor layers having respective crystal faces are taken from the bond wafers having different crystal faces from each other and fixed to the same base substrate. For fixing, the following process is conducted preferably.

FIG. 1A shows a state where a silicon oxide film 101 and a silicon nitride film 102 are formed over a first bond wafer 100. The first bond wafer 100 is a single-crystalline semiconductor substrate whose crystal face is {100}. In order to take a single-crystalline semiconductor layer from the first bond wafer 100, hydrogen ions are added to the first bond wafer 100 in high dose conditions. Then, a problem in that a surface of the first bond wafer 100 becomes rough arises, which sometimes causes failures of bonding in a subsequent bonding step. Therefore, the silicon oxide film 101 is preferably formed to protect the surface of the first bond wafer 100. The silicon oxide film 101 is desirably formed by thermal oxidation, and preferably, for example, formed by heat treatment at 900 to 1100° C. in a water-vapor atmosphere. As another manufacturing method of the silicon oxide film 101, silicon may be oxidized by oxygen plasma treatment, and here, a dense silicon oxide film can be formed at a lower temperature than that in thermal oxidation. Alternatively, as the silicon oxide film 101, a silicon oxide film may be stacked by a vapor deposition method and a surface thereof may be densified by oxygen plasma treatment, and here, a silicon oxide film can be formed at a lower temperature than that in thermal oxidation.

Figure 1B:
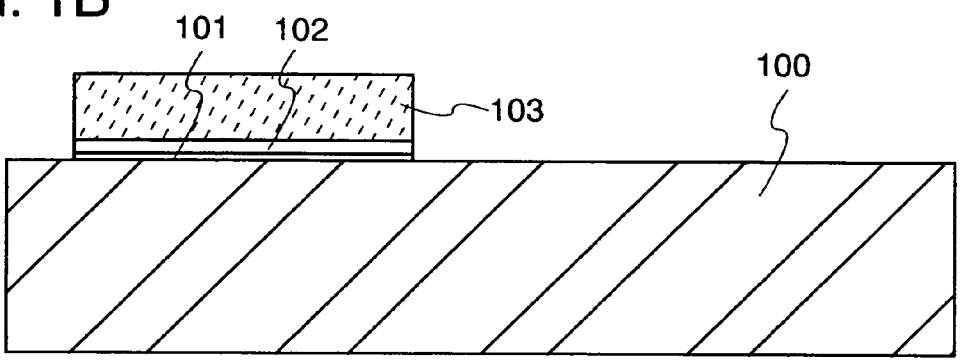

The silicon nitride film 102 is formed over the silicon oxide film 101. The silicon nitride film 102 may be formed by a vapor deposition method using silane and ammonia. The silicon nitride film 102 is used as a hard mask in forming a groove in the first bond wafer 100. The formation of the groove is carried out in consideration of the shape of a semiconductor layer of the MISFET. In other words, the formation of the groove is carried out to the first bond wafer 100 so that the portion to be transferred remains as a projection portion in order to transfer the semiconductor layer of the MISFET to a base substrate. As shown in FIG. 1B, a mask pattern 103 is formed of a photoresist, and the silicon nitride film 102 and the silicon oxide film 101 are etched.

Figure 1C:
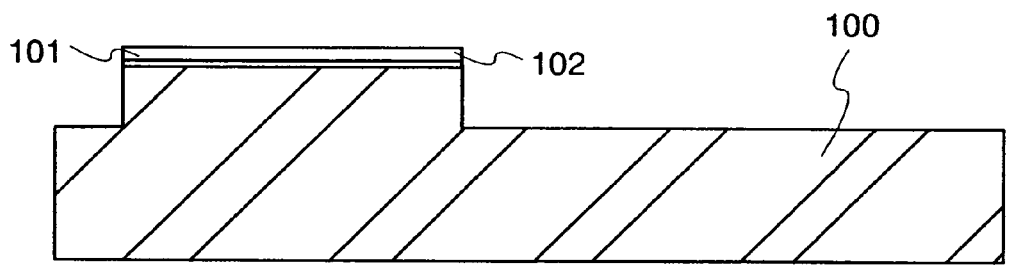

Next, as shown in FIG. 1C, the first bond wafer 100 is etched using the silicon nitride film 102 as a hard mask. The etching depth of the first bond wafer 100 is determined in consideration of the thickness of the single-crystalline semiconductor layer to be transferred to the base substrate. The thickness of the single-crystalline semiconductor layer can be controlled by the depth of the hydrogen ions added. It is preferable that the groove in the first bond wafer 100 be formed deeper than a fragile layer.

Figure 1D:
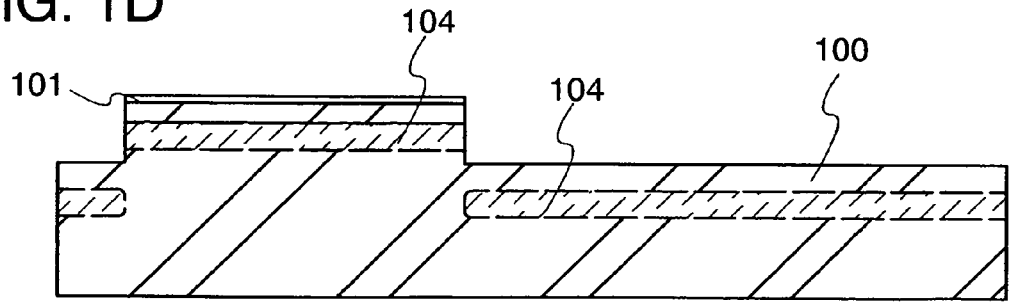

Addition of hydrogen ions shown in FIG. 1D is conducted in consideration of the thickness of the single-crystalline semiconductor layer to be transferred to the base substrate. The thickness of the single-crystalline semiconductor layer is set at 10 nm to 200 nm, and more preferably 10 nm to 50 nm. When the single-crystalline semiconductor layer is thin, improvement in mobility, improvement in an S value, and suppression of a short channel effect can be achieved. The acceleration voltage in addition of the hydrogen ions is determined in consideration of such a thickness, so that the hydrogen ions are added to the first bond wafer 100. By this processing, a fragile layer 104 is formed in a region at a certain depth from the surface of the first bond wafer 100. This fragile layer 104 may be formed using not only hydrogen but also a rare gas or a mixture of hydrogen and a rare gas. After the ion addition step, the silicon nitride film 102 on the surface is removed.

Figure 2A:
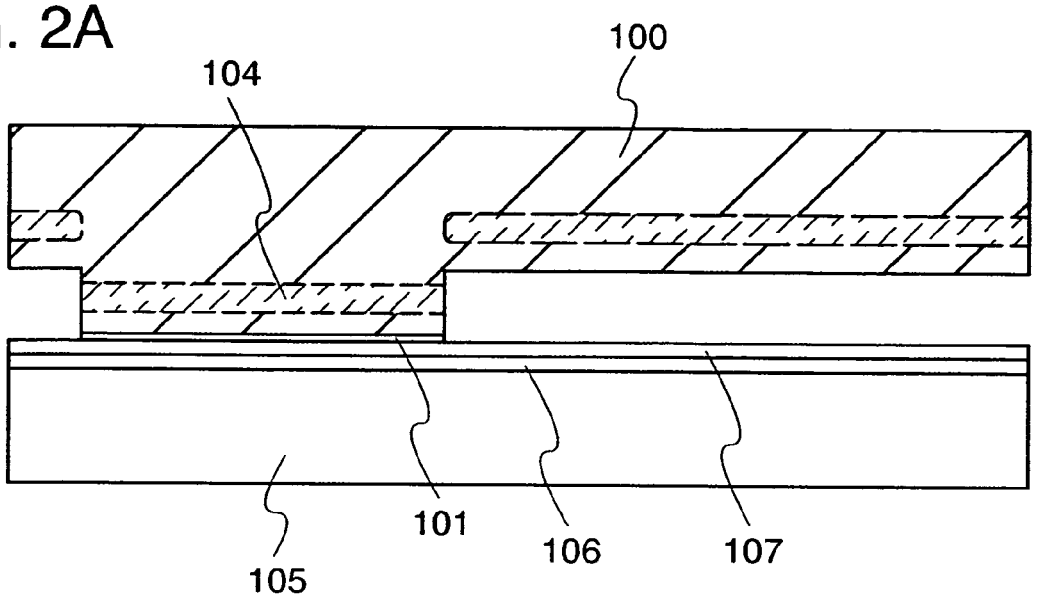
FIGS. 2A and 2B show a manufacturing method of an SOI substrate according to Embodiment Mode 1.

As shown in FIG. 2A, a bonding step in which a surface of the silicon oxide film 101 provided for the first bond wafer 100 and a base substrate 105 are bonded is carried out. Since bonding at low temperature is possible, various substrates can be employed as the base substrate 105. As the base substrate 105, an insulating substrate of glass, quartz, sapphire, or the like; a semiconductor substrate of silicon, gallium arsenide, indium phosphide, or the like; or the like can be used.

Over a surface of the base substrate 105, a silicon nitride film 106 and a silicon oxide film 107 are formed. The silicon nitride film 106 is provided to prevent contamination of the single-crystalline semiconductor layer due to an impurity such as sodium ions which are diffused from the base substrate 105. For this purpose, instead of the silicon nitride film, a silicon nitride oxide film (a film that contains more nitrogen than oxygen and, in the case where measurements are performed using Rutherford backscattering spectrometry (RBS) and hydrogen forward scattering (HFS), includes oxygen, nitrogen, silicon, and hydrogen at concentrations ranging from 5 to 30 at. %, 20 to 55 at. %, 25 to 35 at. %, and 10 to 30 at. %, respectively), aluminum nitride, aluminum nitride oxide, or the like can be used. In the case where the impurity from the base substrate 105, which causes adverse effect on the single-crystalline semiconductor layer, is not diffused, the silicon nitride film 106 can be omitted. On the other hand, the silicon oxide film 107 is provided to bond the base substrate 105 to the silicon oxide film 101. In this case, instead of the silicon oxide film, a silicon oxynitride film (a film that contains more oxygen than nitrogen and, in the case where measurements are performed using RBS and HFS, includes oxygen, nitrogen, silicon, and hydrogen at concentrations ranging from 50 to 70 at. %, 0.5 to 15 at. %, 25 to 35 at. %, and 0.1 to 10 at. %, respectively) can be employed.

The bond is formed by making the silicon oxide film 101, whose surface is washed, on the first bond wafer 100 side and the silicon oxide film 107 on the base substrate side in close contact with each other. The bond can be formed at room temperature. This bonding is carried out at the atomic level, and a strong bond is formed at room temperature by van der Waals' forces. Since the groove is formed in the first bond wafer 100, the projection portion which forms the single-crystalline semiconductor layer is in contact with the base substrate 105.

Figure 2B:
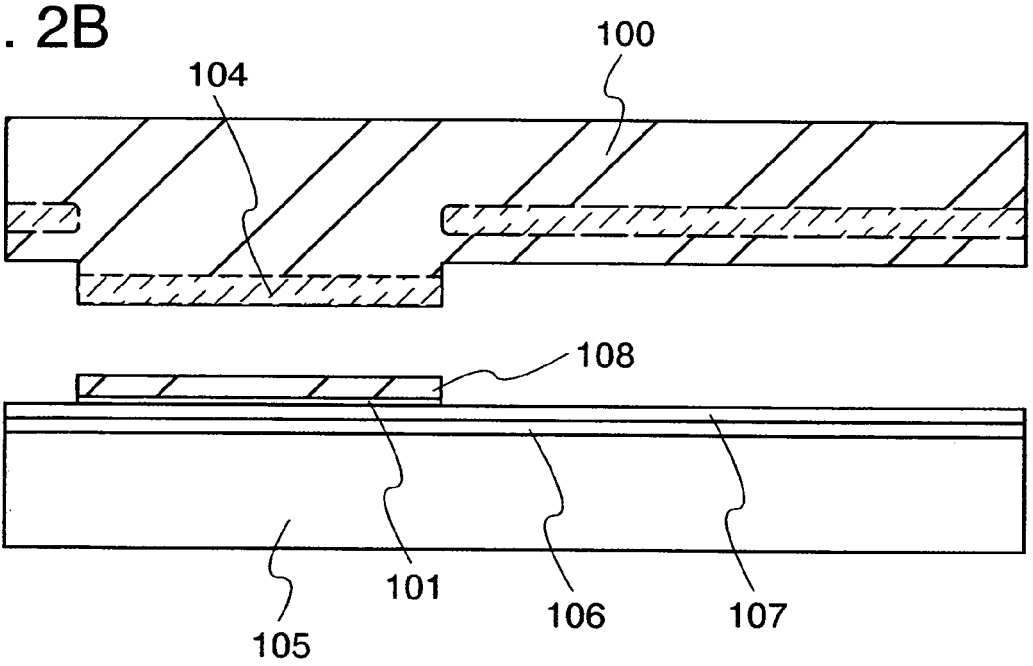

After the first bond wafer 100 and the base substrate 105 are bonded, the single-crystalline semiconductor layer is separated from the first bond wafer 100 as shown in FIG. 2B and fixed to the base substrate 105. Separation of the single-crystalline semiconductor layer is caused in the following manner: the volume of microcavities formed in the fragile layer 104 is changed, a crack is generated, and then a broken-out section is generated along the fragile layer 104. To generate the broken-out section and make the bond even stronger, heat treatment at 400 to 600° C. is preferably conducted. Thus, the single-crystalline semiconductor layer (hereinafter also referred to as "SOI layer") is formed on an insulating surface. FIG. 2B shows the state in which a first SOI layer 108 is bonded to the base substrate 105.

When the crystal face of the first bond wafer 100 is {100}, the crystal face of the first SOI layer 108 is also {100}. To form an SOI layer having another crystal face over the base substrate 105, a bond wafer having another crystal face may be used.

Figure 3:
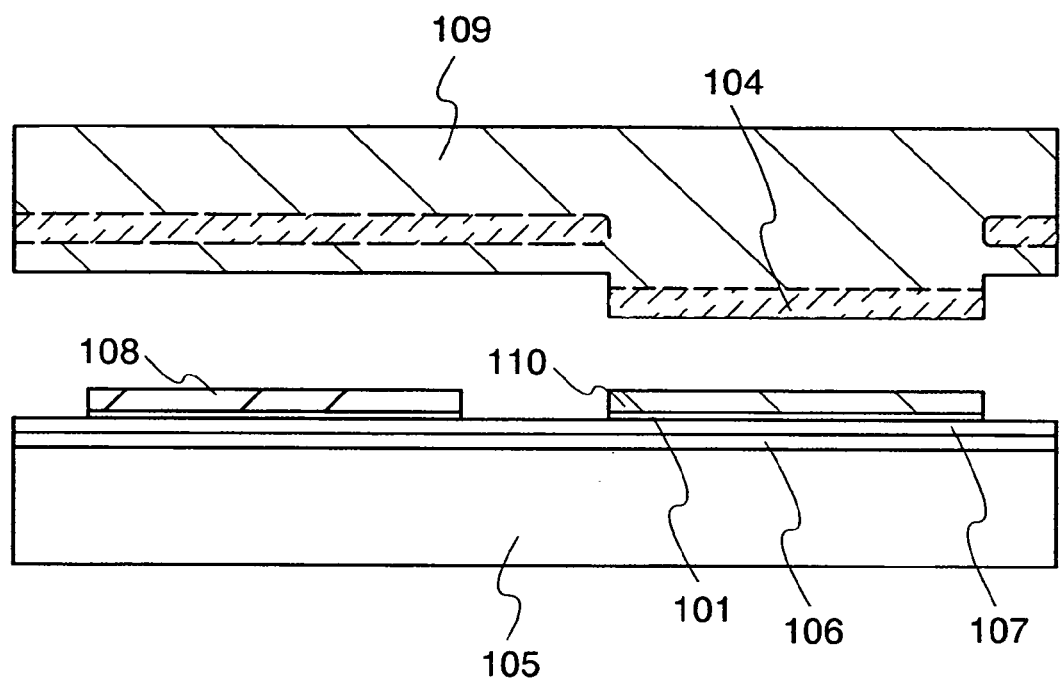
FIG. 3 shows a manufacturing method of an SOI substrate according to Embodiment Mode 1.

FIG. 3 shows the state after separating a single-crystalline semiconductor layer from a second bond wafer 109 having a different crystal face from that of the first bond wafer 100 (e.g., a wafer whose crystal face is {110}). A fragile layer 104 is formed in the second bond wafer 109, and similarly to the first bond wafer 100, a second SOI layer 110 is bonded to the base substrate 105.

Through the above-described process, the first SOI layer 108 and the second SOI layer 110 having different crystal faces from each other are provided over the base substrate 105. In the above process, when the crystal face of the first bond wafer 100 is {100}, the crystal face of the first SOI layer 108 is also {100}, and when the crystal face of the second bond wafer 109 is {110}, the crystal face of the second SOI layer 110 is also {110}. In order to planarize surfaces of the first SOI layer 108 and the second SOI layer 110 which are transferred, chemical mechanical polishing (CMP) is preferably conducted. The first SOI layer 108 and the second SOI layer 110 may be further thinned by CMP, and may be adjusted to be 5 to 25 nm thick. When the SOI layers are thin, improvement in mobility, improvement in an S value, and suppression of a short channel effect can be achieved. As the thicknesses become smaller, the S values of the single-crystalline semiconductor films become closer to each other, which is preferable.

With the structure of this embodiment mode, an n-channel MISFET can be formed with the first SOI layer 108 whose crystal face is {100}. In addition, a p-channel MISFET can be formed with the second SOI layer 110 whose crystal face is {110}. In other words, in each of the MISFETs, a channel formation region can be provided in a layer having a crystal face with which field effect mobility of electrons or holes can be the highest.

In this embodiment mode, the method of separating the single-crystalline semiconductor layer from the bond wafer by addition of the hydrogen ions or the like to a certain depth has been described; however, another SOI technique can also be employed. For example, a porous silicon layer is formed by anodization of a surface of a bond wafer, and a single-crystalline silicon layer formed by epitaxial growth is formed thereon. The single-crystalline silicon layer can be used as the SOI layer described in this embodiment mode. When using the bond wafer having this structure, a water jet method is used to separate the porous silicon layer and the single-crystalline silicon layer formed by epitaxial growth. Accordingly, a base substrate provided with the SOI layer as shown in FIG. 2B or FIG. 3 can be formed.

According to this embodiment mode, single-crystalline semiconductor layers (SOI layers) whose crystal faces are different can be formed over a base substrate included in a semiconductor device. The crystal faces can be determined so as to obtain high field effect mobility of an n-channel MISFET and a p-channel MISFET. By employing crystal faces and/or crystal axes with which carrier mobility become high, carrier effective mass can be the smallest; accordingly, carrier effective mobility can be the highest. By using such a base substrate provided with single-crystalline semiconductor layers, high performance of a semiconductor device can be realized.

Embodiment Mode 2

Figure 4A:
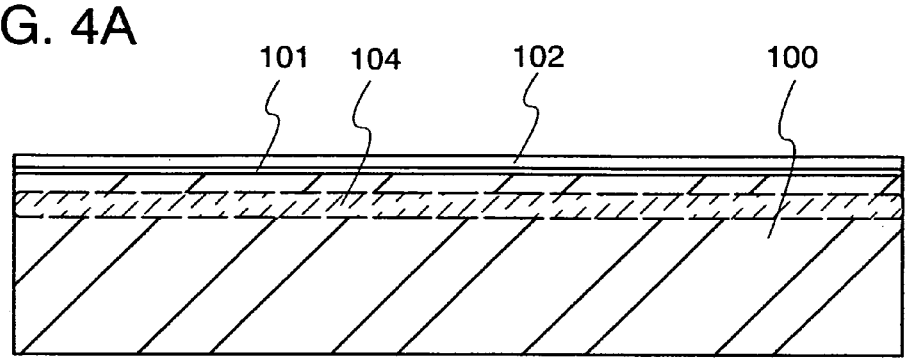
FIGS. 4A and 4B show a manufacturing method of an SOI substrate according to Embodiment Mode 2.
Figure 4B:
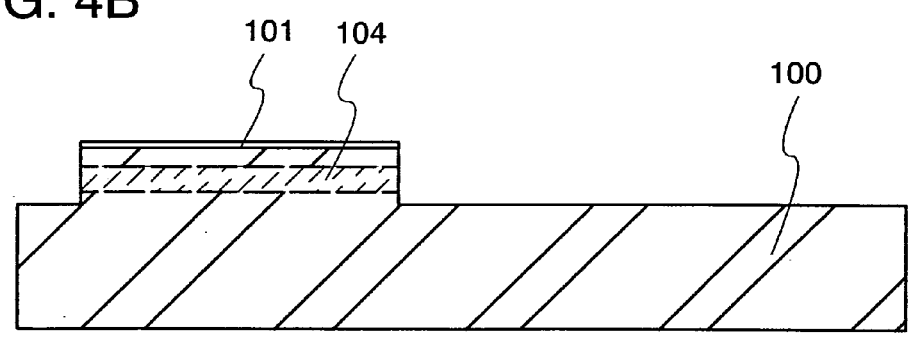

Embodiment Mode 2 describes a manufacturing process of a bond wafer different from the process shown in FIGS. 1A to 1D, with reference to FIGS. 4A and 4B. In FIG. 4A, a silicon oxide film 101 and a silicon nitride film 102 are formed over a surface of a first bond wafer 100. Then, ions of hydrogen, a rare gas, or both of hydrogen and a rare gas are added, so that a fragile layer 104 is formed in the first bond wafer 100. Next, formation of a groove is conducted as shown in FIG. 4B. In the formation of the groove, the groove is processed to be deeper than the fragile layer 104, so that the fragile layer 104 can remain only in a region of a single-crystalline semiconductor layer which should be transferred. With this structure, transfer can be easily performed.

Embodiment Mode 3

Embodiment Mode 3 will describe a manufacturing method of a semiconductor element substrate, in which SOI layers for forming an n-channel MISFET and a p-channel MISFET are transferred from respective bond wafers whose crystal faces are different to the same surface of a base substrate that is a light-transmitting insulating substrate different from the bond wafers. In this embodiment mode, a bond wafer whose crystal face is {100} is used for an n-channel MISFET, and a channel formation region, a source region, and a drain region are formed. Further, a bond wafer whose crystal face is {110} is used for a p-channel MISFET, and a channel formation region, a source region, and a drain region are formed. In this embodiment mode, description is made in the order in which the SOI layer of the n-channel MISFET is transferred to the light-transmitting insulating substrate and then the SOI layer of the p-channel MISFET is transferred to the insulating substrate; however, either of the SOI layers may be transferred first.

Figure 20A:
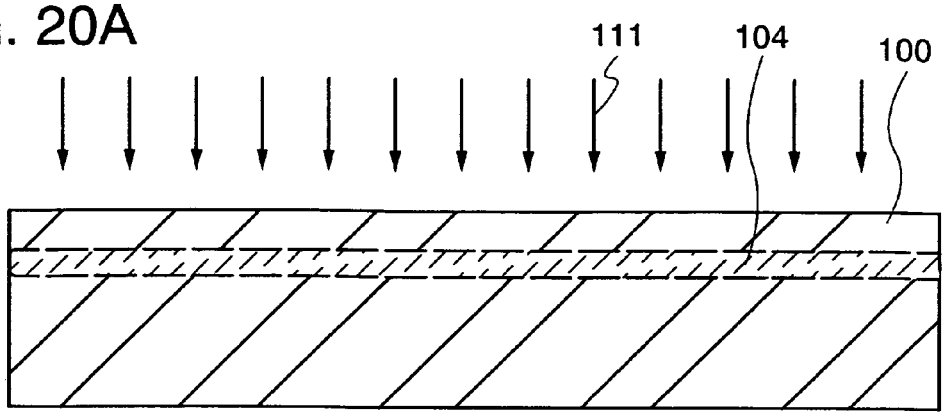
FIGS. 20A to 20D show a manufacturing method of a semiconductor element substrate according to Embodiment Mode 3.

As shown in FIG. 20A, ion species 111 of hydrogen, halogen, both hydrogen and halogen, or both hydrogen and halogen to which a rare gas is mixed are added to a region at a predetermined depth of a first bond wafer 100 whose crystal face is {100}, so that a fragile layer 104 is formed. At this time, if an ion implantation method is used, hydrogen or halogen are added in the state where hydrogen or halogen is mass-separated. Ion species selected from hydrogen or halogen may be added to the first bond wafer 100 in high dose conditions ($1\times10^{15}/cm^2$ to $1\times10^{17}/cm^2$) because an SOI layer of the MISFET can be easily taken from the first bond wafer 100 in separation. Note that the predetermined depth at which the fragile layer is formed is the thickness of the SOI layer of the n-channel MISFET when the SOI layer is transferred to the insulating substrate. Therefore, the thickness of the SOI layer transferred can be determined depending on the addition conditions of the ion species. For addition of the ion species, either a step of direct addition to the bond wafer 100 or a step of addition in the state where an insulating layer or the like is formed over the bond wafer can be employed. In either step, a fragile layer can be formed by the addition conditions so as to be formed at the same depth as the thickness of the SOI layer after transfer.

Figure 20B:
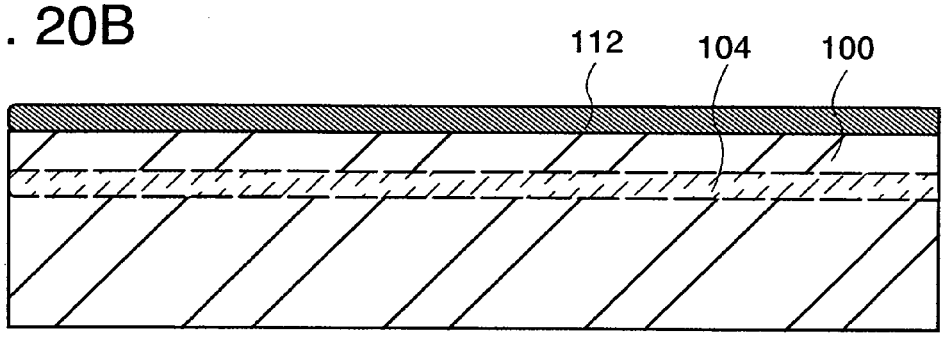

As shown in FIG. 20B, a bonding layer 112 is formed over the first bond wafer 100. In the bonding layer 112, a silicon oxide film with a thickness of 10 nm to 200 nm is formed as an uppermost layer. The silicon oxide film is formed by chemical vapor deposition with the use of an organic silane gas. The silicon oxide film formed by chemical vapor deposition with the use of the organic silane gas has high planarity, and thus, bonding can be conducted surely in a bonding step. Note that the silicon oxide film can also be formed by thermal oxidation or a plasma CVD method, and the silicon oxide film formed in any method can be subjected to plasma treatment. By plasma treatment, density of the silicon oxide film can be increased. Such a bonding layer 112 may be formed on a side surface or a back surface of the first bond wafer 100 as well as the top surface.

The uppermost layer of the bonding layer 112 is preferably the silicon oxide film; however, another film may be included in addition to the silicon oxide film. For example, a silicon oxide film, a silicon nitride film, or a silicon oxynitride film may be included between the bond wafer and the silicon oxide film. For example, in the case where a silicon oxynitride film is included, silicon oxynitride films having different concentrations of nitrogen and oxygen may be stacked. The silicon oxynitride (SiON) film having higher oxygen concentration functions to strengthen a bond of the silicon oxide film formed as the uppermost layer to another layer, and the silicon nitride oxide (SiNO) film having higher nitrogen concentration functions to prevent impurity contamination. Therefore, the bonding layer 112 in which the SiNO film, SiON film, and the silicon oxide film are stacked in this order is preferably formed over the first bond wafer.

The silicon oxide film provided as an uppermost layer of the bonding layer 112 also has a function of keeping the planarity of the first bond wafer 100 whose surface becomes rough due to the addition in high dose conditions.

Figure 20C:
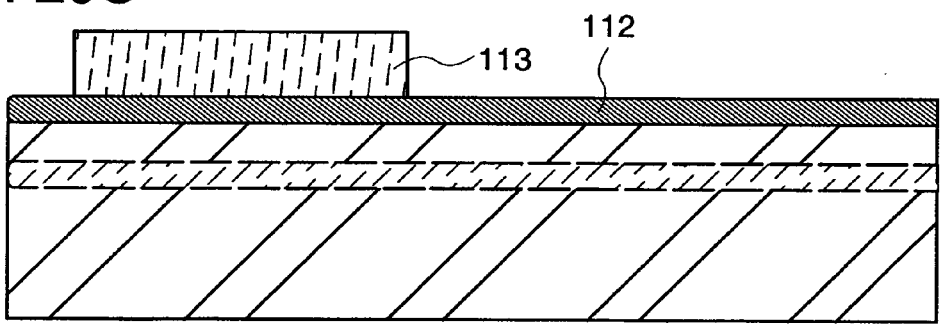

As shown in FIG. 20C, a mask 113 of a resist or the like is selectively provided over the first bond wafer 100. The mask is selectively provided in consideration of arrangement of the SOI layer of the p-channel MISFET to be transferred later. When the SOI layer of the n-channel MISFET and the SOI layer of the p-channel MISFET are arranged adjacently, a CMOS circuit can be manufactured easily.

Figure 20D:
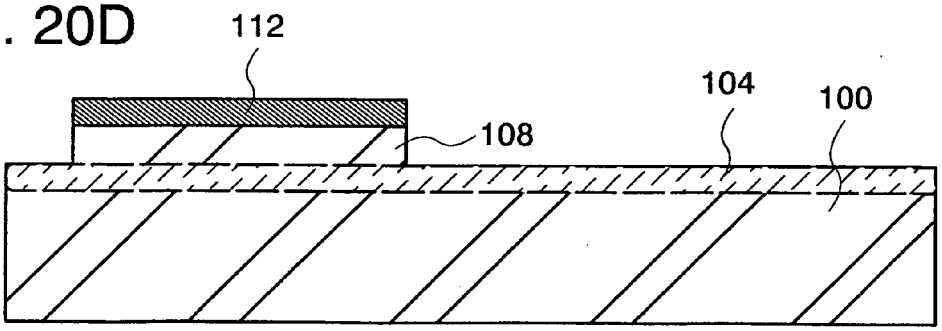

As shown in FIG. 20D, the first bond wafer 100 and the bonding layer 112 are etched using the mask 113, so that an SOI layer 108 of the n-channel MISFET is formed. The bonding layer remains over the SOI layer 108, and the SOI layer 108 has a rectangular shape. Note that the bonding layer 112 may be etched using the mask 113 first, and then the first bond wafer 100 may be etched using the bonding layer 112 as a mask. In either method, the first bond wafer 100 is preferably etched at least to the time when the fragile layer 104 is exposed because the first bond wafer 100 is separated using the fragile layer as a boundary when the SOI layer 108 is transferred.

Next, an insulating substrate (serving as a base substrate) 105 having a light-transmitting property is prepared. Glass, quartz, plastic, sapphire, or the like can be used for the insulating substrate 105, which is preferable for a semiconductor display device. In the case of manufacturing a device which does not require a light-transmitting property, a semiconductor substrate of silicon, gallium arsenide, indium phosphide, or the like can be used as the insulating substrate 105. A film containing silicon may be formed over the insulating substrate 105. As the film containing silicon, a silicon oxide film, a silicon nitride film, or a silicon oxynitride film can be used. A silicon oxide film can be formed by chemical vapor deposition with the use of an organic silane gas. The silicon oxide film formed by chemical vapor deposition with the use of an organic silane gas can improve planarity of the insulating substrate 105 and strengthen a bond to the bonding layer 112. To improve a function of preventing impurity contamination, a silicon nitride oxide (SiNO) film having higher concentration of nitrogen may be provided, or an aluminum nitride film or an aluminum nitride oxide film having high function of preventing impurity contamination may be employed as well. To strengthen a bond between a silicon oxynitride film and another layer, a silicon oxynitride (SiON) film having higher concentration of oxygen may be provided. Such a film containing silicon can be formed by thermal oxidation or a plasma CVD method as well as chemical vapor deposition.

Figure 21A:
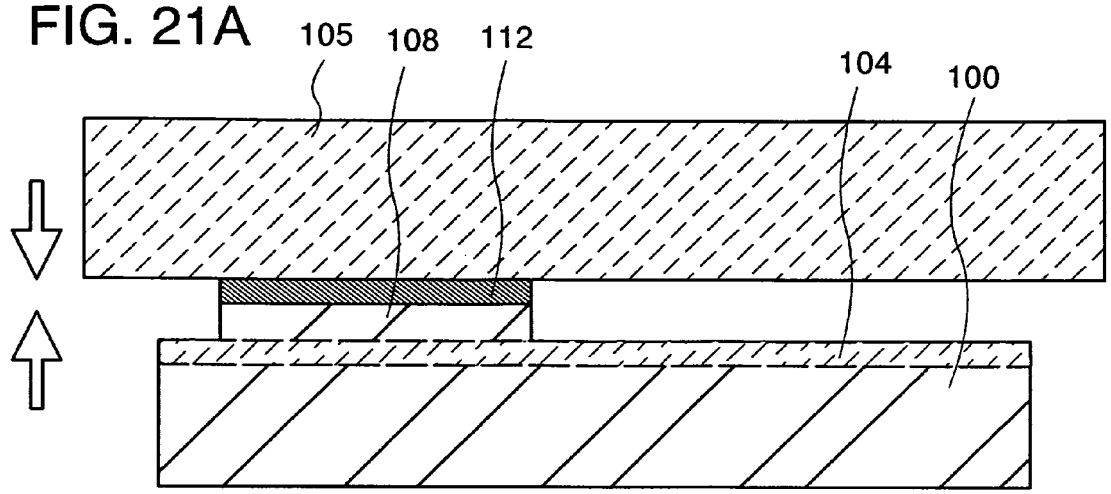
FIGS. 21A and 21B show a manufacturing method of a semiconductor element substrate according to Embodiment Mode 3.

As shown in FIG. 21A, the insulating substrate 105 having a light-transmitting property and the first bond wafer 100 are superposed on each other with the bonding layer which is selectively etched interposed therebetween. At this time, each of superposed surfaces is preferably washed. The silicon oxide film is provided as the uppermost layer of the bonding layer which is selectively etched, and a bond to the insulating substrate 105 is strengthened by the silicon oxide film. At this time, when a silicon oxide film is also formed on the insulating substrate 105, bonding can be strengthened further. The insulating substrate 105 or the silicon oxide film on the insulating substrate can be bonded to the first bond wafer 100 at room temperature. This bonding is carried out at the atomic level, and a strong bond is formed at room temperature by van der Waals' forces. To strengthen the bond, heat treatment may be conducted in the state in which the insulating substrate 105 and the first bond wafer 100 are superposed on each other. When heat treatment is conducted, generation of a crack in the fragile layer 104 can be caused as well as improvement in bonding; therefore, taking the SOI layer of the MISFET, in other words, separation at the first bond wafer 100 can be performed easily. The crack can be caused by change in volume of microcavities formed in the fragile layer 104. To make the bond even stronger and generate the broken-out section along the fragile layer 104, heat treatment is preferably conducted at 400 to 600° C. for about 5 to 30 minutes, and, for example, conducted at 0.600° C. for 20 minutes. Further, pressure treatment may be conducted in addition to the heat treatment; at that time, the both treatments may be conducted simultaneously.

Figure 21B:
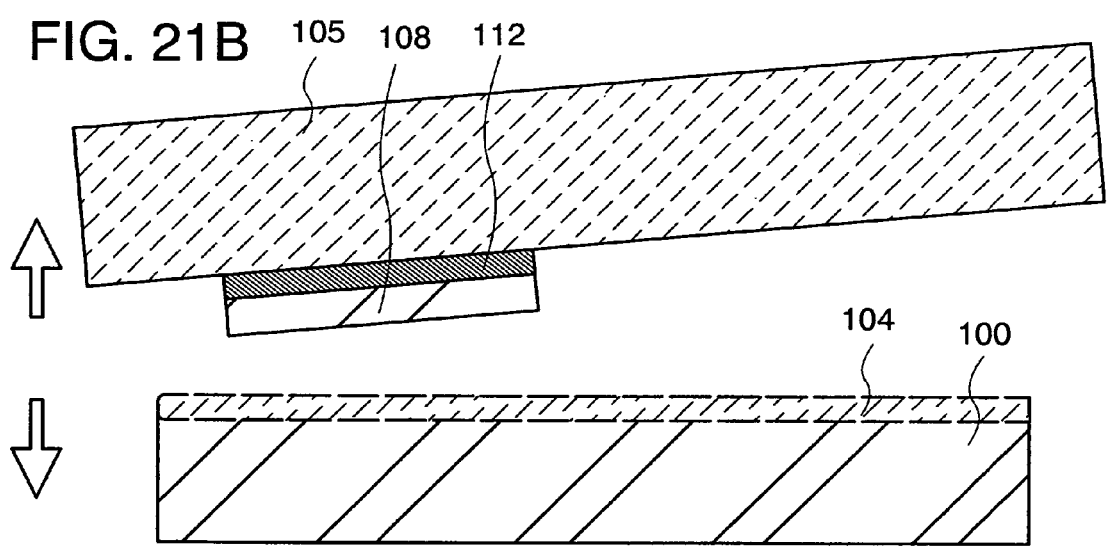

As shown in FIG. 21B, the first bond wafer 100 can be separated using the fragile layer 104 as a boundary in the state that the SOI layer 108 is bonded to the insulating substrate 105. When the crystal face of the first bond wafer 100 is {100}, the crystal face of the SOI layer 108 is also {100}, and an n-channel MISFET having high mobility can be provided.

Figure 22A:
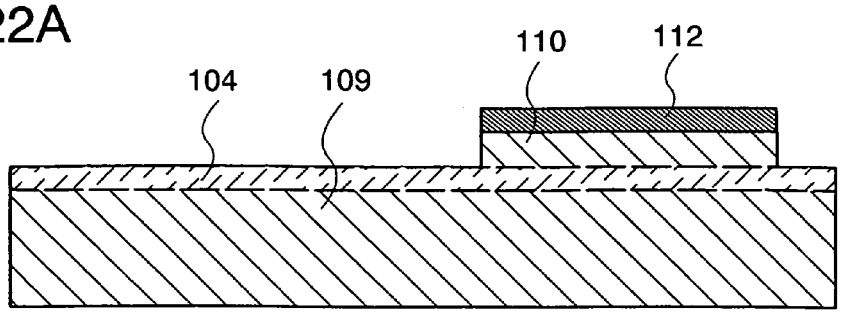
FIGS. 22A to 22C show a manufacturing method of a semiconductor element substrate according to Embodiment Mode 3.

Next, as shown in FIG. 22A, an SOI layer 110 is formed over a second bond wafer 109 whose crystal face is {110} similarly to the process shown in FIGS. 1A to 1D and FIGS. 2A and 2B. Although it is a similar process, the process will be appropriately described again. First, ion species selected from hydrogen or halogen are added by an ion implantation method or an ion doping method to form a fragile layer, and a bonding layer 112 is formed. Since a silicon oxide film is used as an uppermost layer of the bonding layer 112, bonding to the insulating substrate 105 can be strengthened. The point that the silicon oxide film is preferably formed by chemical vapor deposition with the use of an organic silane gas, or the like is similar to that of FIGS. 1A to 1D and FIGS. 2A and 2B. In addition, the point that formation of a film containing silicon over the insulating substrate 105 can strengthen a bond with the second bond wafer 109 is similar to that of FIGS. 1A to 1D and 2A and 2B. The point that heat treatment may be conducted in the state in which the insulating substrate 105 and the second bond wafer 109 are superposed on each other so as to strengthen the bond is similar to that of FIGS. 1A to 1D and FIGS. 2A and 2B. The point that a crack can be generated in the fragile layer 104 when heat treatment is conducted, pressure treatment may be conducted in addition to the heat treatment, and both treatments may be conducted simultaneously is similar to that of FIGS. 1A to 1D and FIGS. 2A and 2B. Furthermore, the point that the fragile layer 104 is etched so as to be exposed in a region where the SOI layer 110 is not provided is similar to that of FIGS. 1A to 1D and FIGS. 2A and 2B. Moreover, the point that the SOI layer 110 having a projection shape is selectively formed and a silicon oxide film is formed on an upper surface of the SOI layer 110 is similar to that of FIGS. 1A to 1D and FIGS. 2A and 2B.

Figure 22B:
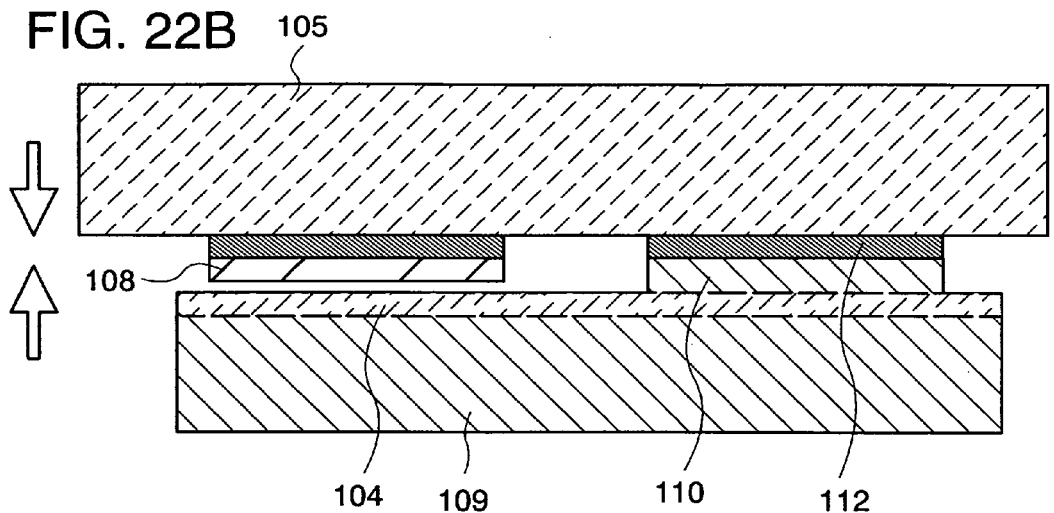

As shown in FIG. 22B, the insulating substrate 105 to which the SOI layer 108 is transferred and the second bond wafer 109 over which the SOI layer 110 is selectively formed are superposed on each other. When the SOI layer 110 is superposed so as to be adjacent to the SOI layer 108 shown in FIG. 20D and FIGS. 21A and 21B, a CMOS circuit can be manufactured easily.

When the SOI layer 108 is made thinner than the SOI layer 110, bonding in a region where bonding is not needed can be prevented in superposition. In other words, compared to the case where the SOI layer 108 and the SOI layer 110 have the same thickness, a bond between the SOI layer 108 and the second bond wafer 109 can be prevented actively. The SOI layer 108 can be made thinner than the SOI layer 110 when the depth of the fragile layer 104 in the first bond wafer 100 is made different from the depth of the fragile layer 104 in the second bond wafer 109. In other words, the doses or the like in forming the respective fragile layers 104 may vary from each other. Further, since the crystal faces of the bond wafers are different, even when the doses are equal, the depth of ion species added sometimes varies depending on each bond wafer. By utilizing this, the depth of the fragile layers can be varied.

Figure 22C:
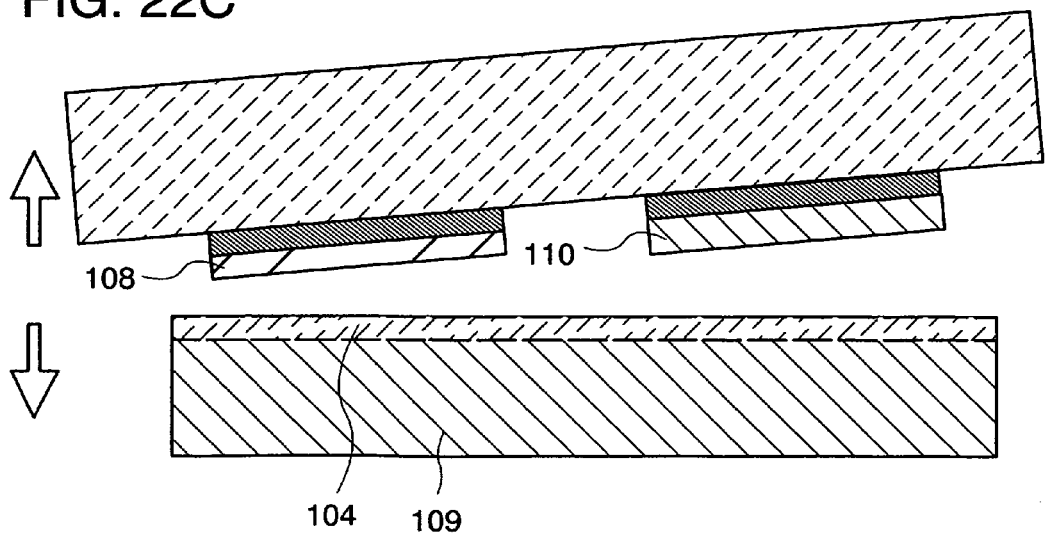

Then, as shown in FIG. 22C, separation between the second bond wafer 109 and the insulating substrate 105 is conducted. The second bond wafer 109 can be separated using the fragile layer 104 as a boundary in the state that the SOI layer 110 is bonded to the insulating substrate 105 to which the SOI layer 108 is transferred. When a crack is generated in the fragile layer 104 by the above-described heat treatment, the separation can be conducted easily.

Planarization treatment may be conducted to the SOI layer 108 and the SOI layer 110 which are transferred to the insulating substrate 105. For the planarization treatment, one or more of laser irradiation, heat treatment, and CMP can be used. Further, when surfaces of the SOI layer 108 and the SOI layer 110 have different heights, the heights of the surfaces may be different as they are, that is, the SOI layer 108 may remain thinner than the SOI layer 110, or the heights may be made equal. Since only the SOI layer 110 may be thinned in order that the heights are made equal to each other, CMP may be employed. At this time, both of the SOI layers may be further thinned by being polished to be preferably 5 nm to 25 nm thick. When the SOI layers are thinned, improvement in mobility, improvement in an S value, and suppression of a short channel effect can be achieved. As the thicknesses become smaller, the S values of the single-crystalline semiconductor films become closer to each other, which is preferable.

In this manner, by transferring an SOI layer of an n-channel MISFET and an SOI layer of a p-channel MISFET whose crystal faces are different to the same surface of an insulating substrate, the above-described semiconductor element and a semiconductor integrated circuit with increased mobility can be provided. Further, since a light-transmitting property is obtained, it is favorable to use the semiconductor integrated circuit or the like for a semiconductor display device. Since MISFETs with high electric characteristics such as mobility are transferred to an insulating substrate having a light-transmitting property, high speed operation of a semiconductor display device of the present invention can be achieved, and in addition, low voltage driving is enabled, so that low power consumption can be realized. Further, according to this embodiment mode, a structure for element separation need not be formed; therefore, a manufacturing process can be simplified.

In this embodiment mode, the method of transferring the single-crystalline semiconductor layers to be SOI layers from the bond wafers to the base substrate by addition of hydrogen ions or the like to a certain depth has been described; however, a similar base substrate can also be manufactured using another SOI technique. For example, a porous silicon layer is formed by anodization of a surface of a bond wafer, and a single-crystalline silicon layer formed by epitaxial growth is formed thereon. The single-crystalline silicon layer can be used as the SOI layer described in this embodiment mode. When using the bond wafer having this structure, a water jet method can be used to separate the porous silicon layer and the single-crystalline silicon layer formed by epitaxial growth.

Embodiment Mode 4

Figure 23A:
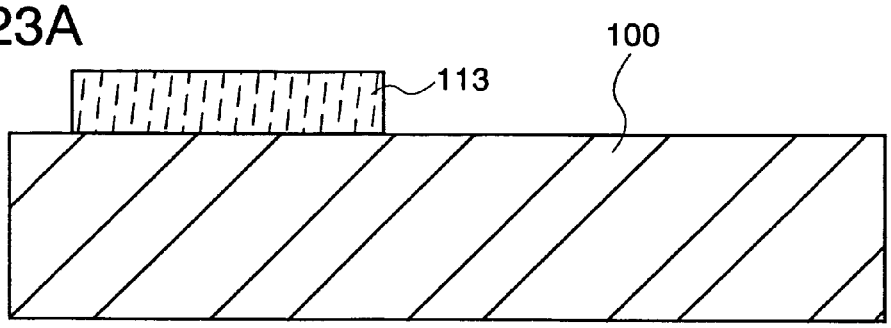
FIGS. 23A to 23D show a manufacturing method of a semiconductor element substrate according to Embodiment Mode 4.
Figure 23B:
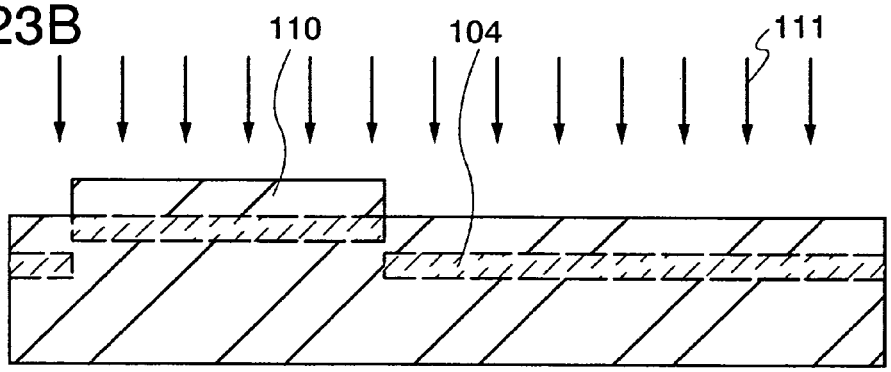

Embodiment Mode 4 will describe a manufacturing process in which a first bond wafer whose crystal face is {100} is selectively etched first as shown in FIG. 23A, then, a fragile layer is formed as shown in FIG. 23B, and an SOI layer of an n-channel MISFET and an SOI layer of a p-channel MISFET whose crystal faces are different are transferred to the same insulating substrate.

As shown in FIG. 23A, a mask 113 of a resist or the like is selectively formed over a first bond wafer 100. As described in the above embodiment modes, in order to manufacture a CMOS circuit easily, the mask 113 is selectively provided in consideration of arrangement of the SOI layer of the p-channel MISFET which is to be transferred later.

As shown in FIG. 23B, an SOI layer 108 of an n-channel MISFET is formed using the mask 113. In other words, a projection portion to be the SOI layer 108 is formed in the first bond wafer 100. Then, ion species 111 that are similar to those of the above embodiment modes are added to the first bond wafer 100, so that a fragile layer 104 is formed. Since the fragile layer 104 is formed at a predetermined depth from a surface of the first bond wafer 100, the fragile layer on a region to be the SOI layer 108 is formed more on the surface side of the first bond wafer 100 than the fragile layer on the other region.

Figure 23C:
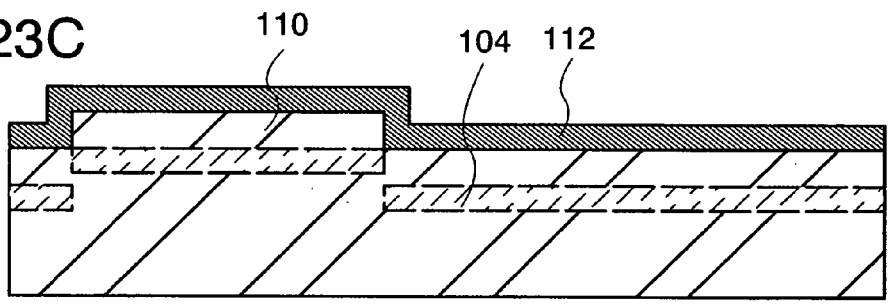

As shown in FIG. 23C, a bonding layer 112 which is similar to that in the above embodiment mode is formed. The bonding layer 112 is formed along the surface of the first bond wafer 100, that is, so as to cover the SOI layer 108.

Figure 23D:
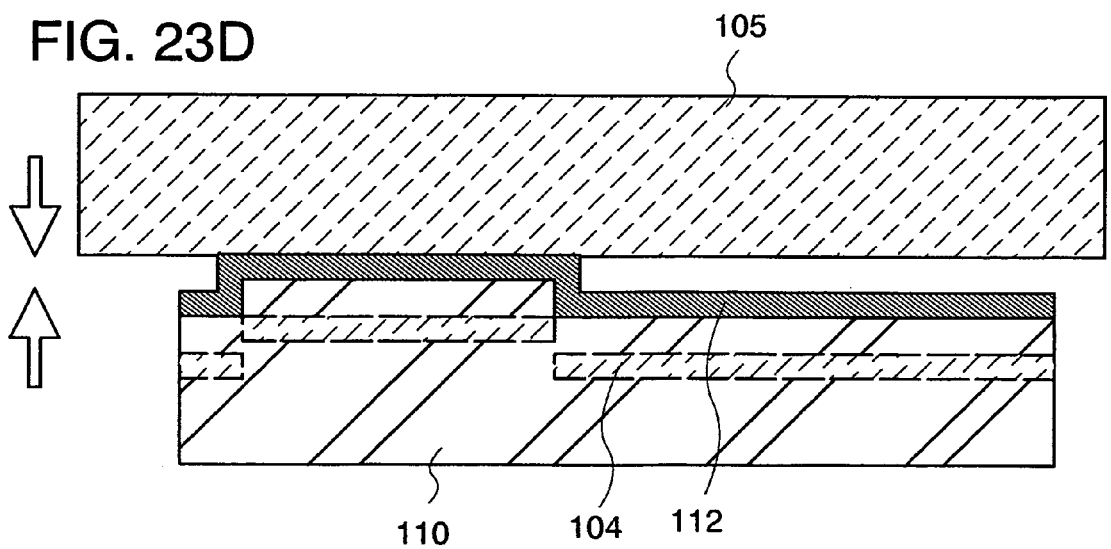

As shown in FIG. 23D, an insulating substrate 105 similar to that in the above embodiment modes is superposed on the first bond wafer 100 with the bonding layer 112 interposed therebetween. The point that a silicon oxide film is provided as an uppermost layer of the bonding layer 112, bonding to the insulating substrate 105 is strengthened by the silicon oxide film, and a silicon oxide film over the insulating substrate 105 can further strengthen the bond is similar to that of the above embodiment mode. In this embodiment mode, the first bond wafer 100 is actively bonded to the insulating substrate 105 at the projection portion of the SOI layer 108. The point that heat treatment may be conducted in the state in which the insulating substrate 105 and the first bond wafer 100 are superposed on each other to strengthen the bond and when the heat treatment is conducted, generation of a crack in the fragile layer 104 can occur in addition to improvement in bonding is similar to that of the above embodiment mode. Further, the point that pressure treatment may be performed in addition to the heat treatment and both of the treatments may be conducted simultaneously is similar to that of the above embodiment mode.

Then, similarly to the above embodiment mode, the first bond wafer 100 and the insulating substrate 105 are separated from each other to form the insulating substrate 105 to which the SOI layer 108 is transferred. Next, the SOI layer of a p-channel MISFET is transferred to the insulating substrate. The SOI layer of the p-channel MISFET is formed by selectively etching a second bond wafer and forming a fragile layer, based on the process similar to this embodiment mode. The SOI layer is transferred to the insulating substrate 105 to which the SOI layer 108 is transferred.

In this manner, by transferring an SOI layer of an n-channel MISFET and an SOI layer of a p-channel MISFET whose crystal faces are different to the same surface of an insulating substrate, a semiconductor integrated circuit or the like with increased mobility can be provided. Further, since a light-transmitting property is obtained, the semiconductor integrated circuit can be used for a semiconductor display device. Since MISFETs with high mobility are transferred to an insulating substrate having a light-transmitting property, high speed operation of a semiconductor display device of the present invention can be achieved, and in addition, low voltage driving is enabled, so that low power consumption can be realized. Further, according to this embodiment mode, a structure for element separation need not be formed; therefore, a manufacturing process can be simplified.

In this embodiment mode also, description is made in the order in which the SOI layer of the n-channel MISFET is transferred to the insulating substrate having a light-transmitting property and then the SOI layer of the p-channel MISFET is transferred to the insulating substrate; however, either of the SOI layers may be transferred first.

In this embodiment mode, the method of separating the single-crystalline semiconductor layers from the bond wafers by addition of hydrogen ions or the like to a certain depth has been described; however, another SOI technique can also be employed to manufacture a similar base substrate. For example, a porous silicon layer is formed by anodization of a surface of a bond wafer, and a single-crystalline silicon layer formed by epitaxial growth is formed thereon. The single-crystalline silicon layer can be used as the SOI layer described in this embodiment mode. When using the bond wafer having this structure, a water jet method can be used to separate the porous silicon layer and the single-crystalline silicon layer formed by epitaxial growth.

Embodiment Mode 5

Embodiment Mode 5 will describe a manufacturing process through the state in which the periphery of a bond wafer is covered with an oxide film as shown in FIGS. 24A to 24D, and 26A to 26D. This embodiment mode can be freely combined with a process except the step of covering the oxide film, such as a process in which selective etching is conducted after formation of a fragile layer in a bond wafer as in the above embodiment mode or a process in which a fragile layer is formed after selective etching of a bond wafer as in the above embodiment mode.

Figure 24A:
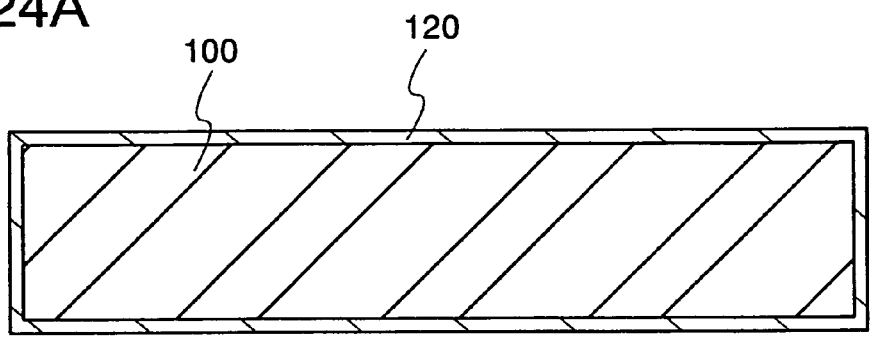
FIGS. 24A to 24C show a manufacturing method of a semiconductor element substrate according to Embodiment Mode 5.

In FIG. 24A, a first bond wafer 100 whose crystal face is {100} is washed with a sulfuric acid/hydrogen peroxide mixture (SPM), an ammonia peroxide mixture (APM), a hydrochloric acid/hydrogen peroxide mixture (HPM), diluted hydrogen fluoride (DHF), or the like. Then, thermal oxidation of the first bond wafer 100 is performed. The thermal oxidation can be conducted by dry oxidation or oxidation in an oxygen atmosphere to which halogen is added. As a material including halogen, HCL including chlorine is typical, and alternatively, one or more of HF, $NF_3$, HBr, $Cl_2$, $ClF_3$, $BCl_3$, $F_2$, $Br_2$, and the like can be used. As an example of such thermal oxidation, thermal oxidation may be conducted at 900 to 1150° C. (typically, 1000° C.) in an atmosphere including HCl at a rate of 0.5 to 10 volume % (preferably, 3 volume %) with respect to oxygen. By performing heat treatment with such a temperature range, gettering effect due to a halogen element with respect to an impurity element in the first bond wafer 100 can be obtained. As the gettering effect, an effect of removing a metal impurity (a heavy metal that is an extrinsic impurity) can be typically obtained. Metals such as Fe, Cr, and Ni are typical heavy metals, and Mo may be further included thereto in some cases. At that time, by effect of halogen such as chlorine, the impurity such as a metal in the first bond wafer 100 changes into a volatile chloride and is diffused into the air to be removed. When the surface of the first bond wafer 100 is subjected to chemical mechanical polishing (CMP) treatment, impurities can be efficiently removed. When halogen is included in an oxide film 120 in this manner, an effect that a heavy metal that is an extrinsic impurity is captured and contamination of the first bond wafer 100 is prevented can be obtained. Further, hydrogen in HCL has an effect that a defect at an interface between the first bond wafer 100 and the oxide film 120 is compensated to reduce the localized-level density at the interface. The treatment time of thermal oxidation may be 0.1 to 6 hours, and preferably, 0.5 to 1 hour. The thickness of the oxide film thus formed is made to be 10 to 1000 nm (preferably, 50 to 200 nm), and for example, 100 nm.

Figure 24B:
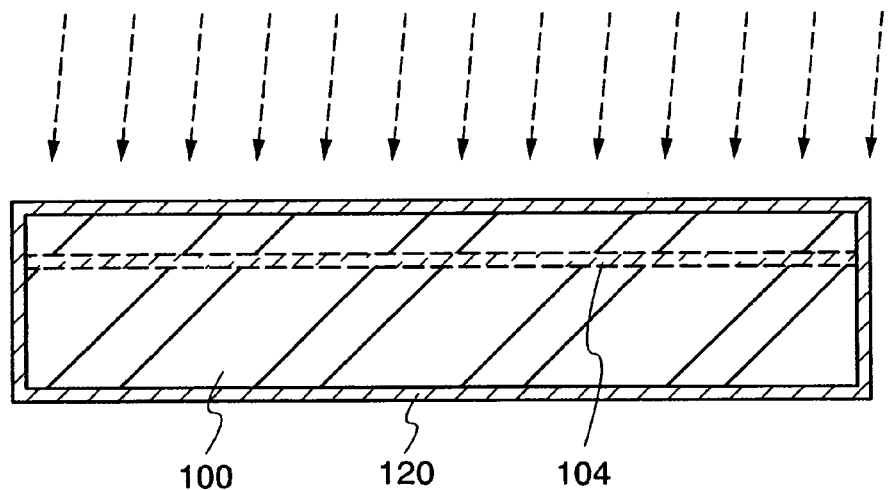

FIG. 24B shows a step of forming a fragile layer 104 by addition of ion species such as hydrogen or halogen similar to the above embodiment modes. The addition of the ion species can be carried out from an oblique direction to the first bond wafer 100. Note that a heavy metal enters the first bond wafer 100 in the step of forming the fragile layer 104 by doping of ions which are not mass-separated.

Figure 25:
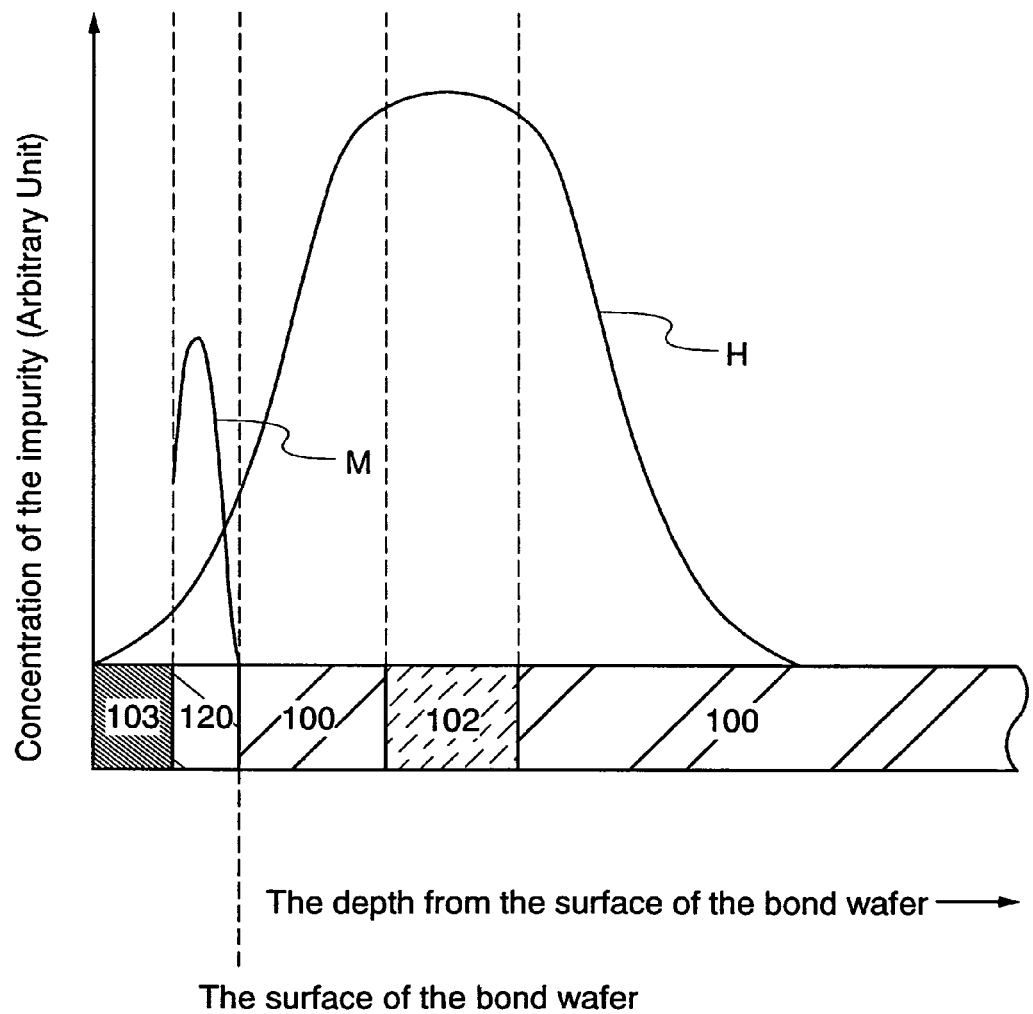
FIG. 25 shows an impurity concentration of a semiconductor element substrate according to Embodiment Mode 5.

FIG. 25 shows a curve H of distribution of hydrogen or halogen ions added to the first bond wafer 100. The hydrogen or halogen ions added to the first bond wafer 100 has a Gaussian distribution. In the case of adding ions to a bond wafer by accelerating the ions by electric field, the ions substantially have a Gaussian distribution with a peak of a certain depth, and the fragile layer 104 is shown using the peak position as a guide. The fragile layer 104 is formed in a region at a depth close to the average depth to which ions enter, from the surface of the first bond wafer 100. For example, the fragile layer 104 is preferably formed at a depth in accordance with the thickness of the SOI layer, which is 5 to 500 nm, preferably 10 to 200 nm, and acceleration voltage and dose in adding ions are determined in consideration of the thickness.

Since ions of heavy metals have large mass numbers, many ions of the heavy metals are distributed on the very surface on the ion addition side of the first bond wafer. Since the oxide film 120 is formed on the surface of the first bond wafer 100, when the thickness of the oxide film 120 is formed larger than the addition depth of metal ions, the metals can be distributed in the oxide film 120 (the curve M shown in FIG. 25). By the oxide film 120 including halogen, the heavy metals captured in the oxide film 120 can be fixed by HCl oxidation or the like and contamination of the first bond wafer 100 can be prevented.

Further, by heat treatment conducted after formation of the oxide film 120, another metal as an impurity included in the first bond wafer 100 is separated out to the oxide film 120, reacted with halogen (e.g., chlorine), and captured. Thus, the impurity captured in the oxide film 120 can be fixed and contamination of the first bond wafer 100 can be prevented.

In this manner, since the oxide film 120 of this embodiment mode does not allow the captured heavy metals and impurity to be diffused again, high performance of the MISFET can be achieved.

Note that the fragile layer 104 can be formed similarly even when ion species are mass-separated and then added to the first bond wafer 100. In this case also, by selective addition of ions having large mass (e.g., $H_3^+$ ions), a similar effect to the above-described gettering effect can be obtained.

Figure 24C:
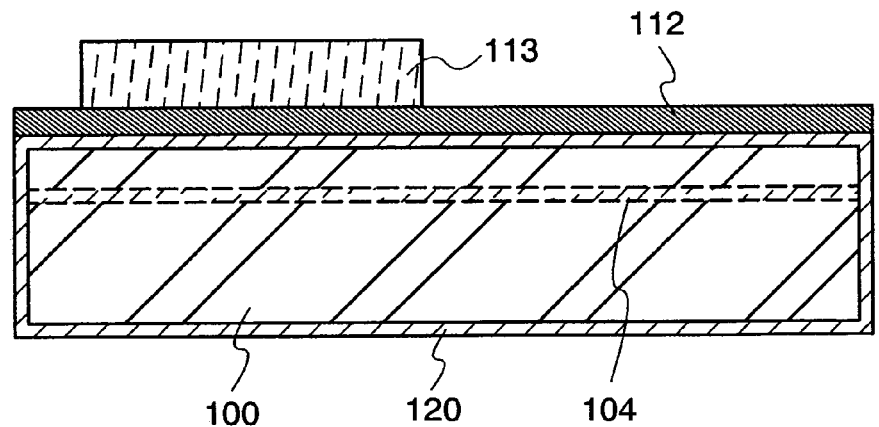

As shown in FIG. 24C, a bonding layer 112 is formed similarly to the above embodiment modes, and the first bond wafer 100 above the fragile layer 104, and the bonding layer 112 are etched using a mask 113. Since the process after this is similar to the above embodiment modes, description thereof is omitted.

Figure 26A:
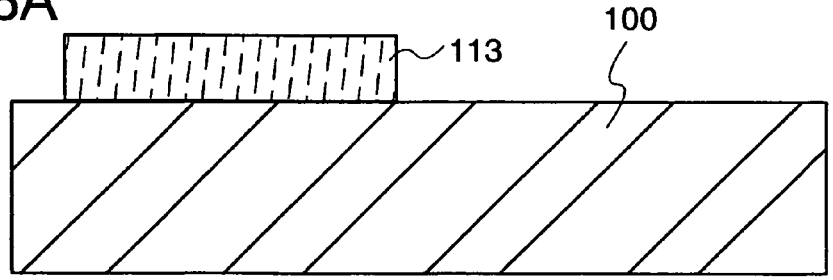
FIGS. 26A to 26D show a manufacturing method of a semiconductor element substrate according to Embodiment Mode 5.
Figure 26B:
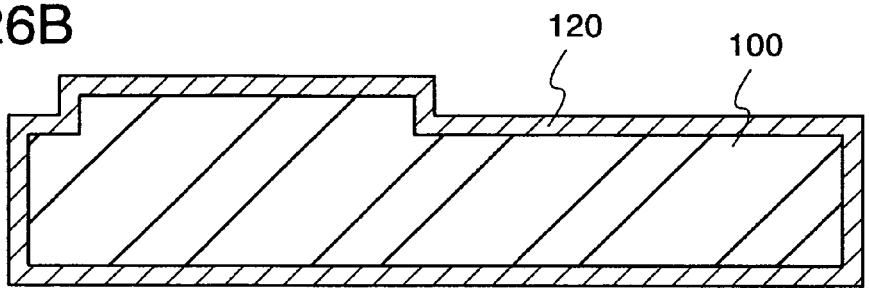
Figure 26C:
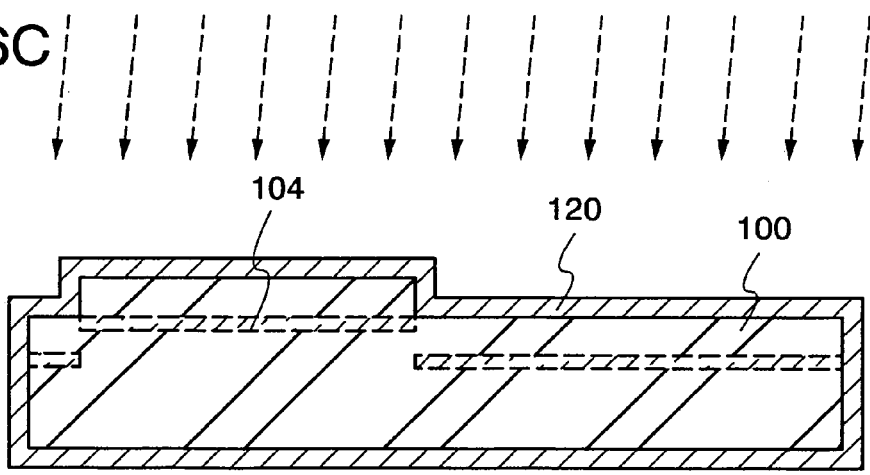
Figure 26D:
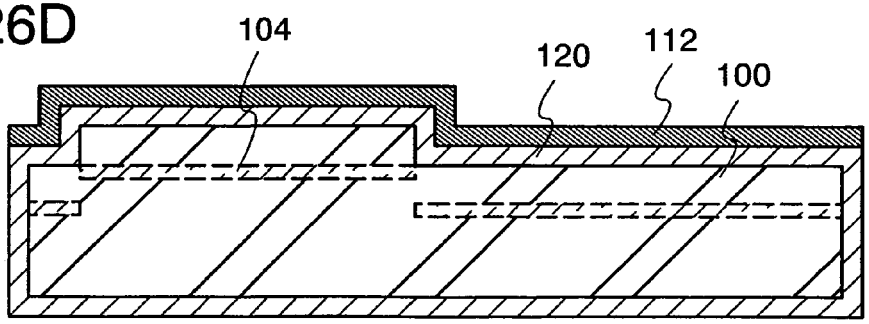

Until now, the process in which selective etching is carried out after formation of a fragile layer in a bond wafer has been described; however, a process in which a fragile layer is formed after selective etching of a bond wafer can also be employed. As shown in FIG. 26A, a first bond wafer 100 is etched using a mask 113. Then, as shown in FIG. 26B, an oxide film 120 is formed on the etched first bond wafer 100. Formation of the oxide film 120 can be performed in the above-described way. As shown in FIG. 26C, a fragile layer 104 is formed, and a bonding layer 112 is formed as shown in FIG. 26D. Since the process after this can be carried out similarly to the above embodiment modes, description thereof is omitted.

In this manner, an oxide film may be formed on a bond wafer. Accordingly, heavy metals, an impurity, and the like which enter a bond wafer in formation of a fragile layer can be gettered, and contamination of the bond wafer can be reduced.

Embodiment Mode 6

In the case of bonding SOI layers whose crystal faces are different to a base substrate, a more preferred mode is that crystal axes in channel length directions are directed in specific directions. Carrier mobility of electrons or holes flowing through a channel formation region of a MISFET can be increased by matching anisotropy of a crystal axis of a crystal face of an SOI layer with anisotropy of a crystal axis in a carrier flow direction of the SOI layer. This is because effective mass of carriers has anisotropy in crystals.

Figure 5A:
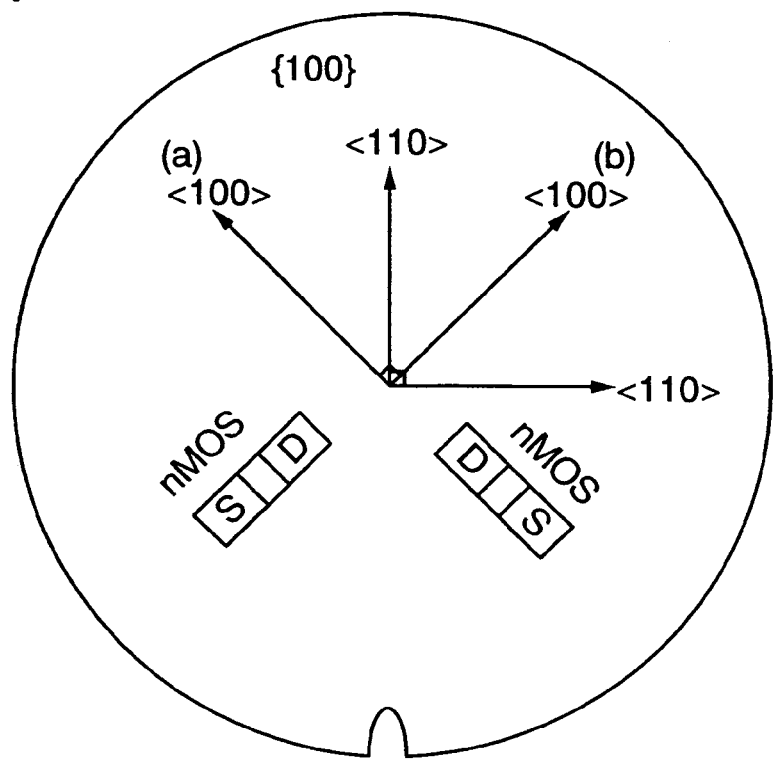
FIGS. 5A and 5B show a mode of bonding single-crystalline semiconductor layers from bond substrates to a base substrate in Embodiment Mode 6.

As shown in FIG. 5A, in the case of taking an SOI layer for an n-channel MISFET from a bond wafer whose crystal face is {100}, it is preferable that a channel length direction of the SOI layer be parallel to a <100> direction. Note that the direction parallel to the <100> direction is not only the direction indicated by (a) but also the direction indicated by (b), and the SOI layer may be taken so that a channel length direction is parallel to either of the directions.

Figure 5B:
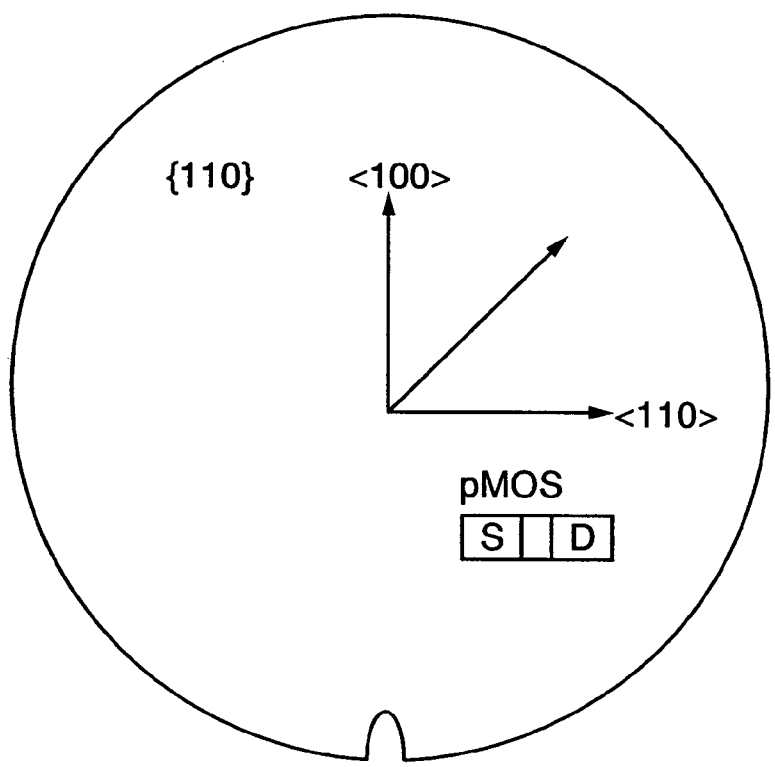

On the other hand, in order to form an SOI layer for a p-channel MISFET, as shown in FIG. 5B, it is preferable that a bond wafer whose crystal face is {110} be used and a channel length direction of the SOI layer be parallel to a <110> direction. When the <100> direction is set for the n-channel MISFET and the <110> direction is set for the p-channel MISFET in this manner, mobility of electrons and holes flowing through channel formation regions can be increased.

Embodiment Mode 7

Figure 6:
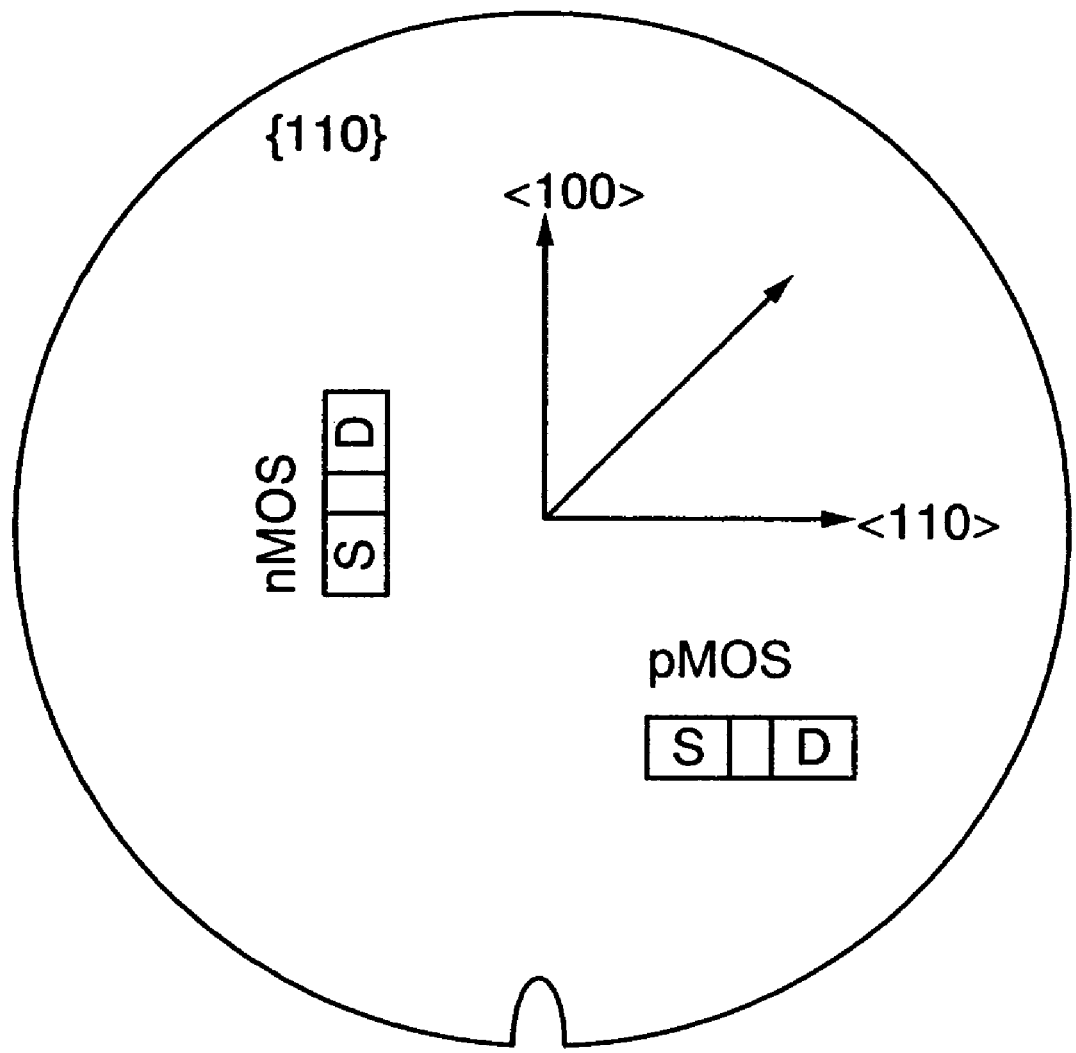
FIG. 6 shows a mode of bonding single-crystalline semiconductor layers from a bond substrate to a base substrate in Embodiment Mode 7.

Embodiment Mode 7 will describe a structure in which SOI layers appropriate for an n-channel MISFET and a p-channel MISFET are taken from a bond wafer whose crystal faces are the same. FIG. 6 shows the case of using a bond wafer whose crystal face is {110}. In this case, the SOI layer for the n-channel MISFET is taken so that a channel length direction is parallel to a <100> direction. On the contrary, the SOI layer for the p-channel MISFET is taken so that a channel length direction is parallel to a <110> direction.

According to this embodiment mode, a semiconductor integrated circuit can be provided, in which a first SOI layer formed in an n-channel MISFET and a second SOI layer formed in a p-channel MISFET, which are over an insulating substrate, have the same crystal face and different directions of crystal axes in channel length directions. When the <100> direction is set for the n-channel MISFET and the <110> direction is set for the p-channel MISFET in this manner, field effect mobility of electrons and holes flowing through channel formation regions can be further increased. In addition, the SOI layer of the n-channel MISFET and the SOI layer of the p-channel MISFET can be individually bonded to a base substrate. Therefore, compared to the case in which layout is conducted so that directions of crystal axes are different from each other on a substrate having the same crystal face, freedom of design in circuit layout of the n-channel MISFET and the p-channel MISFET is ensured; accordingly, integration of a semiconductor integrated circuit can be increased. Since a crystal face or a crystal axis with which high field effect mobility can be obtained can be selected for each of an n-channel MISFET and a p-channel MISFET, using such a base substrate can realize high performance of a semiconductor integrated circuit.

Moreover, in a semiconductor display device of the present invention in which a semiconductor integrated circuit is transferred to an insulating substrate having a light-transmitting property, since a MISFET with high mobility is transferred, high speed operation can be achieved, and in addition, low voltage driving is enabled, so that low power consumption can be realized.

Embodiment Mode 8

Embodiment Mode 8 will describe a manufacturing process of an inverter circuit using a base substrate according to the present invention. Note that the present invention is not limited to such a simple circuit, and various semiconductor devices such as a microprocessor can be realized. In FIGS. 7A to 13B, the figures A are plane views of an inverter circuit, and the figures B are cross-sectional views corresponding to a line A-B.

Figure 7A:
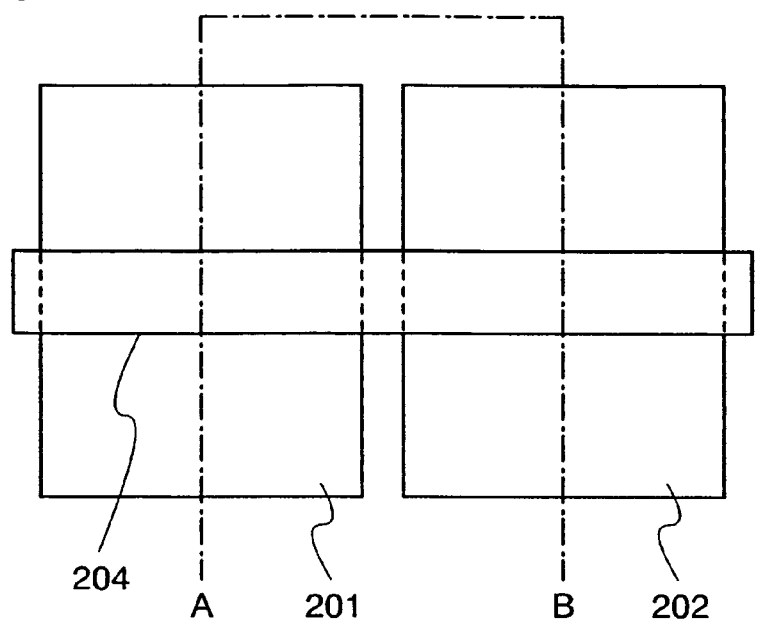
FIGS. 7A and 7B show a manufacturing step of a semiconductor device according to Embodiment Mode 8.
Figure 7B:
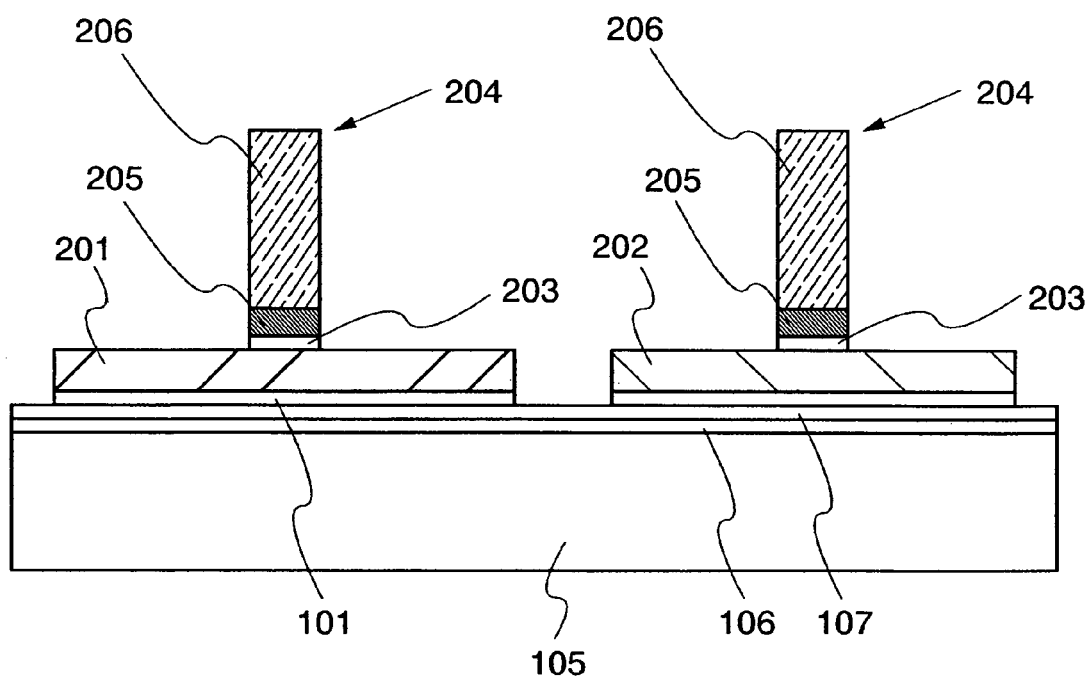

FIGS. 7A and 7B show a step of forming gate insulating layers and gate electrode over a base substrate 105 which is provided with a first SOI layer 201 and a second SOI layer 202. Gate electrodes 204 are provided over the first SOI layer 201 and the second SOI layer 202. As gate insulating layers 203, a material such as silicon oxide ($SiO_x$), silicon oxynitride ($SiO_xN_y$), hafnium oxide ($HfO_x$), aluminum oxide ($Al_xO_y$, x>y>0), tantalum oxide ($Ta_xO_y$, x>y>0) can be used. In FIG. 7B, processing is conducted so that side end portions of the gate insulating layers 203 and the gate electrodes 204 are aligned; however, in etching the gate electrodes 204, processing may be conducted so that the gate insulating layers 203 remain.

In this embodiment mode, the first SOI layer 201 corresponds to a p-channel MISFET and the second SOI layer 202 corresponds to an n-channel MISFET.

In the case of using a high dielectric material (high-k material) for the gate insulating layers 203, the gate electrodes 204 are formed using polycrystalline silicon, silicide, metal, or metal nitride. Preferably, the gate electrodes 204 are formed using metal or metal nitride. For example, first gate electrode layers 205 in contact with the gate insulating layers 203 are formed using a metal nitride material, and second gate electrode layers 206 thereover are formed using a metal material. This combination can prevent spread of a depletion layer in the gate electrodes even when the gate insulating layers are thinned and can also prevent reduction in driving performance of transistors even when miniaturization is conducted.

Figure 8A:
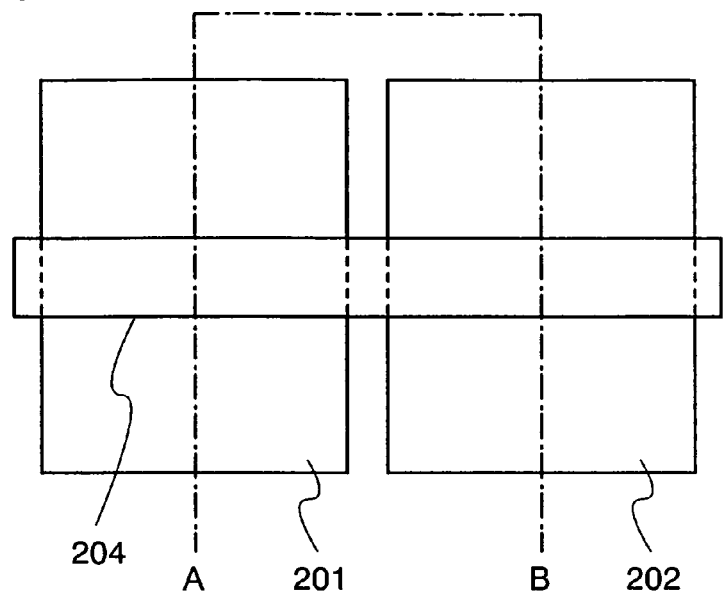
FIGS. 8A and 8B show a manufacturing step of a semiconductor device according to Embodiment Mode 8.
Figure 8B:
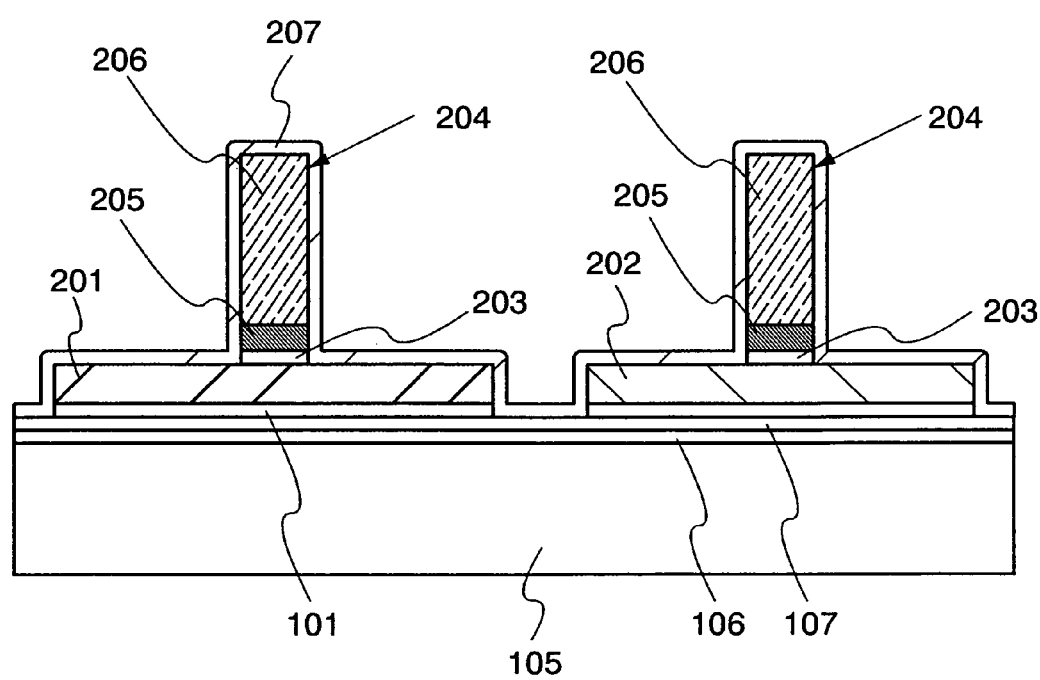

In FIGS. 8A and 8B, a first insulating layer 207 is formed over the gate electrode layers 204. The first insulating layer 207 is formed using a silicon oxide film or a silicon oxynitride film. As another mode, the gate electrodes 204 may be insulated by oxidation or nitridation treatment to form a similar layer. The first insulating layer 207 is formed with a thickness of 1 to 10 nm also on side surfaces of the gate electrodes 204. The first insulating layer 207 is formed in order to form an offset region, to which an impurity for valence electron control is not added, in the first SOI layer 201 and the second SOI layer 202 in a later process.

Figure 9A:
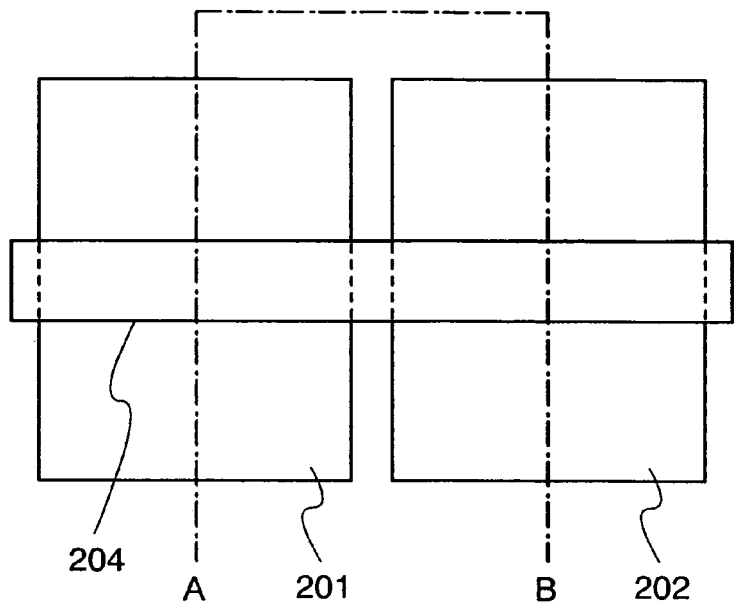
FIGS. 9A and 9B show a manufacturing step of a semiconductor device according to Embodiment Mode 8.
Figure 9B:
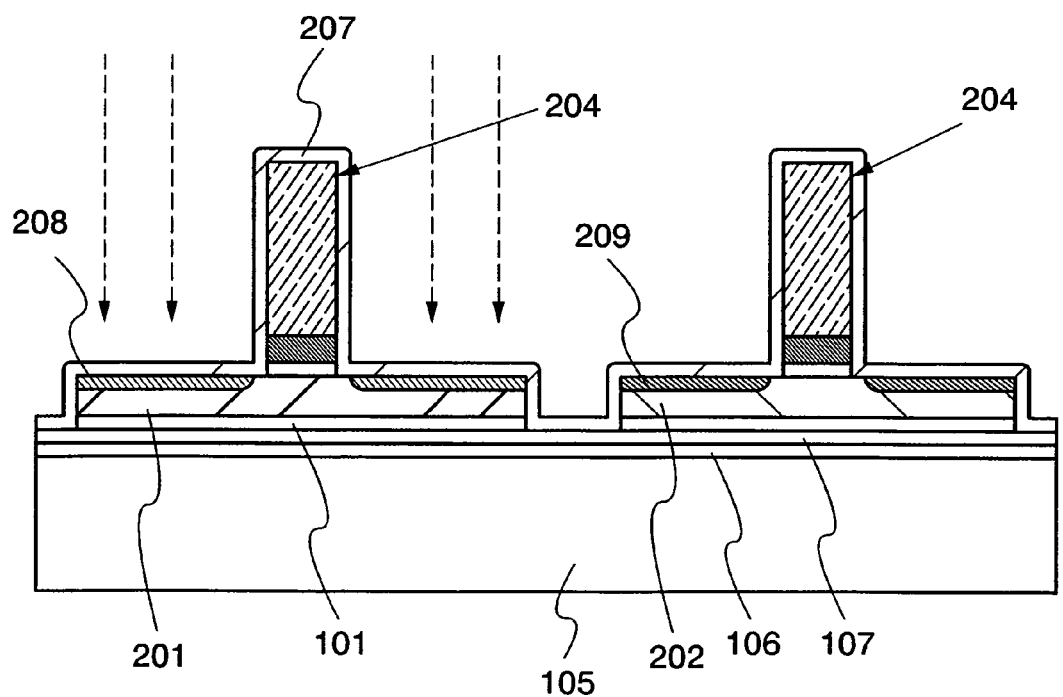

FIGS. 9A and 9B show a step of forming ultrashallow junctions (source/drain extensions) in the first SOI layer 201 and the second SOI layer 202. These ultrashallow junctions are preferably provided to suppress a short channel effect. To the first SOI layer 201 for a p-channel MISFET, a Group 15 element is added to form first ultrashallow junctions 208. To the second SOI layer 202 for an n-channel MISFET, a Group 13 element is added to form second ultrashallow junctions 209. The impurity concentration of these ultrashallow junctions are set to have the number of digits which is larger than that of a low concentration drain by one. For example, the first ultrashallow junctions 208 are formed by ion implantation of boron at 15 keV with a dose of $3 \times 10^{13}/cm^2$. The second ultrashallow junctions 209 are formed by ion implantation of arsenic at 15 keV with a dose of $2 \times 10^{14}/cm^2$.

Figure 10A:
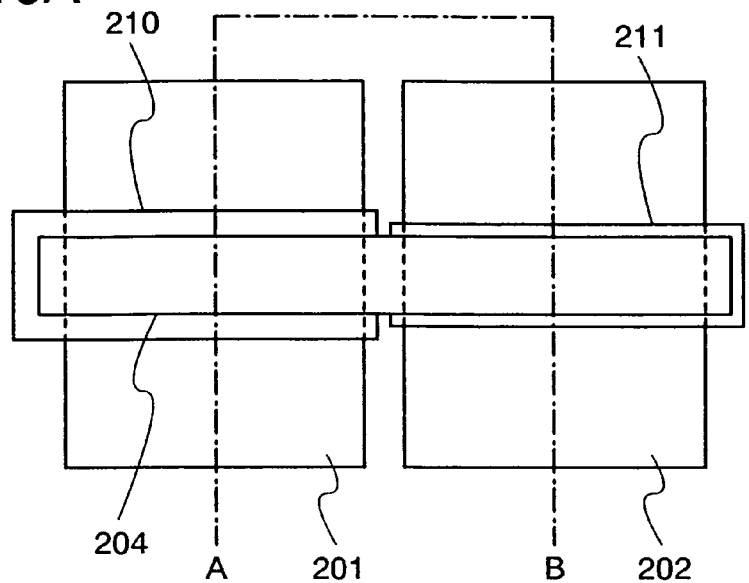
FIGS. 10A and 10B show a manufacturing step of a semiconductor device according to Embodiment Mode 8.
Figure 10B:
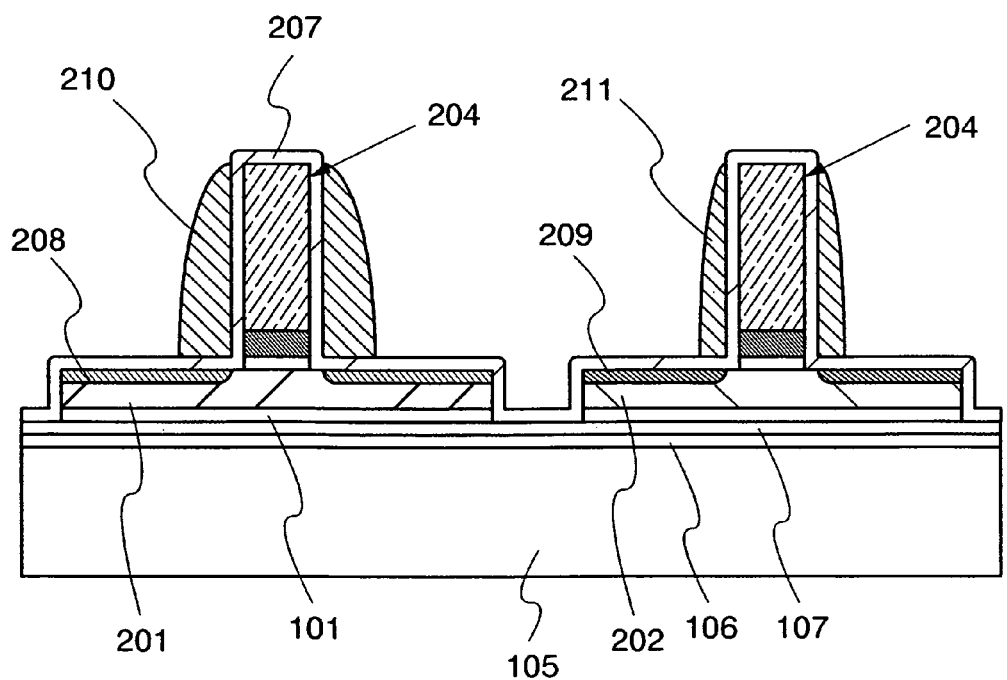

Next, as shown in FIGS. 10A and 10B, first sidewalls 210 and second sidewalls 211 are formed on the side surfaces of the gate electrodes 204. For example, the first sidewalls 210 and the second sidewalls 211 are formed using a silicon nitride film. These sidewalls are formed in a self-alignment manner by anisotropic etching.

In this case, the first sidewalls 210 on the first SOI layer 201 side and the second sidewalls 211 on the second SOI layer 202 side may be processed to have the same width, but are preferably processed to have different widths. The widths of the first sidewalls 210 on the side of the first SOI layer 201 for the p-channel MISFET are preferably thicker than the widths of the second sidewalls 211 on the side of the second SOI layer 202 for the n-channel MISFET. This is because boron implanted to form a source region and a drain region in the p-channel MISFET is likely to diffuse and tends to induce a short channel effect. This structure allows boron to be added to the source region and the drain region at a high concentration and can rather decrease resistance of the source region and the drain region in the p-channel MISFET.

Figure 11A:
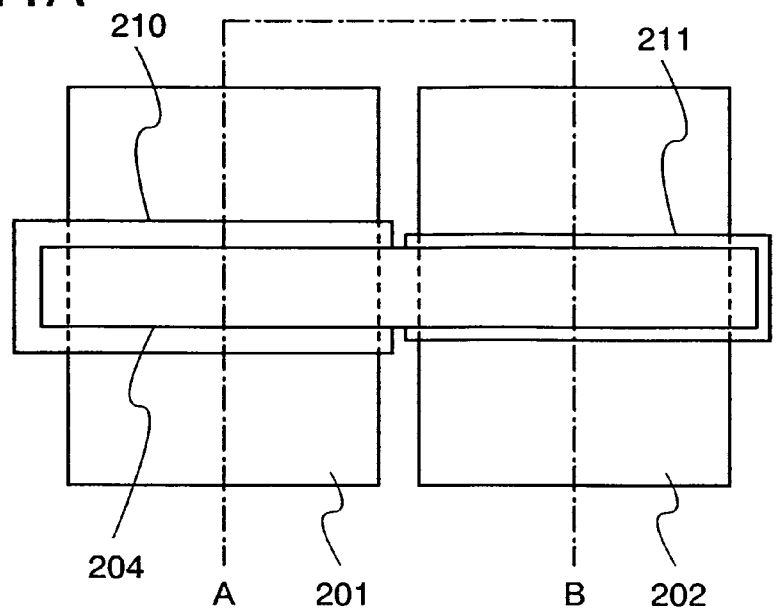
FIGS. 11A and 11B show a manufacturing step of a semiconductor device according to Embodiment Mode 8.
Figure 11B:
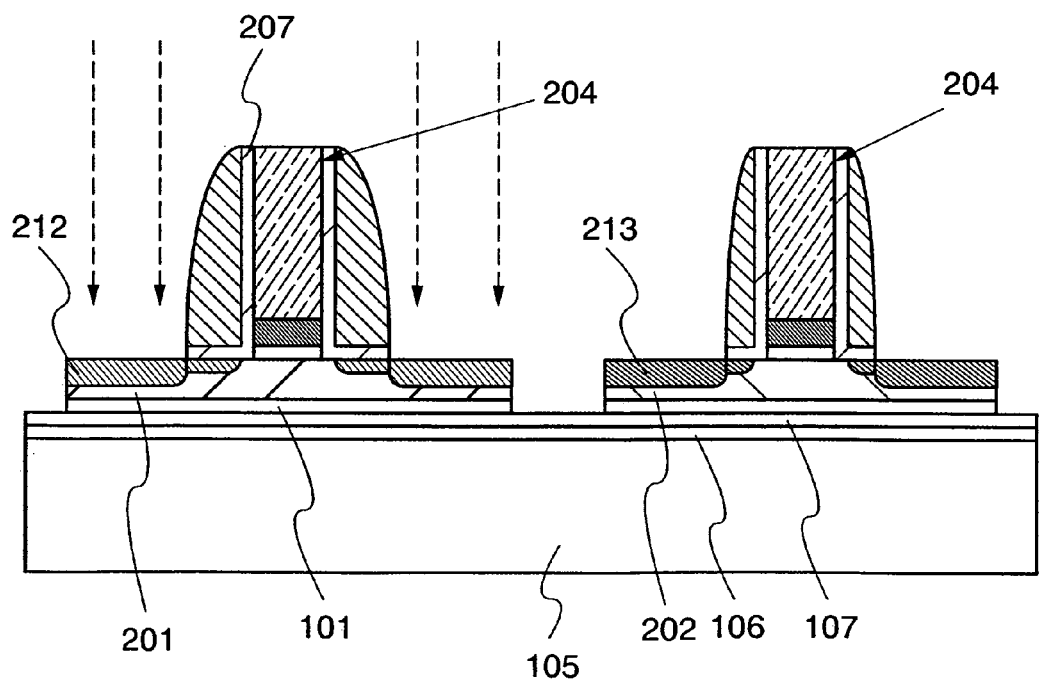

After forming the sidewalls, exposed parts of the first insulating layer 207 are etched as shown in FIGS. 11A and 11B, and a source region and a drain region are formed in a self-alignment manner. This step can be conducted by an ion implantation method in which impurity ions for valence electron control are accelerated by electric field and implanted. A Group 13 element is added to the first SOI layer 201 to form first impurity regions 212 to be a source region and a drain region. A Group 15 element is added to the second SOI layer 202 to form second impurity regions 213 to be a source region and a drain region. For example, boron ions are implanted to the first SOI layer 201 for the p-channel MISFET at 30 keV with a dose of $3 \times 10^{15}/cm^2$. Arsenic ions are implanted to the second SOI layer 202 for the n-channel MISFET at 50 keV with a dose of $5 \times 10^{15}/cm^2$. The doping conditions such as ion species, the acceleration voltage, and dose may be appropriately set.

In order to further decrease resistance of the source region and the drain region, a silicide layer may be formed. As the silicide layer, cobalt silicide or nickel silicide may be employed. When the SOI layer is thin, silicide reaction may be made to proceed to the bottom part of the SOI layer in that region, so that silicide may be formed in the entire region.

Figure 12A:
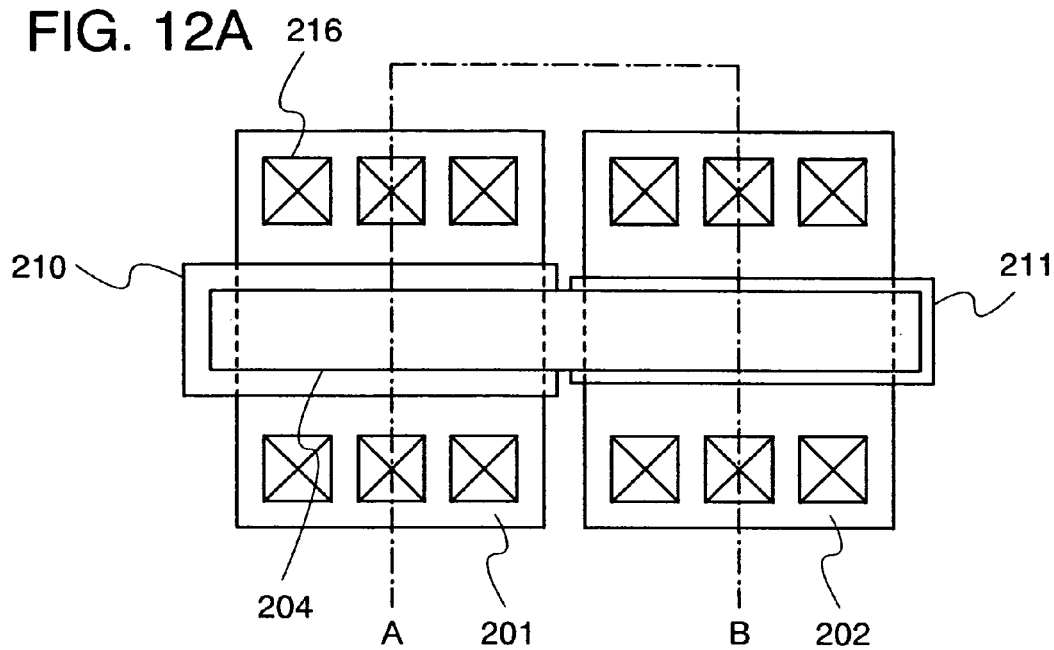
FIGS. 12A and 12B show a manufacturing step of a semiconductor device according to Embodiment Mode 8.
Figure 12B:
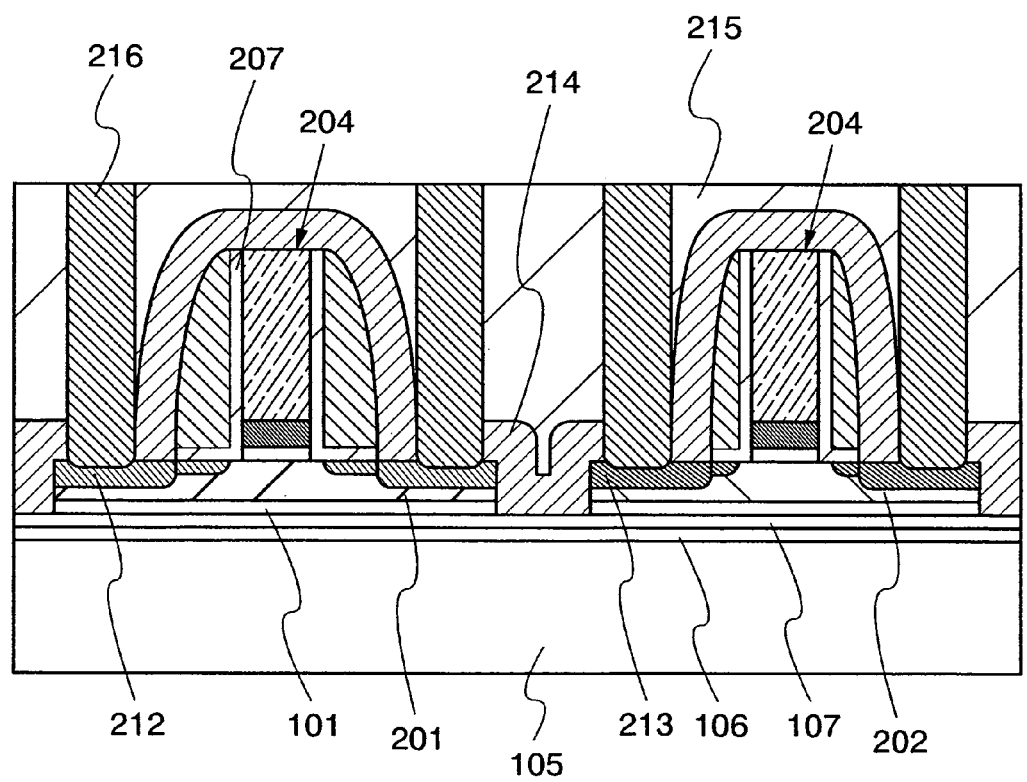

FIGS. 12A and 12B show a step of forming a passivation layer 214, a first interlayer insulating layer 215, and contact plugs 216. The passivation layer 214 is formed over an entire surface by a CVD method using a silicon nitride film, a silicon nitride oxide film, or the like. The first interlayer insulating layer 215 is formed by formation of phosphosilicate glass (PSG) or borophosphosilicate glass (BPSG) by a CVD method and planarization by reflow. Alternatively, a silicon oxide film may be formed using tetraethoxysilane (tetra-ethyl-ortho-silicate, $Si(OCH_2CH_3)_4$) by a CVD method and then be planarized by CMP. The contact plugs 216 are formed of tungsten silicide so as to fill contact holes which are formed in the first interlayer insulating layer 215. Tungsten silicide is formed by a CVD method using tungsten hexafluoride ($WF_6$) and silane ($SiH_4$).

Figure 13A:
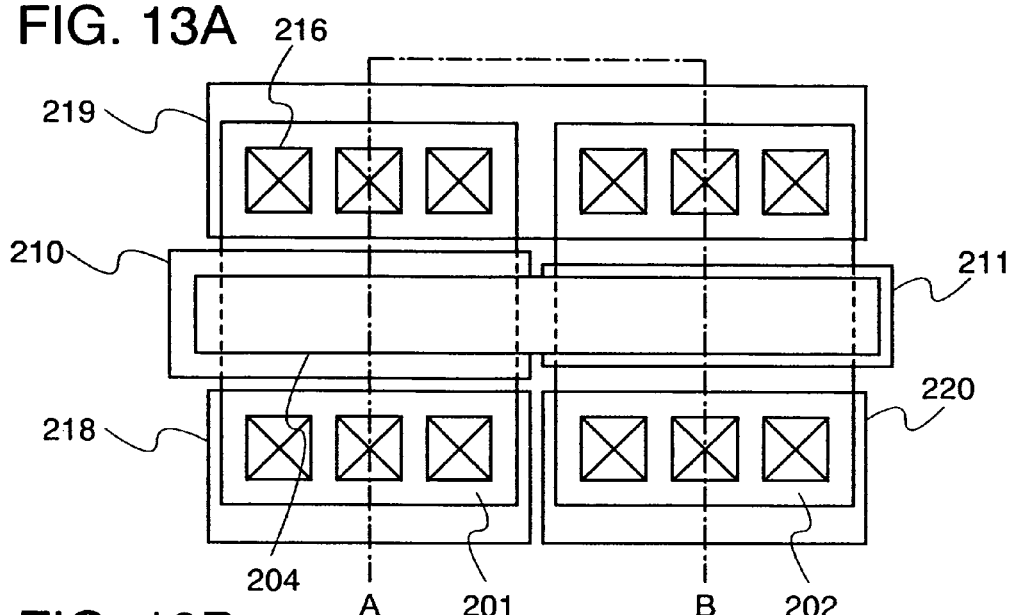
FIGS. 13A and 13B show a manufacturing step of a semiconductor device according to Embodiment Mode 8.
Figure 13B:
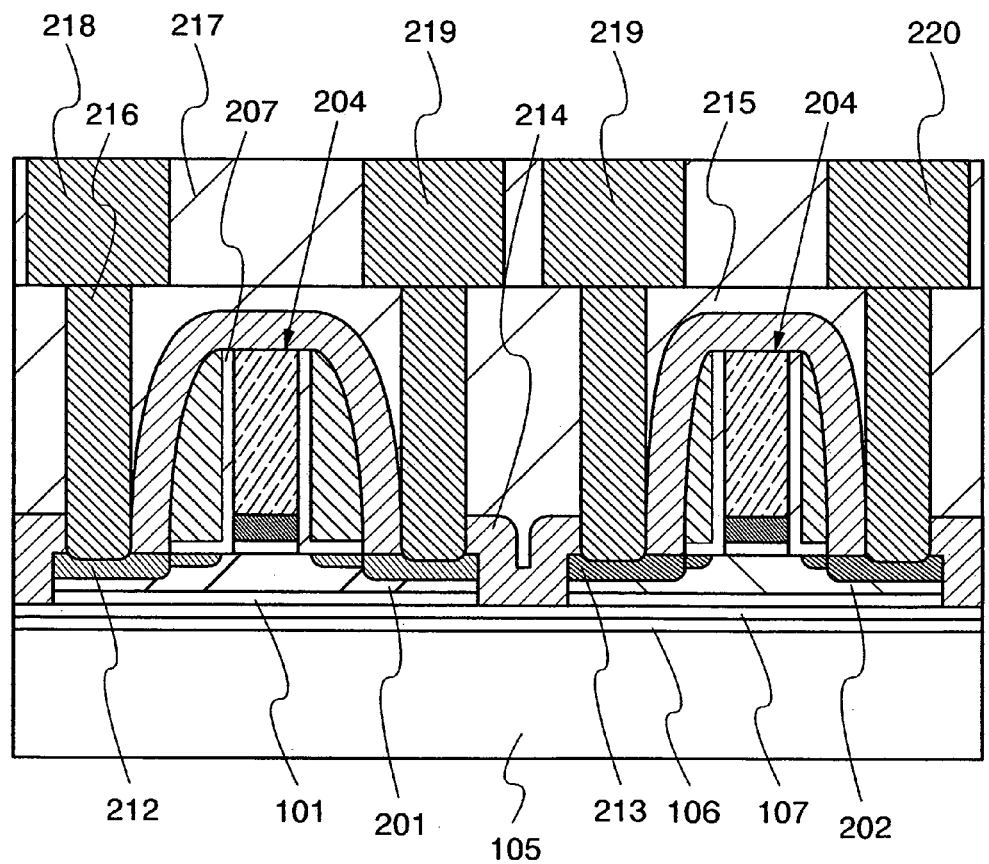

A multilayer structure of a wiring is considered depending on the structure of the semiconductor device. FIGS. 13A and 13B show a structure in which a second interlayer insulating layer 217, a first wiring 218, a second wiring 219, and a third wiring 220 are provided over the first interlayer insulating layer 215. These wirings may be formed using tungsten silicide or may be formed using Cu wirings by a damascene method.

Embodiment Mode 9

Embodiment Mode 9 will describe an inverter circuit as a device including a semiconductor element (a semiconductor device), which is formed through a transferring step according to the present invention. Note that the present invention is not limited to such a simple circuit, and various semiconductor devices such as a microprocessor can be realized. In FIGS. 27A to 33B, the figures A are top views of the inverter circuit, and the figures B are cross-sectional views corresponding to a line A-B.

Figure 27A:
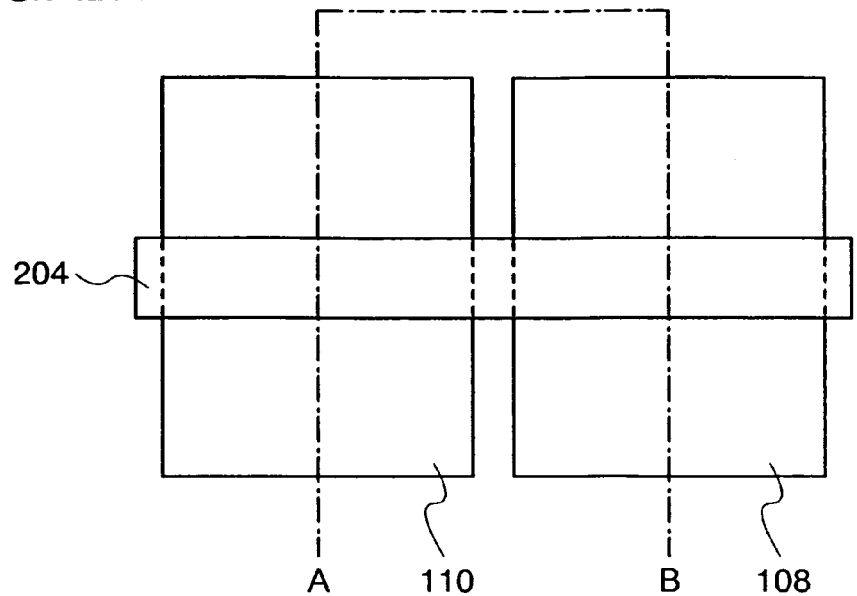
FIGS. 27A and 27B show a manufacturing step of a semiconductor device according to Embodiment Mode 9.
Figure 27B:
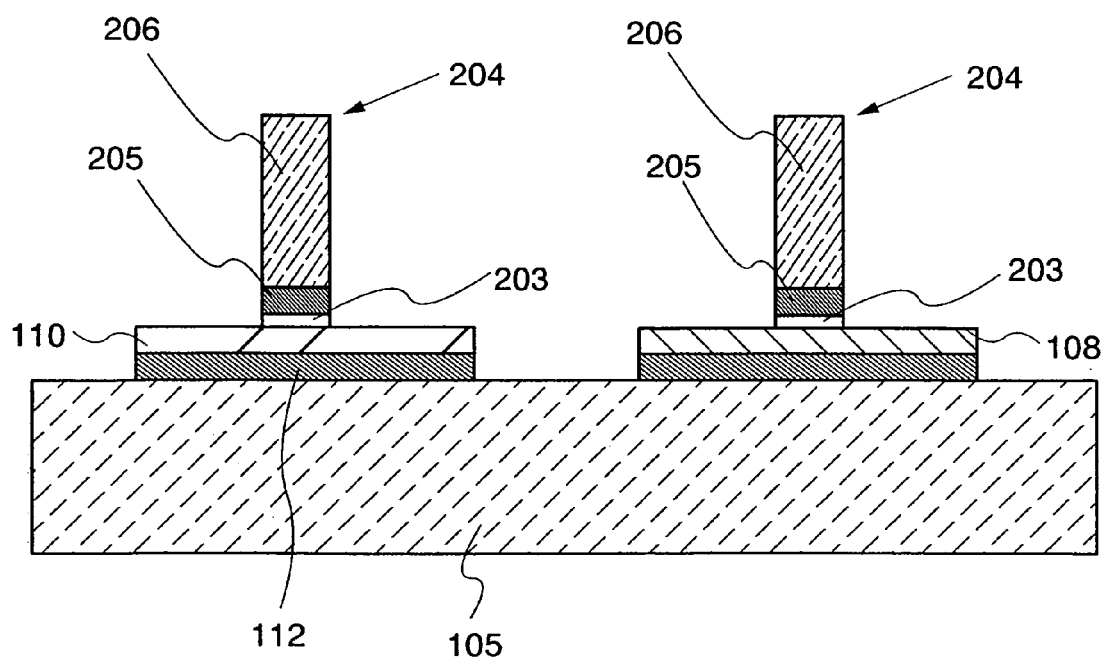

FIGS. 27A and 27B show a step of forming gate insulating layers and gate electrodes over an insulating substrate 105 which is provided with a bonding layer 112, a first SOI layer 108, and a second SOI layer 110. In FIG. 27A, the first SOI layer 108 and the second SOI layer 110 are bonded so as to be parallel to each other; however, they may be perpendicular to each other or may be slightly out of parallel. For example, crystal faces or crystal axes of the SOI layers are different from each other in some cases, and by bonding the SOI layers in the state that the SOI layers are slightly out of parallel, the difference can be reduced. Since an SOI layer having a crystal face {110} is easily affected by the difference, the second SOI layer 110 may be bonded so as to be slightly out of parallel.

To make the thicknesses of the first SOI layer 108 and the second SOI layer 110 equal, planarization treatment is subjected thereto. Over the first SOI layer 108 and the second SOI layer 110, gate electrodes 204 are provided with gate insulating layers 203 interposed therebetween. For the gate insulating layers 203, a material such as silicon oxide ($SiO_x$), silicon oxynitride ($SiO_xN_y$), hafnium oxide ($HfO_x$), aluminum oxide ($Al_xO_y$) (x>y>0), or tantalum oxide ($Ta_xO_y$, x>y>0) can be employed. In FIG. 27B, processing is conducted so that side end portions of the gate insulating layers 203 and the gate electrodes 204 are aligned; however, in etching the gate electrodes 204, processing may be conducted so that the gate insulating layers 203 remain. For example, processing may be conducted so that the gate insulating layers 203 have a taper shape.

The gate electrodes 204 may have a single layer structure or a stacked structure. In this embodiment mode, the case of a stacked structure of first gate electrode layers 205 and second gate electrode layers 206 is described. In the case of using a high dielectric material (high-k material) for the gate insulating layers 203, the gate electrodes 204 are formed using polycrystalline silicon, silicide, metal, or metal nitride. Preferably, the gate electrodes 204 are formed using metal or metal nitride. In consideration of that the gate electrode layer has a stacked structure, the first gate electrode layers 205 in contact with the gate insulating layers 203 can be formed using a metal nitride material, and the second gate electrode layers 206 can be formed using a metal material. This combination can prevent spread of a depletion layer in the gate electrodes even when the gate insulating layers are thinned and can also prevent reduction in driving performance of transistors even when miniaturization is conducted.

Figure 28A:
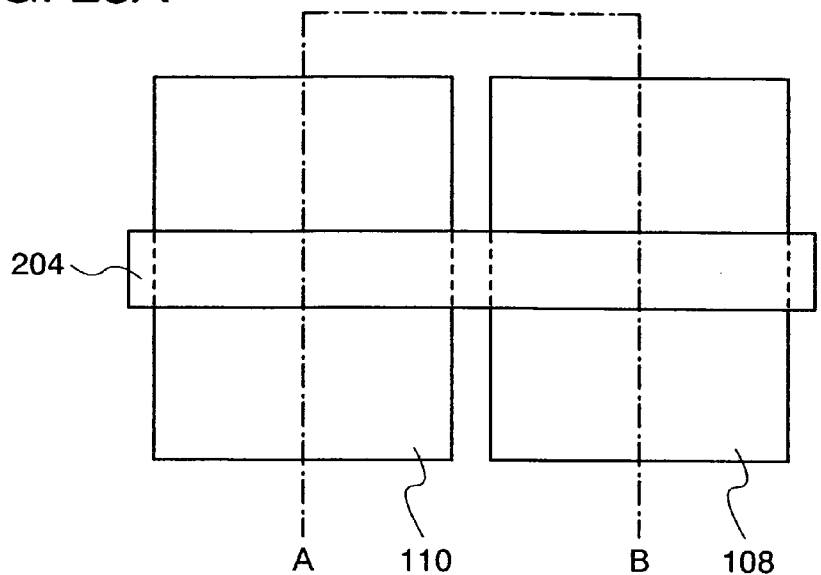
FIGS. 28A and 28B show a manufacturing step of a semiconductor device according to Embodiment Mode 9.
Figure 28B:
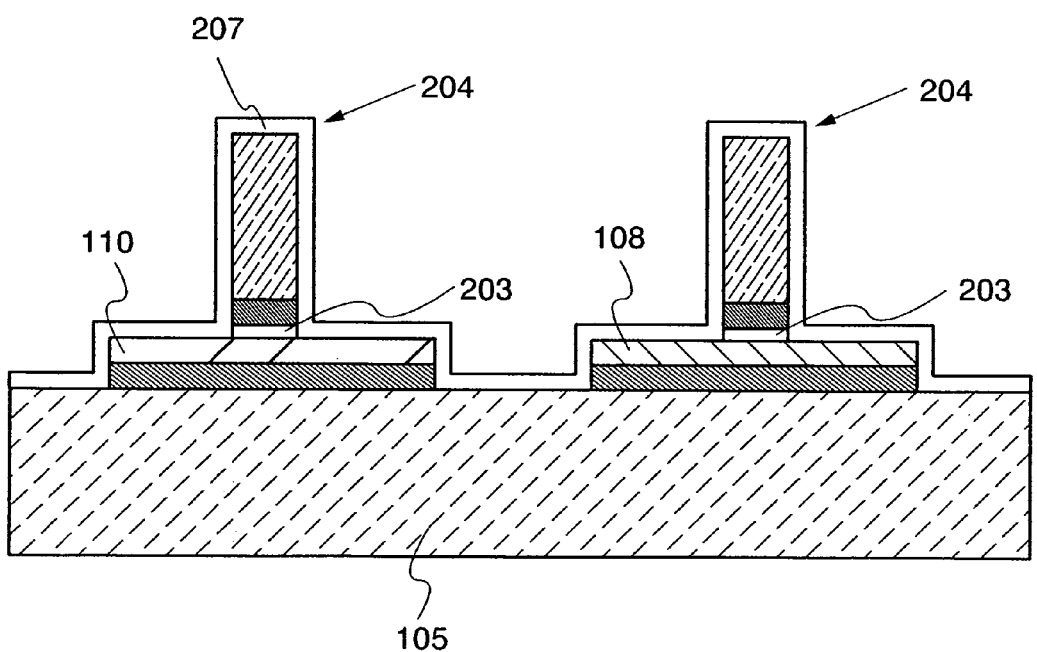

FIGS. 28A and 28B show a step of forming a first insulating layer 207 over the gate electrode layers 204. The first insulating layer 207 serves as a gate insulating layer. The first insulating layer 207 is formed using a silicon oxide film or a silicon oxynitride film by a CVD method or a sputtering method. As another mode, the gate electrodes 204 may be insulated by oxidation or nitridation treatment to form a similar layer. The first insulating layer 207 is formed with a thickness of 1 to 10 nm also on side surfaces of the gate electrodes 204. The first insulating layer 207 is formed in order to form an offset region as well, to which an impurity for valence electron control is not added, in the first SOI layer 108 and the second SOI layer 110 in a later process.

Figure 29A:
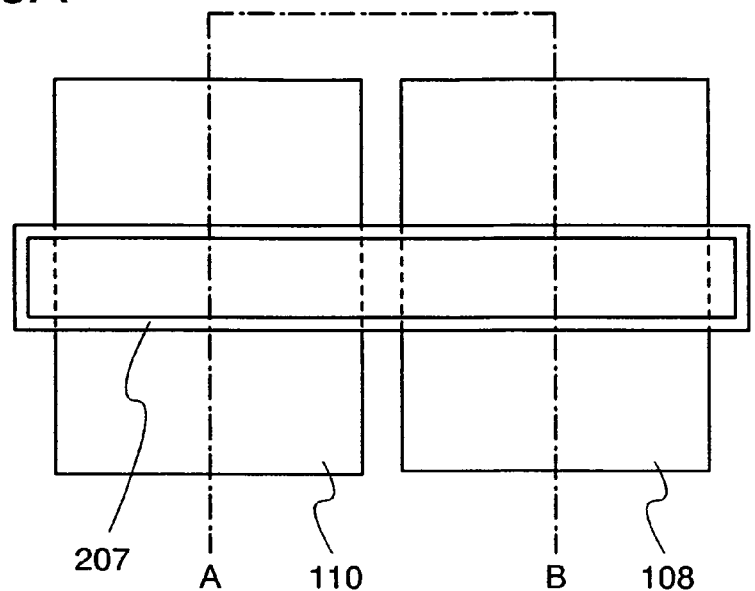
FIGS. 29A and 29B show a manufacturing step of a semiconductor device according to Embodiment Mode 9.
Figure 29B:
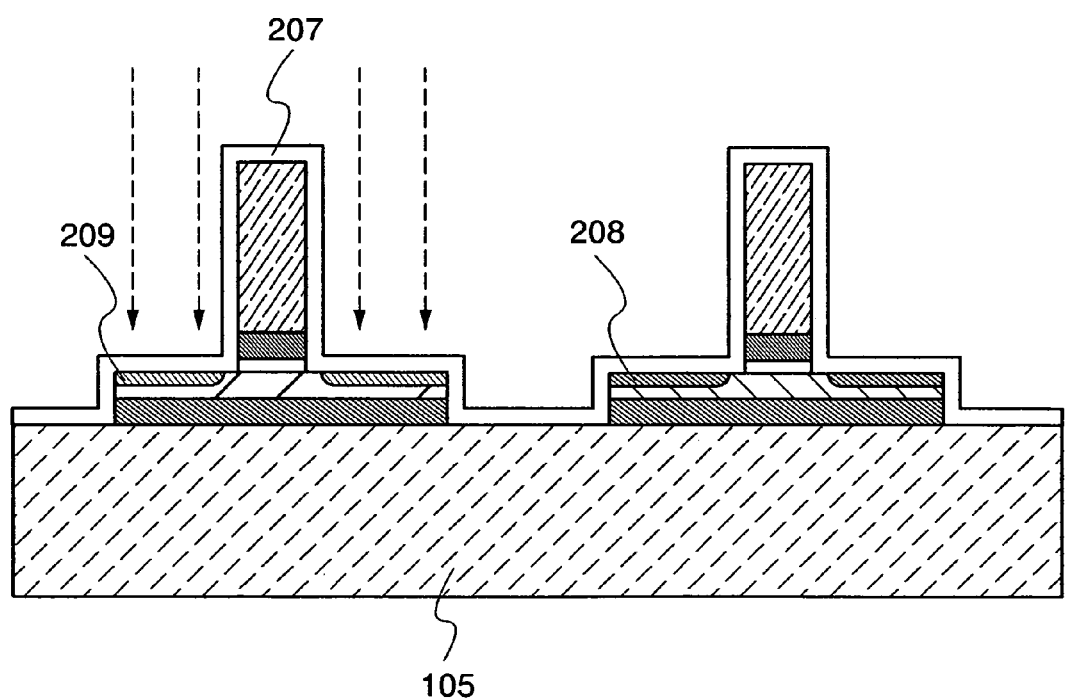

FIGS. 29A and 29B show a step of forming ultrashallow impurity regions (source/drain extensions) in the first SOI layer 108 and the second SOI layer 110. By these ultrashallow impurity regions, a short channel effect can be suppressed. A step of forming first ultrashallow junctions (first ultrashallow impurity regions) 208 by adding a Group 15 element to the first SOI layer 108 for an n-channel MISFET, and a step of forming second ultrashallow junctions (second ultrashallow impurity regions) 209 by adding a Group 13 element to the second SOI layer 110 for a p-channel MISFET are included. In FIG. 29A, to make the ultrashallow junctions 208 and 209 be shown understandably, the first insulating layer 207 is shown only at a periphery of the gate electrodes 204. Although the ultrashallow junctions 208 and 209 are shown outside the gate insulating layer by dotted lines, the first insulating layer 207 covers the whole of the first SOI layer 108, the second SOI layer 110, and the gate electrodes 204. The impurity concentration of these ultrashallow junctions are, for example, set in the following way: the first ultrashallow junctions 208 are formed by ion implantation of arsenic at 15 keV with a dose of $2\times10^{14}/cm^2$ and the second ultrashallow junctions 209 are formed by ion implantation of boron at 15 keV with a dose of $3\times10^{13}/cm^2$.

Figure 30A:
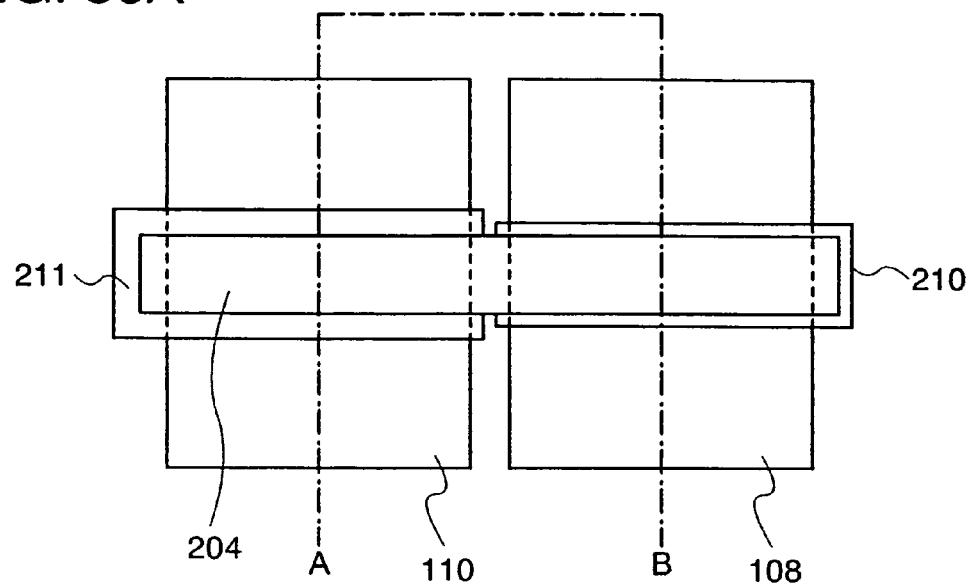
FIGS. 30A and 30B show a manufacturing step of a semiconductor device according to Embodiment Mode 9.
Figure 30B:
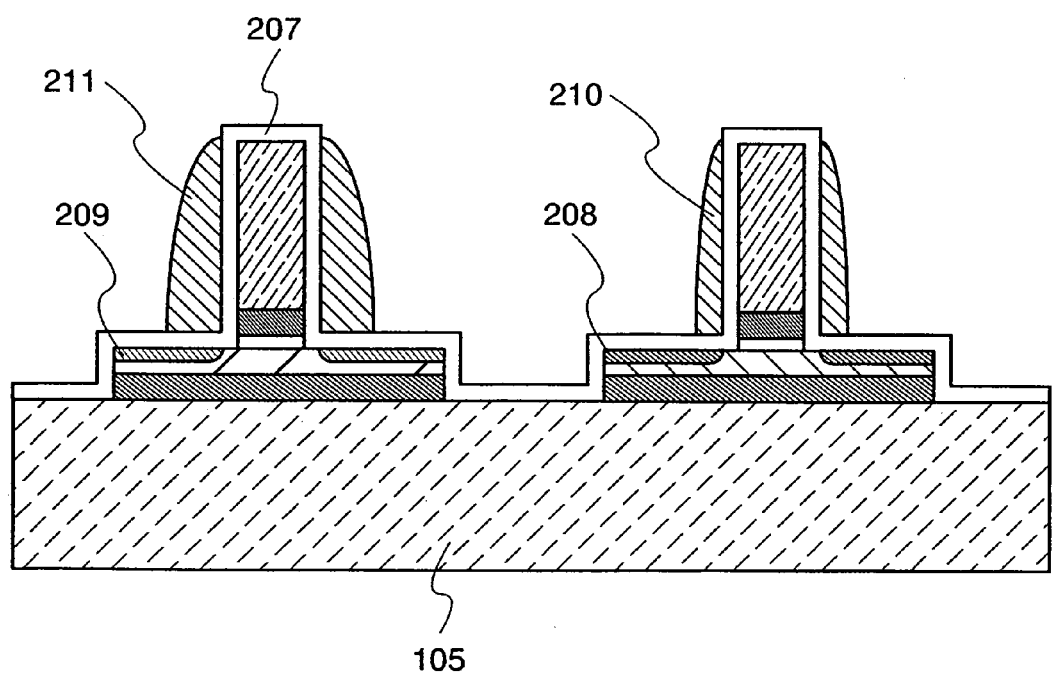

Next, as shown in FIGS. 30A and 30B, first sidewalls 210 and second sidewalls 211 are formed on the side surfaces of the gate electrodes 204. For example, the first sidewalls 210 and the second sidewalls 211 are formed using a silicon nitride film. These sidewalls are formed in a self-alignment manner by anisotropic etching.

In this case, the first sidewalls 210 on the first SOI layer 108 side and the second sidewalls 211 on the second SOI layer 110 side may be processed to have the same width, but are preferably processed to have different widths. The widths of the second sidewalls 211 on the side of the second SOI layer 110 for the p-channel MISFET is preferably thicker than the widths of the first sidewalls 210 on the side of the first SOI layer 108 for the n-channel MISFET. This is because boron implanted to form a source region and a drain region in the p-channel MISFET is likely to diffuse and tends to induce a short channel effect. This structure allows boron to be added to the source region and the drain region at a high concentration and can rather decrease resistance of the source region and the drain region in the p-channel MISFET.

Figure 31A:
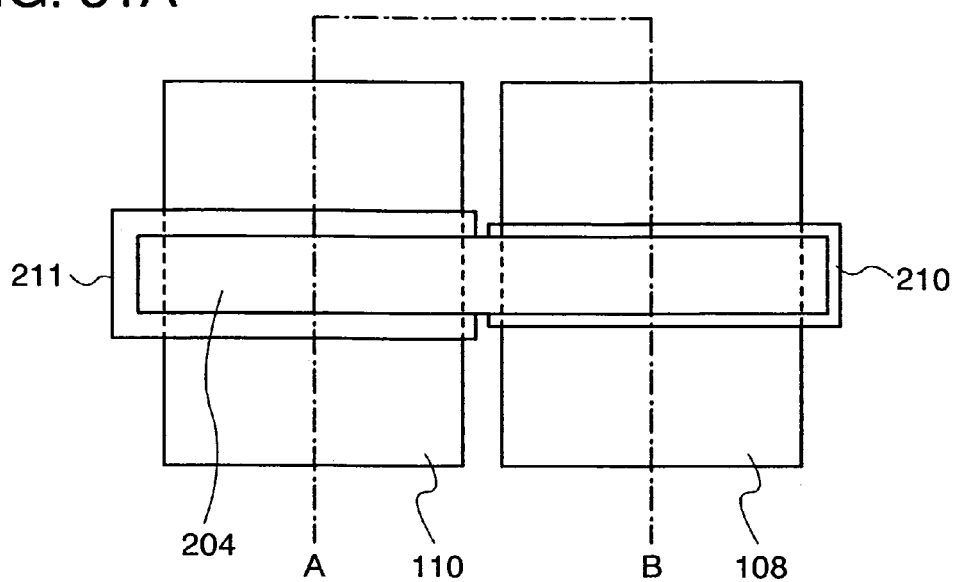
FIGS. 31A and 31B show a manufacturing step of a semiconductor device according to Embodiment Mode 9.
Figure 31B:
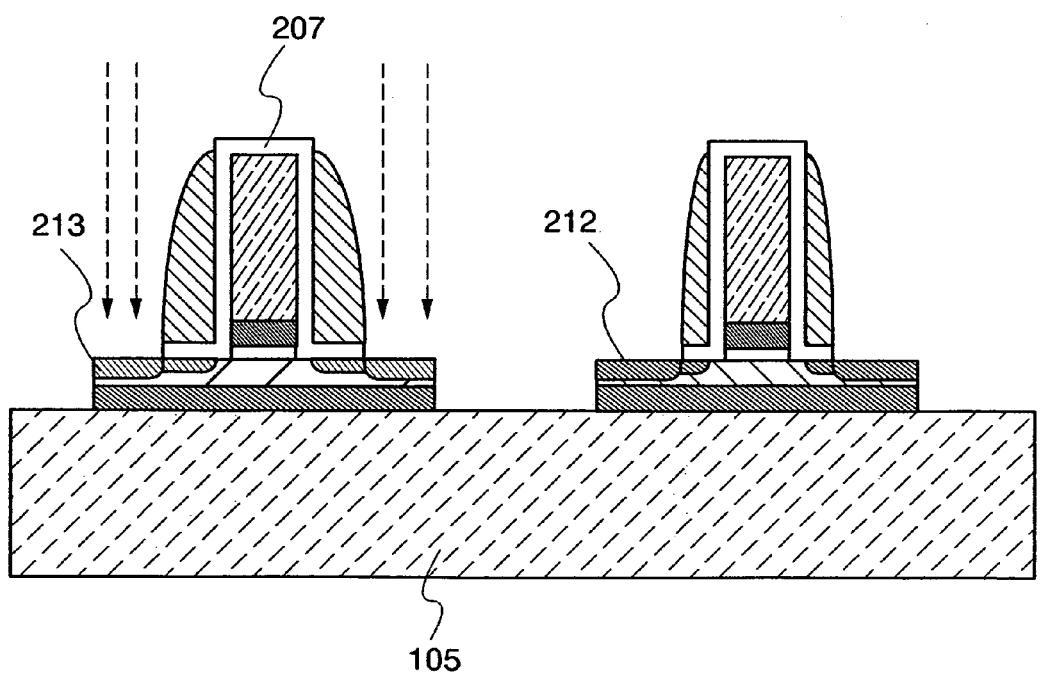

After forming the sidewalls, exposed parts of the first insulating layer 207 are etched as shown in FIGS. 31A and 31B, and a source region and a drain region are formed in a self-alignment manner. This step can be conducted by an ion implantation method in which impurity ions for valence electron control are accelerated by electric field and implanted. FIG. 31B shows a state in which a Group 15 element is added to the first SOI layer 108 to form first impurity regions 212 to be a source region and a drain region. A Group 13 element is added to the second SOI layer 110 to form second impurity regions 213 to be a source region and a drain region. For example, arsenic ions are implanted to the first SOI layer 108 for the n-channel MISFET at 50 keV with a dose of $5\times10^{15}/cm^2$. Boron ions are implanted to the second SOI layer 110 for the p-channel MISFET at 30 keV with a dose of $3\times10^{15}/cm^2$. The above-described doping conditions such as ion species, the acceleration voltage, and dose are only examples, and the doping conditions can be appropriately set.

In order to further decrease resistance of the source region and the drain region, a silicide layer may be formed in the first and second SOI layers. As the silicide layer, cobalt silicide or nickel silicide may be employed, and it is preferable that silicide be formed at least in the source region and the drain region. A silicide layer is formed in a top surface and an end surface of the SOI layer. When the SOI layer is thin or something, silicide reaction may be made to proceed to the bottom part of the SOI layer to decrease resistance. Further, in order to further decrease resistance of the gate electrodes 204, a silicide layer may be formed on top surfaces of the gate electrode layers. The silicide layer formed in the source region and the drain region and the silicide layer formed in the gate electrode layers can be manufactured simultaneously.

Figure 32A:
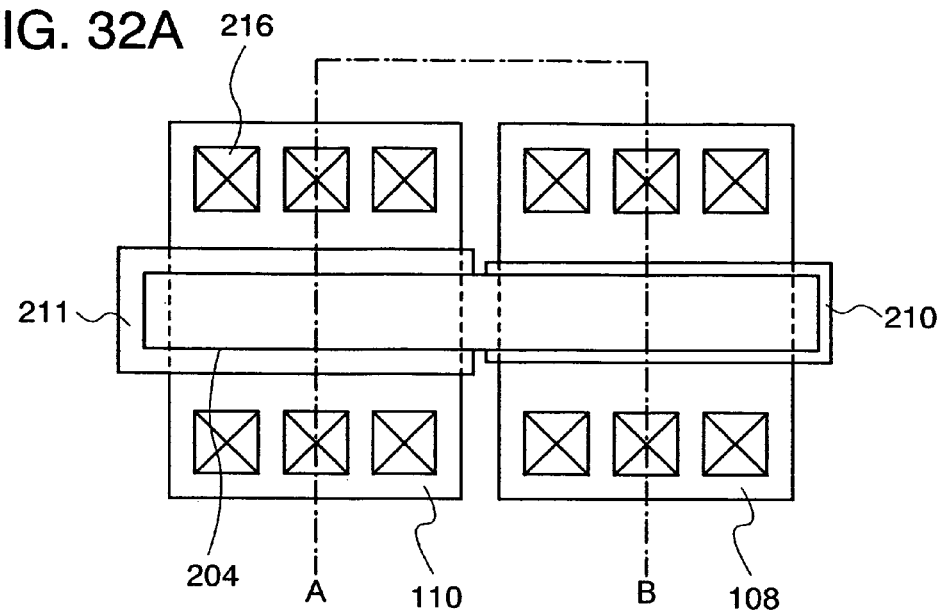
FIGS. 32A and 32B show a manufacturing step of a semiconductor device according to Embodiment Mode 9.
Figure 32B:
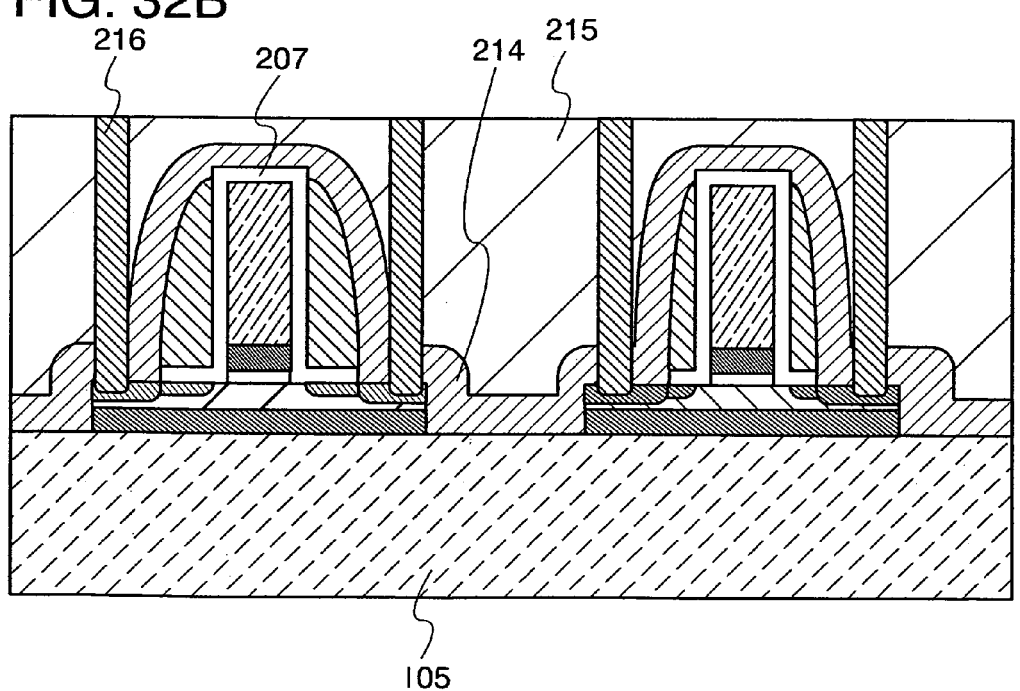

FIGS. 32A and 32B show a step of forming a passivation layer 214, a first interlayer insulating layer 215, and contact plugs 216. The passivation layer 214 is formed over an entire surface by a CVD method using a silicon nitride film, a silicon nitride oxide film, or the like. The first interlayer insulating layer 215 is formed by formation of phosphosilicate glass (PSG) or borophosphosilicate glass (BPSG) by a CVD method and planarization by reflow. Alternatively, a silicon oxide film may be formed using tetraethoxysilane (tetra-ethyl-ortho-silicate, $Si(OCH_2CH_3)_4$) by a CVD method and then be planarized by CMP. The contact plugs 216 are formed of tungsten silicide so as to fill contact holes which are formed in the first interlayer insulating layer 215. Tungsten silicide is formed by a CVD method using tungsten hexafluoride ($WF_6$) and silane ($SiH_4$).

Figure 33A:
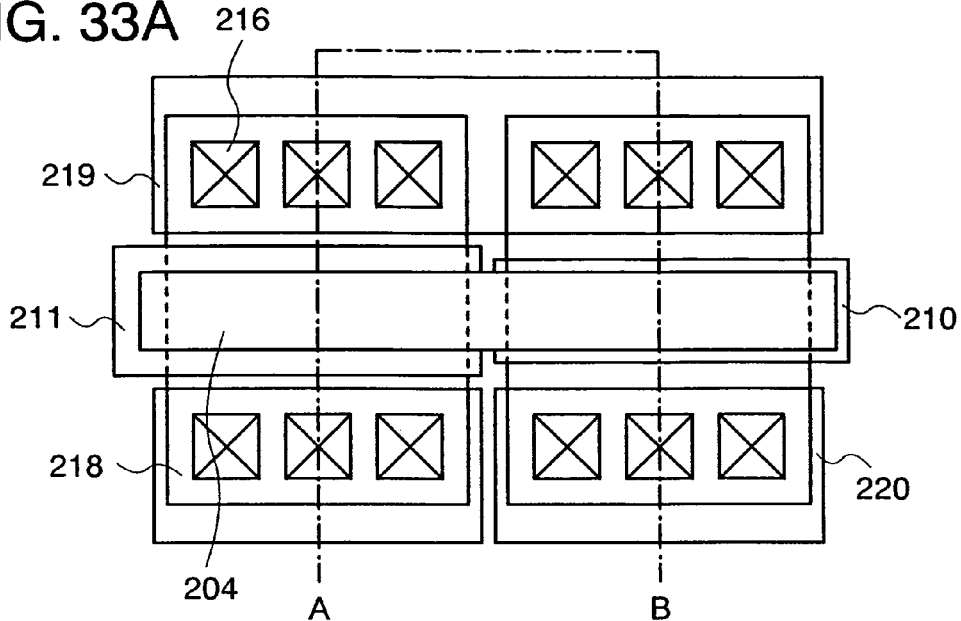
FIGS. 33A and 33B show a manufacturing step of a semiconductor device according to Embodiment Mode 9.
Figure 33B:
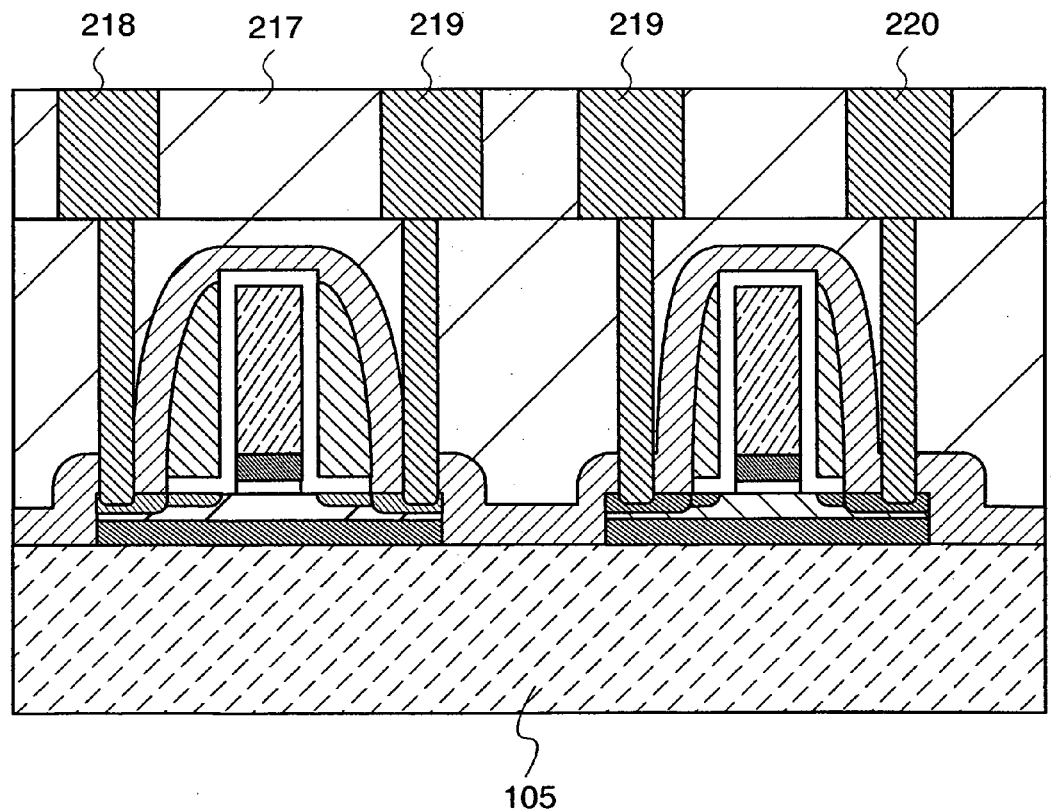

A multilayer structure of a wiring is considered depending on the structure of the semiconductor element and the device that uses the element. FIGS. 33A and 33B show a structure in which a second interlayer insulating layer 217 and wirings 218, 219, and 220 are provided over the first interlayer insulating layer 215. The wiring may be formed using tungsten silicide or may be formed using Cu wirings by a damascene method.

Embodiment Mode 10

Embodiment Mode 10 will exemplify a combination of crystal faces and crystal axes of a p-channel MISFET and an n-channel MISFET of the present invention.

Figure 14A:
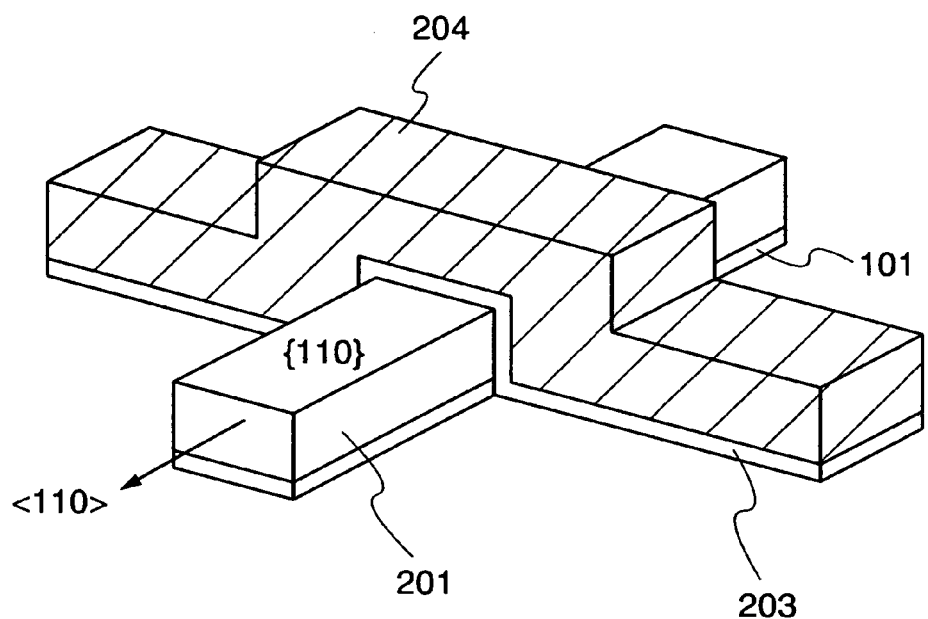
FIGS. 14A and 14B show an example of preferable combinations of crystal directions of SOI layers with a p-channel MISFET and an n-channel MISFET in Embodiment Mode 10.
Figure 14B:
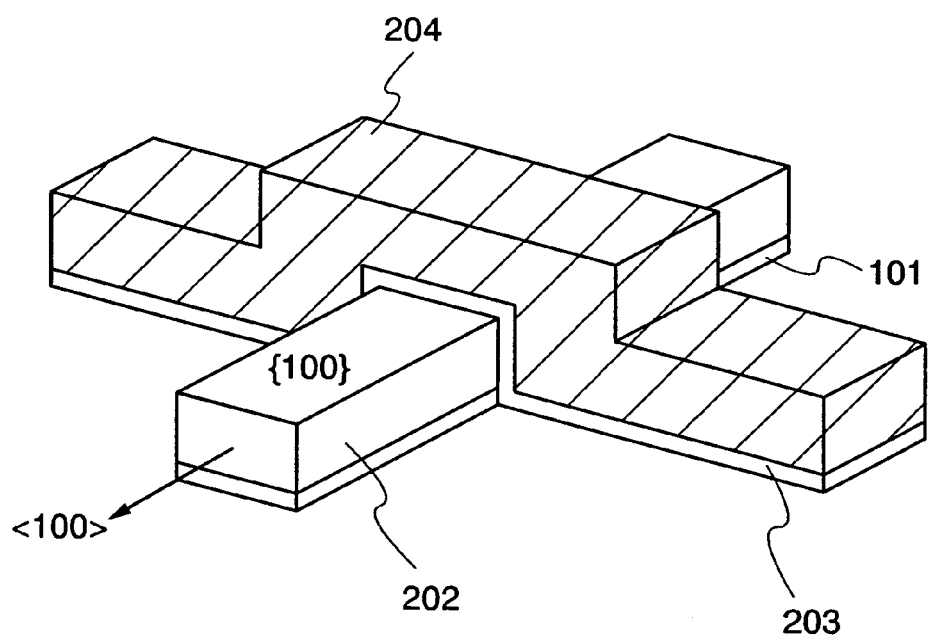

FIGS. 14A and 14B show the case of taking SOI layers for forming a p-channel MISFET and an n-channel MISFET from bond wafers having different crystal faces. FIG. 14A shows the p-channel MISFET, and the SOI layer is taken from the bond wafer whose crystal face is {110}. At this time, more preferred mode is that a channel length direction of the SOI layer is directed in a <110> direction. FIG. 14B shows the n-channel MISFET, and the SOI layer is taken from the bond wafer whose crystal face is {100}. At this time, more preferred mode is that a channel length direction of the SOI layer is directed in a <100> direction. With the above-described combination, mobility of holes and electrons can be increased.

Figure 15A:
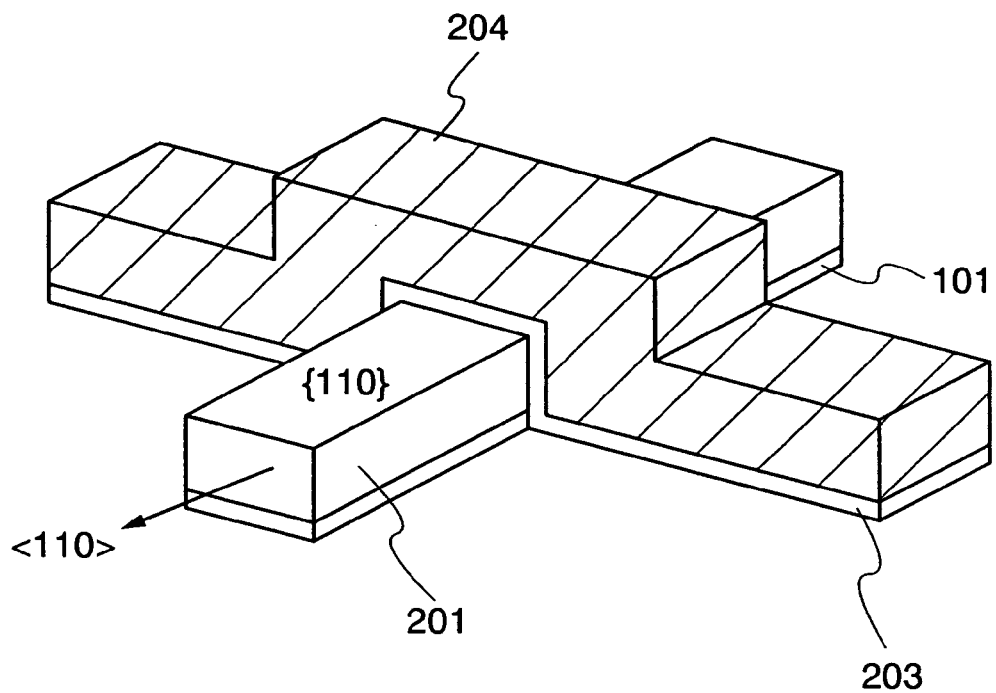
FIGS. 15A and 15B show an example of preferable combinations of crystal directions of SOI layers with a p-channel MISFET and an n-channel MISFET in Embodiment Mode 10.
Figure 15B:
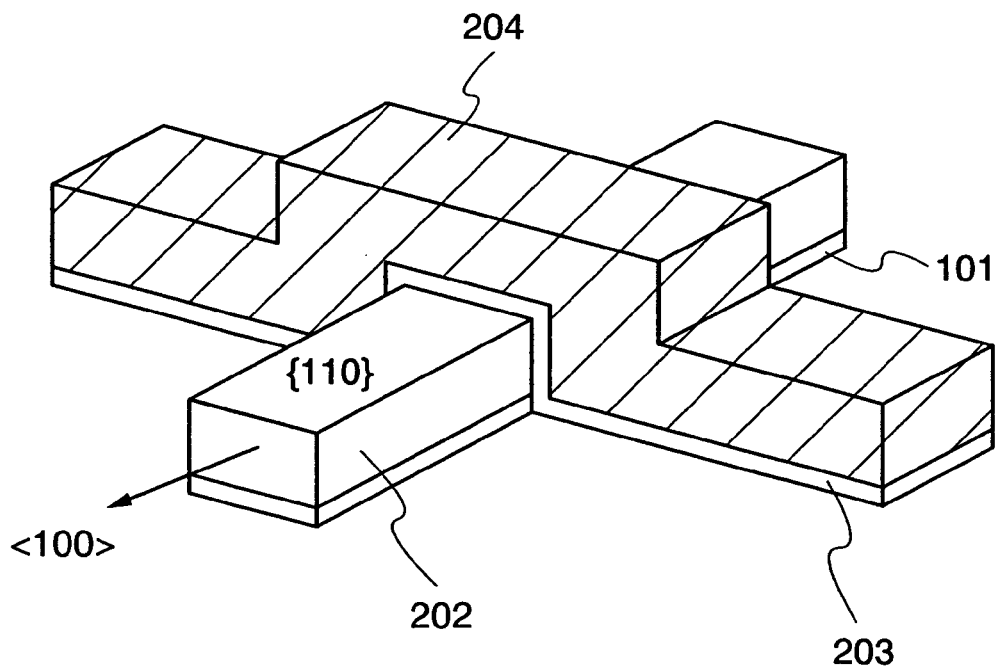

FIGS. 15A and 15B show the case of taking SOI layers for a p-channel MISFET and an n-channel MISFET from a bond wafer having one crystal face. FIG. 15A shows the p-channel MISFET, and the SOI layer is taken from the bond wafer whose crystal face is {110}. At this time, more preferred mode is that a channel length direction of the SOI layer is directed in a <110> direction. FIG. 15B shows the n-channel MISFET, and the SOI layer is taken from the bond wafer whose crystal face is {110}. At this time, more preferred mode is that a channel length direction of the SOI layer is directed in a <100> direction. With the above-described combination, mobility of holes and electrons can be increased.

According to this embodiment mode, a semiconductor element in which a first SOI layer of an n-channel MISFET and a second SOI layer of a p-channel MISFET are provided over the same insulating surface and the SOI layers whose crystal faces are different can be provided. Further, even in the case where the first SOI layer of the n-channel MISFET and the second SOI layer of the p-channel MISFET are formed using a bond wafer having the same crystal face, mobility can be increased by flowing carriers in different crystal axis directions. When mobility of the MISFETs is increased, high speed operation of a semiconductor element and a semiconductor display device that uses the element can be achieved. Further, low voltage driving becomes possible, and low power consumption can be achieved. In addition, since a structure for element isolation is not required in this embodiment mode, a manufacturing process can be simplified.

Embodiment Mode 11

Figure 34A:
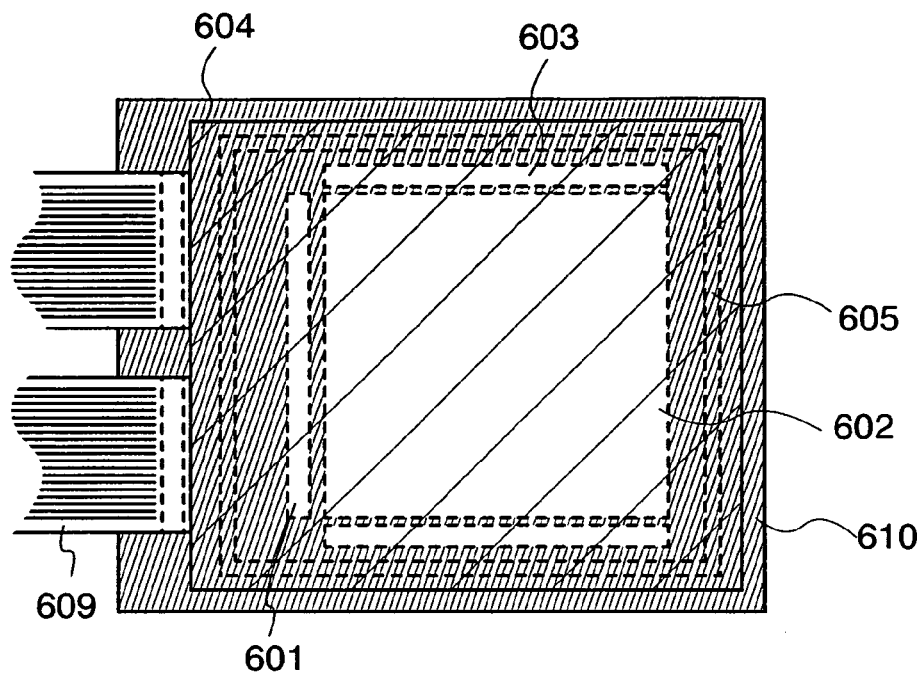
FIGS. 34A and 34B show a mode of a light-emitting device which is one example of semiconductor display devices according to Embodiment Mode 11.
Figure 34B:
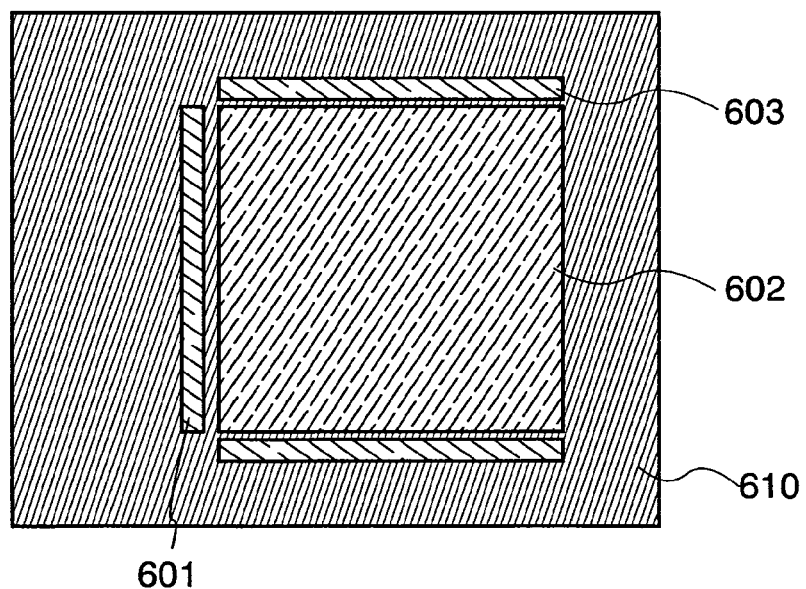

Embodiment Mode 11 will describe a light emitting device as an example of semiconductor display devices, with reference to FIGS. 34A and 34B. FIG. 34A is a top view of a light emitting device, and a driver circuit portion (source side driver circuit) 601, a pixel portion 602, and a driver circuit portion (gate side driver circuit) 603 are provided over an insulating substrate 610. Since sealing is conducted with a sealing substrate 604, the source side driver circuit 601, the pixel portion 602, and the gate side driver circuit 603 are shown by dotted lines. In addition, a sealant 605 is provided to attach the insulating substrate 610 and the sealing substrate 604. As the sealant 605, an epoxy-based resin is preferably used. As a material used for the sealing substrate 604, a plastic substrate of FRP (fiberglass-reinforced plastics), PVF (polyvinylfluoride), polyester, acrylic, or the like as well as a glass substrate or a quartz substrate can be used. At the inside surrounded by the sealant 605, a space 607 is formed by the insulating substrate 610 and the sealing substrate 604. The space is filled with a filler, and in addition to the case of filling with an inert gas (such as nitrogen or argon), there is a case in which filling is carried out with a substance having a function as a sealant.

A lead wiring is a wiring for transmitting a signal to be input to the source side driver circuit 601 and the gate side driver circuit 603, and receives a video signal, a clock signal, a start signal, a reset signal, and the like from a flexible printed circuit (FPC) 609 which serves as an external input terminal.

Note that although only the FPC is shown here, a printed wiring board (PWB) may be attached to the FPC.

As shown in FIG. 34B, only the insulating substrate 610, the source side driver circuit 601, the pixel portion 602, and the gate side driver circuit 603 are extracted from the light emitting device shown in FIG. 34A. A mode in which SOI layers 108 of n-channel MISFETs of the present invention are transferred to the source side driver circuit 601 and the gate side driver circuit 603 and an SOI layer 110 of a p-channel MISFET is transferred to the pixel portion 602 will be described.

N-channel MISFETs and p-channel MISFETs can also be transferred to the source side driver circuit 601 and the gate side driver circuit 603 to form CMOS circuits. However, to increase the layout freedom of a bond substrate, n-channel MISFETs are transferred to only a specific region like the source side driver circuit 601 or the gate side driver circuit 603, and NMOS circuits are formed.

The pixel portion 602 includes at least switching transistors and current control transistors as switching elements. N-channel MISFETs and p-channel MISFETs can also be transferred to form these switching elements; however, to increase the layout freedom of a bond substrate, p-channel MISFETs are transferred to only a specific region like the pixel portion 602.

Further, a layer containing a light emitting substance is provided between an anode and a cathode in the pixel portion, and the light emitting device can perform display by self-emission from the light emitting substance. A material having a high work function is preferably used as a material serving as the anode. For example, stacked layers of a titanium nitride film and a film including aluminum as its main component; a three-layer structure of a titanium nitride film, a film including aluminum as its main component, and a titanium nitride film; or the like, as well as a single-layer film such as an ITO film, an indium tin oxide film including silicon, an indium oxide film including 2 to 20 wt % of zinc oxide, a titanium nitride film, a chromium film, a tungsten film, a Zn film, or a Pt film can be used. As a material serving as the cathode, a material having a low work function (Al, Mg, Li, Ca, or an alloy or a compound thereof such as MgAg, MgIn, AlLi, LiF, or $CaF_2$) is preferably used.

When a first SOI layer of a p-channel MISFET and a second SOI layer of an n-channel MISFET of the present invention, which are provided over the same surface of an insulating substrate, are used for such a semiconductor display device, mobility can be further increased. When mobility of the MISFETs is increased, high speed operation of a semiconductor display device and a semiconductor integrated circuit such as a driver circuit used for the display device or the like can be achieved. Further, low voltage driving becomes possible, and low power consumption can be achieved. In addition, since a structure for element isolation is not required in this embodiment mode, a manufacturing process can be simplified.

Embodiment Mode 12

Figure 16:
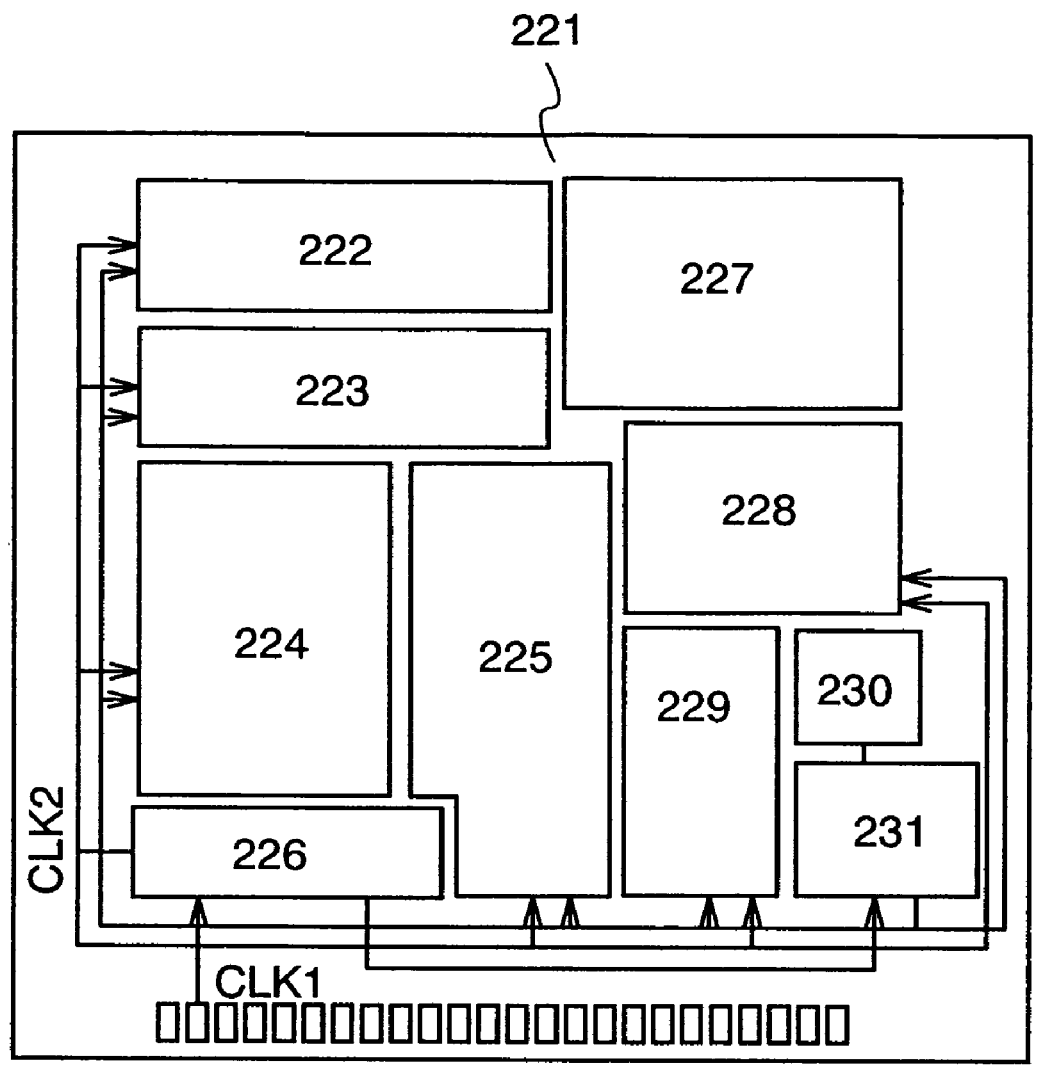
FIG. 16 is a block diagram of a mode of a microprocessor which is one example of semiconductor devices according to Embodiment Mode 12.

Embodiment Mode 12 will describe a mode of a microprocessor as an example of devices including a semiconductor element (semiconductor devices), with reference to FIG. 16. Any of semiconductor elements manufactured in the above embodiment modes can be used for a semiconductor element of this embodiment mode.

FIG. 16 shows an example of a microprocessor 221. In this microprocessor 221, the crystal faces of an SOI layer for an n-channel MISFET and an SOI layer for a p-channel MISFET are different. As described in the above embodiment mode, a mode in which the crystal faces of the SOI layer for the n-channel MISFET and the SOI layer for the p-channel MISFET are the same and flow directions of electrons and holes are different from a viewpoint of a crystal axis may be employed.

The microprocessor 221 includes an arithmetic logic unit (ALU) 222, an ALU controller 223, an instruction decoder 224, an interrupt controller 225, a timing controller 226, a register 227, a register controller 228, a bus interface (Bus I/F) 229, a read only memory (ROM) 250, and a ROM interface (ROM I/F) 231.

An instruction input to the microprocessor 221 via the bus interface 229 is input to the instruction decoder 224 and decoded therein, and then, input to the ALU controller 223, the interrupt controller 225, the register controller 228, and the timing controller 226. The ALU controller 223, the interrupt controller 225, the register controller 228, and the timing controller 226 conduct respective controls based on the decoded instruction. Specifically, the ALU controller 223 generates signals to control operation of the ALU 222. While the microprocessor 221 is executing a program, the interrupt controller 225 determines an interrupt request from an external input/output device or a peripheral circuit based on its priority or a mask state, and processes the request. The register controller 228 generates an address of the register 227, and reads/writes data from/to the register 227 in accordance with the state of the microprocessor.

The timing controller 226 generates signals to control drive timing of the ALU 222, the ALU controller 223, the instruction decoder 224, the interrupt controller 225, and the register controller 228. For example, the timing controller 226 is provided with an internal clock generator for generating an internal clock signal CLK2 based on a reference clock signal CLK1, and supplies the internal clock signal CLK2 to the above-described circuits. The microprocessor 221 shown in FIG. 16 is only an example in which the structure is shown simply, and real microprocessors have various structures depending on the uses.

In the case of using a semiconductor element of the present invention in the microprocessor of this embodiment mode, since a first SOI layer of a p-channel MISFET and a second SOI layer of an n-channel MISFET are provided over the same insulating surface and the crystal faces of the first SOI layer and the second SOI layer are different. Alternatively, even in the case where the first SOI layer and the second SOI layer are squarely arranged using the same crystal face, the structure in which carriers flow in different crystal axis directions is employed. By employing crystal faces by which mobility of carriers flowing through channels of transistors is increased, high speed operation of the microprocessor can be achieved.

Low voltage driving of the microprocessor of this embodiment mode becomes possible, and thus, low power consumption can be achieved. In other words, the possibility of carriers scattered by atoms can be reduced, thereby reducing resistance which electrons and holes meet with, and performance of the microprocessor can be improved.

Embodiment Mode 13

Figure 17:
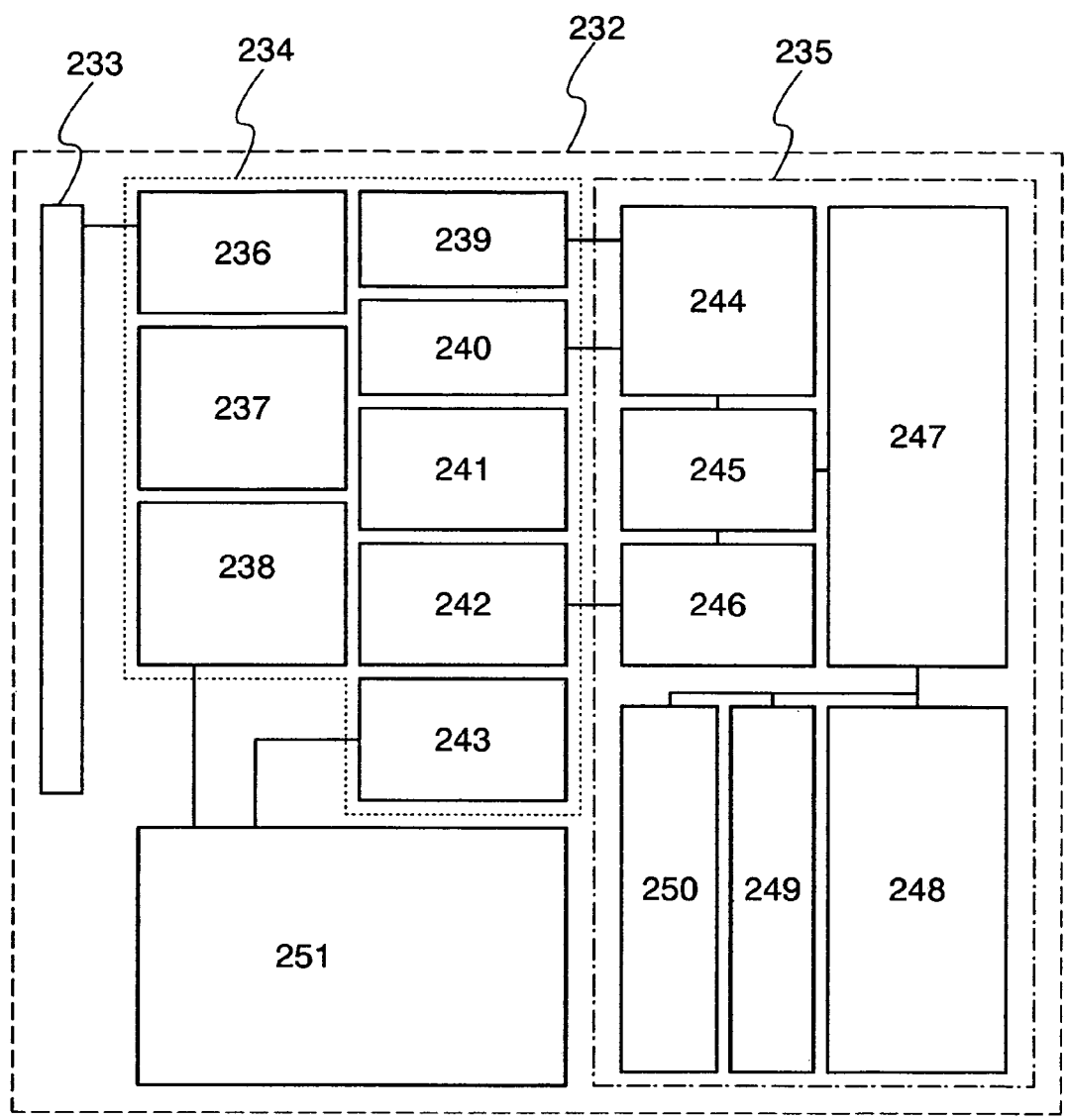
FIG. 17 is a block diagram of a mode of a microcomputer which is one example of semiconductor devices according to Embodiment Mode 13.

Embodiment Mode 13 will describe a mode of a microcomputer including a communication circuit and capable of inputting and outputting data without contact as an example of devices including a semiconductor element, with reference to FIG. 17. Any of the semiconductor elements manufactured in the above embodiment modes can be used for a semiconductor element of this embodiment mode.

FIG. 17 is a block diagram of a microcomputer 232 according to this embodiment mode. This microcomputer 232 includes an antenna circuit 233, an analog circuit portion 234, and a digital circuit portion 235. As the analog circuit portion 234, a resonant circuit 236 including a resonant capacitor, a constant voltage circuit 237, a rectifier circuit 238, a demodulation circuit 239, a modulation circuit 240, a reset circuit 241, an oscillation circuit 242, and a power supply management circuit 243 are included. The digital circuit portion 235 includes an RF interface 244, a control register 245, a clock controller 246, an interface 247, a central processing unit 248, a random access memory 249, and a read only memory 250. Electric power necessary for operation of the microcomputer 232 is supplied in such a manner that a wireless signal is received by the antenna circuit 233 and rectified by the rectifier circuit 238, and the electric power is stored in a capacitor portion 251. The capacitor portion 251 is formed using a capacitor such as a ceramic capacitor or an electric double layer capacitor. The capacitor portion 251 is not necessarily integrally formed with the microcomputer 232, and may be attached as another part over a substrate having an insulating surface which is included in the microcomputer 232.

Operation of the microcomputer 232 having the above-described structure is described below. From a signal received by the antenna circuit 233, induced electromotive force is generated by the resonant circuit 236. The input signal is demodulated by the demodulation circuit 239 and then a control instruction and data signal are output to the digital circuit portion 235. The reset circuit 241 generates a signal for resetting and initializing the digital circuit portion 235. For example, a signal which rises after increase in the power supply voltage is generated as the reset signal. The oscillation circuit 242 changes the frequency of a clock signal and the duty ratio in response to a control signal generated by the constant voltage circuit 237. The demodulation circuit 239 having a low-pass filter, for example, binarizes changes in amplitude of reception signals of an amplitude shift keying (ASK) system. The modulation circuit 240 transmits data after changing the amplitude of the ASK transmission signal. The modulation circuit 240 changes the resonance point of the resonant circuit 236, thereby changing the amplitude of communication signals. The clock controller 246 generates a control signal for changing the frequency and the duty ratio of the clock signal in accordance with the power supply voltage or current consumption in the central processing unit 248. The power supply voltage is monitored by the power supply management circuit 243.

A signal that is input from the antenna circuit 233 to the microcomputer 232 is demodulated by the demodulation circuit 239, and then divided into a control command, data, and the like by the RF interface 244. The control command is stored in the control register 245. The control command includes, reading of data stored in the read only memory 250, writing of data to the random access memory 249, an arithmetic instruction to the central processing unit 248, and the like. The central processing unit 248 accesses the read only memory 250, the random access memory 249, and the control register 245 via the interface 247. The interface 247 has a function of generating an access signal for any of the read only memory 250, the random access memory 249, and the control register 245 based on an address requested by the central processing unit 248.

As an arithmetic method of the central processing unit 248, a method may be employed in which the read only memory 250 stores an OS (operating system) and a program is read out and executed at the time of starting operation. Alternatively, a method may be employed in which a circuit dedicated to arithmetic is formed and an arithmetic process is conducted using hardware. In a method in which both hardware and software are used, a method can be used in which a part of process is conducted in the circuit dedicated to arithmetic and the other part of the arithmetic process is conducted by the central processing unit 248 using a program.

Figure 18:
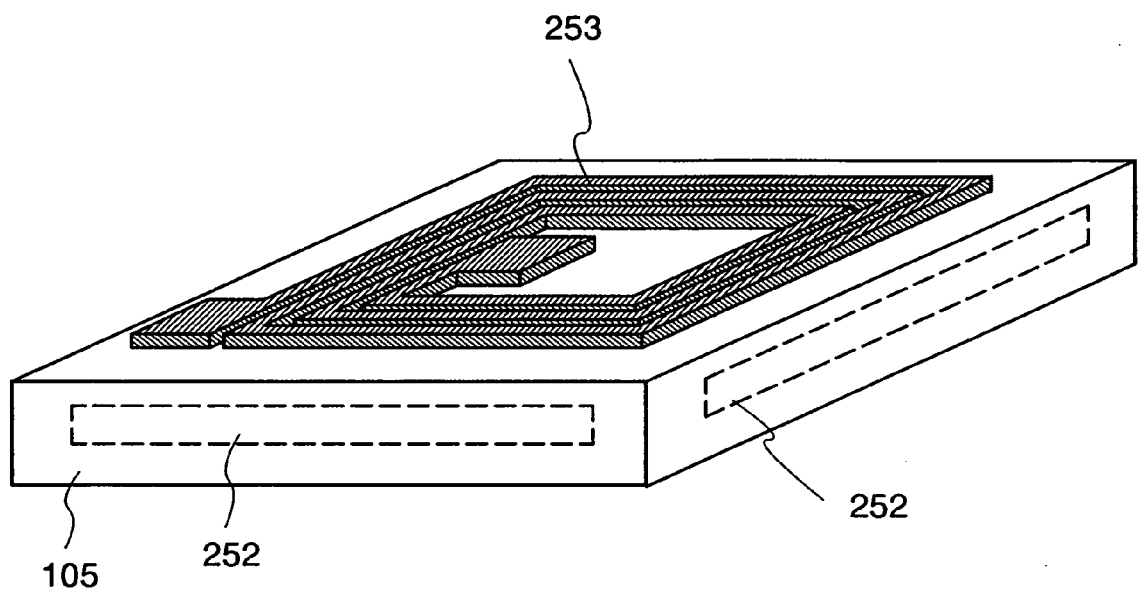
FIG. 18 is a perspective view of an exterior example of a microcomputer which is one example of semiconductor devices according to Embodiment Mode 13.

FIG. 18 shows the exterior of a microcomputer having the above-described structure according to this embodiment mode. A plurality of SOI layers are provided in an insulating substrate 105, accordingly, an element formation layer 252 in which an n-channel MISFET and a p-channel MISFET are formed is included. The element formation layer 252 forms the analog circuit portion 234 and the digital circuit portion 235 of FIG. 17. An antenna 253 is provided over the insulating substrate 105. Instead of the antenna 253, an antenna connection terminal may be provided. The antenna 253 shown in FIG. 18 is a magnetic-field spiral antenna; however, the antenna 253 may be combined with a dipole antenna or the like as an electric field antenna.

Figure 19:
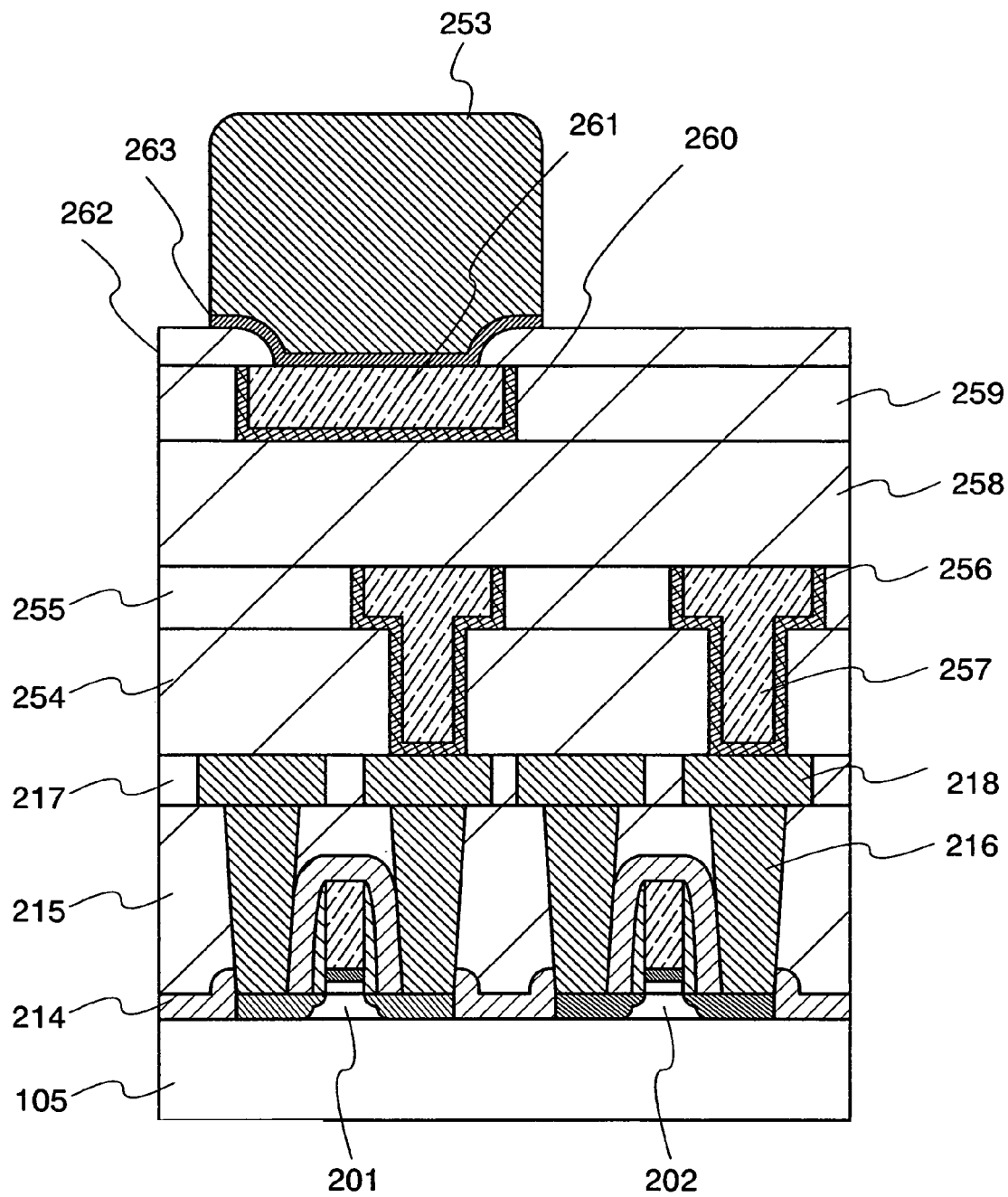
FIG. 19 is a cross-sectional view of a structure of a microcomputer which is one example of semiconductor devices according to Embodiment Mode 13.

FIG. 19 schematically shows a cross-sectional structure of a main section of the microcomputer shown in FIG. 18. Over the insulating substrate 105, an n-channel MISFET and a p-channel MISFET are formed by a first SOI layer 108 and a second SOI layer 110. Since the structure of layers that are lower than a second interlayer insulating layer 217 is similar to that of the above embodiment modes, description thereof is omitted.

A third interlayer insulating layer 254 and a fourth interlayer insulating layer 255 are formed over a first wiring 218. The third interlayer insulating layer 254 is formed using a silicon oxide film, and the fourth interlayer insulating layer 255 is formed using a silicon nitride film. Openings formed in the third interlayer insulating layer 254 by dual damascene are narrower than openings formed in the fourth interlayer insulating layer 255. A barrier metal 256 of tantalum nitride or the like is formed in the openings, and a copper wiring 257 is formed by copper plating. Further, a fifth interlayer insulating layer 258 and a sixth interlayer insulating layer 259 are formed, an opening is formed only in the sixth interlayer insulating layer, and a barrier metal 260 and a copper wiring 261 by copper plating are provided in the opening. Over the copper wiring 261, a seventh interlayer insulating layer 262 is formed, and an opening for connecting the antenna 253 to the copper wiring 261 is formed. Then, the antenna 253 is provided over the seventh interlayer insulating layer 262 and connected to the copper wiring 261. In FIG. 19, a seed layer 263 is formed at a boundary of the antenna 253 and the copper wiring 261; however, the seed layer is provided in the case of forming the antenna 253 by a copper plating method. The antenna 253 can also be formed by direct drawing using an inkjet method, a printing method, or the like. Alternatively, a conductive film of aluminum or the like may be stacked by sputtering and processed into an antenna shape by photolithography.

Productivity of such a microcomputer can be improved by using a large-area glass substrate as the insulating substrate 105. For example, a glass substrate of 730×920 mm is used for fourth-generation liquid crystal panels which are distributed in the market, and the area thereof is 671600 mm². When microcomputers are taken from such a glass substrate, in the case of taking two-millimeter squares, roughly 340 thousand chips can be extracted without regard for margins of the chips. The thickness of the glass substrate is 0.4 to 0.7 mm, and when a protection film is attached to a surface opposite to a surface to which the SOI layers of the MISFETs are fixed, the thickness of the device as a whole can be thinned to about 0.1 to 0.3 mm.

In the case of using a semiconductor element of the present invention in the microcomputer of this embodiment mode, the first SOI layer for the p-channel MISFET and the second SOI layer for the n-channel MISFET are provided over the same insulating surface and crystal surfaces of the SOI layers are different. Alternatively, even when the first SOI layer and the second SOI layer are squarely arranged using the same crystal face, the structure in which carriers flow in different crystal axis directions is employed. By employing crystal faces by which mobility of carriers flowing through channels of transistors is increased, high speed operation of the microcomputer can be achieved.

Low voltage driving of the microcomputer of this embodiment mode becomes possible, and thus, low power consumption can be achieved. In other words, the possibility of carriers scattered by atoms can be reduced, thereby reducing resistance which electrons and holes meet with, and performance of the microcomputer can be improved.

This application is based on Japanese Patent Application serial no. 2007-068086 filed with Japan Patent Office on Mar. 16, 2007 and Japanese Patent Application serial no. 2007-133138 filed with Japan Patent Office on May 18, 2007, the entire contents of which are hereby incorporated by reference.

What is claimed is:

1. A semiconductor device comprising:
   at least a first single-crystalline semiconductor layer and a second single-crystalline semiconductor layer provided over the same surface of an insulating substrate,
   wherein the first single-crystalline semiconductor layer includes an n-type impurity region, and the second single-crystalline semiconductor layer includes a p-type impurity region,
   wherein a crystal face of the first single-crystalline semiconductor layer is {100} and a crystal face of the second single-crystalline semiconductor layer is {110}, and
   a channel length direction of the first single-crystalline semiconductor layer is directed in <100> direction, and a channel length direction of the second single-crystalline semiconductor layer is directed in <110> direction.

2. A semiconductor device comprising:
   at least a first single-crystalline semiconductor layer and a second single-crystalline semiconductor layer provided over the same surface of an insulating substrate,
   wherein the first single-crystalline semiconductor layer includes an n-type impurity region, and the second single-crystalline semiconductor layer includes a p-type impurity region,
   wherein a crystal face of the first single-crystalline semiconductor layer and a crystal face of the second single-crystalline semiconductor layer are {110}, and
   wherein a crystal axis in a channel length direction of the first single-crystalline semiconductor layer is directed in <100> direction, and a crystal axis in a channel length direction of the second single-crystalline semiconductor layer is directed in <110> direction.

3. A semiconductor display device comprising:
   at least a first single-crystalline semiconductor layer and a second single-crystalline semiconductor layer provided over the same surface of an insulating substrate,
   wherein the first single-crystalline semiconductor layer includes an n-type impurity region, and the second single-crystalline semiconductor layer includes a p-type impurity region, wherein a crystal face of the first single-crystalline semiconductor layer and a crystal face of the second single-crystalline semiconductor layer are different, and wherein the insulating substrate has a light-transmitting property.

4. The semiconductor display device according to claim 3, wherein the crystal face of the first single-crystalline semiconductor layer is {100}, and the crystal face of the second single-crystalline semiconductor layer is {110}.

5. The semiconductor display device according to claim 3, wherein the crystal face of the first single-crystalline semiconductor layer is {100}, and the crystal face of the second single-crystalline semiconductor layer is {110}, and wherein a channel length direction of the first single-crystalline semiconductor layer is directed in <100> direction, and a channel length direction of the second single-crystalline semiconductor layer is directed in <110> direction.

6. A semiconductor display device comprising:

at least a first single-crystalline semiconductor layer and a second single-crystalline semiconductor layer provided over the same surface of an insulating substrate, wherein the first single-crystalline semiconductor layer includes an n-type impurity region, and the second single-crystalline semiconductor layer includes a p-type impurity region, wherein a crystal face of the first single-crystalline semiconductor layer and a crystal face of the second single-crystalline semiconductor layer are the same, wherein a crystal axis in a channel length direction of the first single-crystalline semiconductor layer is different from a crystal axis in a channel length direction of the second single-crystalline semiconductor layer, and wherein the insulating substrate has a light-transmitting property.

7. The semiconductor display device according to claim 6, wherein the crystal faces of the first single-crystalline semiconductor layer and the second single-crystalline semiconductor layer are {110}, wherein the channel length direction of the first single-crystalline semiconductor layer is directed in <100> direction, and wherein the channel length direction of the second single-crystalline semiconductor layer is directed in <110> direction.

8. A semiconductor device comprising:

at least a first single-crystalline semiconductor layer and a second single-crystalline semiconductor layer provided over the same surface of an insulating substrate, wherein the first single-crystalline semiconductor layer includes an n-type impurity region, and the second single-crystalline semiconductor layer includes a p-type impurity region, wherein a crystal face of the first single-crystalline semiconductor layer and a crystal face of the second single-crystalline semiconductor layer are different, and wherein the insulating substrate has a light-transmitting property.

9. The semiconductor device according to claim 8, wherein the crystal face of the first single-crystalline semiconductor layer is {100}, and the crystal face of the second single-crystalline semiconductor layer is {110}.

10. The semiconductor device according to claim 8, wherein the crystal face of the first single-crystalline semiconductor layer is {100}, and the crystal face of the second single-crystalline semiconductor layer is {110}, and wherein a channel length direction of the first single-crystalline semiconductor layer is directed in <100> direction, and a channel length direction of the second single-crystalline semiconductor layer is directed in <110> direction.

11. A semiconductor device comprising:

at least a first single-crystalline semiconductor layer and a second single-crystalline semiconductor layer provided over the same surface of an insulating substrate, wherein the first single-crystalline semiconductor layer includes an n-type impurity region, and the second single-crystalline semiconductor layer includes a p-type impurity region, wherein a crystal face of the first single-crystalline semiconductor layer and a crystal face of the second single-crystalline semiconductor layer are the same, wherein a crystal axis in a channel length direction of the first single-crystalline semiconductor layer is different from a crystal axis in a channel length direction of the second single-crystalline semiconductor layer, and wherein the insulating substrate has a light-transmitting property.

12. The semiconductor device according to claim 11, wherein the crystal faces of the first single-crystalline semiconductor layer and the second single-crystalline semiconductor layer are {110}, wherein the channel length direction of the first single-crystalline semiconductor layer is directed in <100> direction, and wherein the channel length direction of the second single-crystalline semiconductor layer is directed in <110> direction.

* * * * *